(12) United States Patent
Nishiyama

(10) Patent No.: US 8,946,714 B2
(45) Date of Patent: Feb. 3, 2015

(54) SEMICONDUCTOR DEVICE AND ELECTRONIC APPARATUS INCLUDING MULTILAYER INSULATION FILM

(71) Applicant: Sony Corporation, Tokyo (JP)

(72) Inventor: Masanori Nishiyama, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/848,520

(22) Filed: Mar. 21, 2013

(65) Prior Publication Data

US 2013/0256673 A1    Oct. 3, 2013

(30) Foreign Application Priority Data

Mar. 28, 2012  (JP) ................................ 2012-072951
Mar. 29, 2012  (JP) ................................ 2012-076758

(51) Int. Cl.
*H01L 29/786* (2006.01)
*H01L 27/12* (2006.01)

(52) U.S. Cl.
CPC ...... *H01L 29/78606* (2013.01); *H01L 27/1225* (2013.01); *H01L 27/1248* (2013.01)
USPC ................... 257/59; 257/43; 257/52; 257/57; 257/200; 257/296; 438/151

(58) Field of Classification Search
USPC ................. 257/59, 43, 52, 296, 200; 438/151
See application file for complete search history.

(56) References Cited

U.S. PATENT DOCUMENTS

| | | | |
|---|---|---|---|
| 7,279,511 B2* | 10/2007 | Zhu et al. | 523/160 |
| 7,733,015 B2* | 6/2010 | Saito | 313/506 |
| 2008/0062112 A1* | 3/2008 | Umezaki | 345/100 |
| 2010/0244029 A1* | 9/2010 | Yamazaki et al. | 257/52 |
| 2011/0157961 A1* | 6/2011 | Yamazaki et al. | 365/149 |
| 2012/0001167 A1* | 1/2012 | Morosawa | 257/43 |

FOREIGN PATENT DOCUMENTS

| | | |
|---|---|---|
| JP | 2007-220817 | 8/2007 |
| JP | 2009-099847 | 5/2009 |

OTHER PUBLICATIONS

Park, et al., "Self-aligned top-gate amorphous gallium indium zinc oxide thin film transistors," Applied Physics Letters 93, pp. 053501-1-053501-3, 2008. (3 pages).
Hayashi, et al. "42.1: Invited Paper: Improved Amorphous In—Ga—Zn—O TFTs," SID 08 Digest, pp. 621-624. (4 pages).

* cited by examiner

*Primary Examiner* — Thao X Le
*Assistant Examiner* — Sheng Zhu
(74) *Attorney, Agent, or Firm* — K&L Gates LLP

(57) ABSTRACT

A semiconductor device includes: a transistor including an oxide semiconductor film; a first insulating film covering the oxide semiconductor film and including a first resin material; and a second insulating film including a second resin material that has polarity different from polarity of the first resin material, the second insulating film being laminated on the first insulating film.

18 Claims, 35 Drawing Sheets

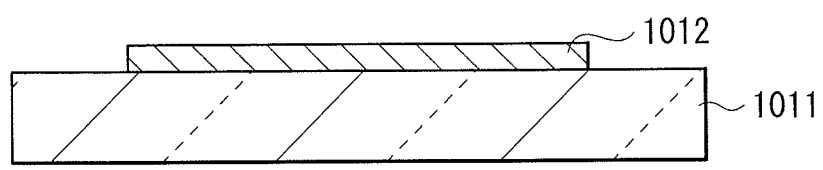
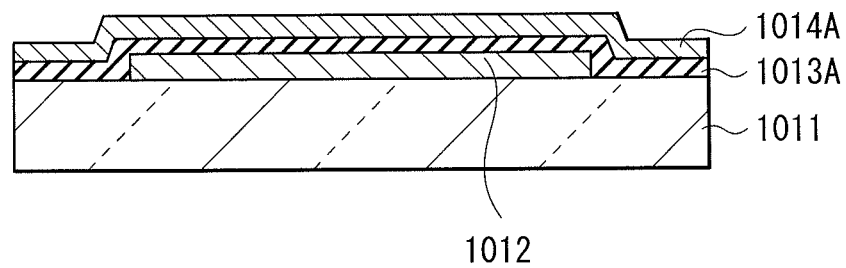
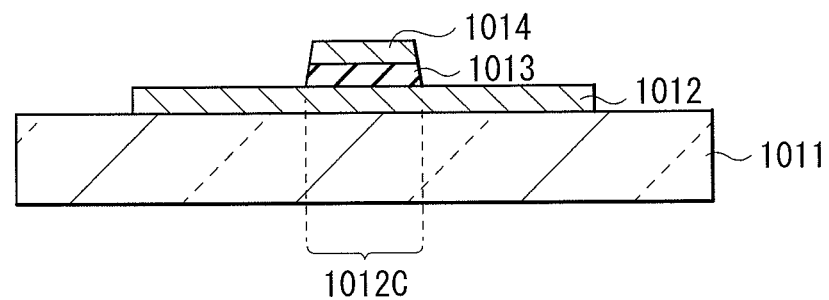
FIG. 27A
FIG. 27B
FIG. 27C

SEMICONDUCTOR DEVICE AND ELECTRONIC APPARATUS INCLUDING MULTILAYER INSULATION FILM

CROSS REFERENCES TO RELATED APPLICATIONS

The present application claims priority to Japanese Priority Patent Application JP 2012-072951 filed in the Japan Patent Office on Mar. 28, 2012, and JP 2012-076758 filed in the Japan Patent Office on Mar. 29, 2012, the entire content of which is hereby incorporated by reference.

BACKGROUND

The present application relates to a semiconductor device that includes a transistor using an oxide semiconductor and to an electronic apparatus.

It has been known that an oxide semiconductor that is configured of an oxide of zinc (Zn), indium (In), gallium (Ga), tin (Sn), aluminum (Al), or titanium (Ti), or of an mixture oxide thereof exhibits superior semiconductor characteristics. Therefore, in recent years, studies have been actively made on applications to a thin film transistor (TFT) using such an oxide semiconductor as a driving device of an active-matrix type display (for example, Japanese Unexamined Patent Application Publication No. 2009-99847) and TFTs of a bottom-gate structure and of a top-gate structure have been reported.

When the above-described oxide semiconductor is used in a TFT, electron mobility becomes equal to or higher than 10 times that in a TFT using amorphous silicon that is typically used in, for example, a liquid crystal display. In addition thereto, it has been found that the TFT using the above-described oxide semiconductor exhibits favorable off characteristics. Further, in the TFT using the above-described oxide semiconductor, high mobility is expected even under low temperature around room temperature. Therefore, it is highly desired to apply TFTs using an oxide semiconductor to, for example, liquid crystal displays and organic electroluminescence (EL) displays with large screen, high-definition, and high-frame-rate.

SUMMARY

However, in a TFT using an oxide semiconductor, there has been an issue that the TFT is degraded by moisture diffusion into an oxide semiconductor film and TFT characteristics are lowered thereby.

It is desirable to provide a semiconductor device that suppresses intrusion of moisture into an oxide semiconductor film and improves TFT characteristics thereby, a display unit, and an electronic apparatus.

According to an embodiment of the present disclosure, there is provided a first semiconductor device including: a transistor including an oxide semiconductor film; a first insulating film covering the oxide semiconductor film and including a first resin material; and a second insulating film including a second resin material that has polarity different from polarity of the first resin material, the second insulating film being laminated on the first insulating film.

According to an embodiment of the present disclosure, there is provided a first display unit including: a display device; a transistor driving the display device and including an oxide semiconductor film; a first insulating film covering the oxide semiconductor film and including a first resin material; and a second insulating film including a second resin material that has polarity different from polarity of the first resin material, the second insulating film being laminated on the first insulating film.

According to an embodiment of the present disclosure, there is provided a first electronic apparatus with a display unit, the display unit including: a display device; a transistor driving the display device and including an oxide semiconductor film; a first insulating film covering the oxide semiconductor film and including a first resin material; and a second insulating film including a second resin material that has polarity different from polarity of the first resin material, the second insulating film being laminated on the first insulating film.

In the first semiconductor device, the first display unit, and the first electronic apparatus of the embodiments of the present application, the oxide semiconductor film is covered with the first and second insulating films that have different physical properties. One material that has lower polarity of the first and second resin materials has low water absorbability and the other material that has higher polarity thereof has low water permeability. Moisture in an atmosphere and moisture existing in upper layers of the oxide semiconductor film is repelled by one insulating film and intrusion and diffusion thereof are suppressed by the other insulating film.

According to an embodiment of the present disclosure, there is provided a second semiconductor device including: a transistor including an oxide semiconductor film; and an insulating film covering the oxide semiconductor film and including a resin material, the insulating film being covered with a surface modification layer that has hydrophobicity that is higher than hydrophobicity of the resin material.

According to an embodiment of the present disclosure, there is provided a second display unit including; a display device; a transistor driving the display device and including an oxide semiconductor film; and an insulating film covering the oxide semiconductor film and including a resin material, the insulating film being covered with a surface modification layer that has hydrophobicity that is higher than hydrophobicity of the resin material.

According to an embodiment of the present disclosure, there is provided a second electronic apparatus with a display unit, the display unit including: a display device; a transistor driving the display device and including an oxide semiconductor film; and an insulating film covering the oxide semiconductor film and including a resin material, the insulating film being covered with a surface modification layer that has hydrophobicity that is higher than hydrophobicity of the resin material.

In the second semiconductor device, the second display unit, and the second electronic apparatus according to the embodiments of the present application, the insulating film is covered with the surface modification layer that has high hydrophobicity. Therefore, moisture existing in the atmosphere and in the upper layers is repelled by the surface modification layer.

According to an embodiment of the present disclosure, there is provided a method of manufacturing a semiconductor device that is the semiconductor device of the above-described embodiment of the present application, the method including: forming a transistor that includes an oxide semiconductor film; covering the oxide semiconductor film with an insulating film that includes a resin material; and providing a surface modification layer in a surface of the insulating film, the surface modification layer having hydrophobicity that is higher than hydrophobicity of the resin material.

According to the first semiconductor device, the first display unit, and the first electronic apparatus of the embodiments of the present application, the insulating film that covers the oxide semiconductor film is configured of a plurality of layers (the first and second insulating films) that have different polarities. Therefore, moisture intrusion into the oxide semiconductor film is reduced. Therefore, the TFT characteristics of the transistor are improved.

Moreover, according to the second semiconductor device, the method of manufacturing the semiconductor device, the second display unit, and the second electronic apparatus of the embodiments of the present application, the insulating film is covered with the surface modification layer. Therefore, moisture intrusion into the oxide semiconductor film is reduced. Therefore, the TFT characteristics of the transistor are improved.

It is to be understood that both the foregoing general description and the following detailed description are exemplary, and are intended to provide further explanation of the application as claimed.

Additional features and advantages are described herein, and will be apparent from the following Detailed Description and the figures.

BRIEF DESCRIPTION OF THE FIGURES

The accompanying drawings are included to provide a further understanding of the disclosure, and are incorporated in and constitute a part of this specification. The drawings illustrate embodiments and, together with the specification, serve to explain the principles of the application.

FIG. 16 is a plan view illustrating a schematic configuration of a module including any of the display units according to the above-described embodiments and the like.

FIGS. 17A and 17B are perspective views each illustrating an appearance of Application Example 1 of any of the display units according to the above-described embodiments and the like.

FIGS. 27A to 27C are cross-sectional views illustrating a method of manufacturing the display unit shown in FIG. 24 in process order.

FIG. 39 is a plan view illustrating a schematic configuration of a module including any of the display units according to the above-described embodiments and the like.

DETAILED DESCRIPTION

Hereinafter, preferred embodiments of the present application will be described in detail with reference to the drawings. The description will be given in the following order.

1. First Embodiment (an example of a top-gate type transistor with a inter-layer insulating film of a bilayer structure: organic EL display unit)
2. Modification 1 (an example with an inter-layer insulating film of a tri-layer structure)
3. Modification 2 (an example with an inter-layer insulating film of a single layer, in which materials configuring the inter-layer insulating film and a planarization film have different polarities)
4. Modification 3 (an example with an inter-layer insulating film of a bilayer structure and with a planarization film of a bilayer structure)
5. Modification 4 (an example of a bottom-gate type transistor)
6. Second Embodiment (liquid crystal display unit)
7. Third Embodiment (electronic paper)
8. Application Examples
9. Fourth Embodiment (an example of a top-gate type transistor with a surface modification layer in an inter-layer insulating film: organic EL display unit)
10. Modification 5 (an example with a resin layer of a laminate structure)
11. Modification 6 (an example of a bottom-gate type transistor)
12. Modification 7 (an example with a surface modification layer in a planarization film)
13. Fifth Embodiment (liquid crystal display unit)
14. Sixth Embodiment (electronic paper)
15. Application Examples

[First Embodiment]

Figure 1:
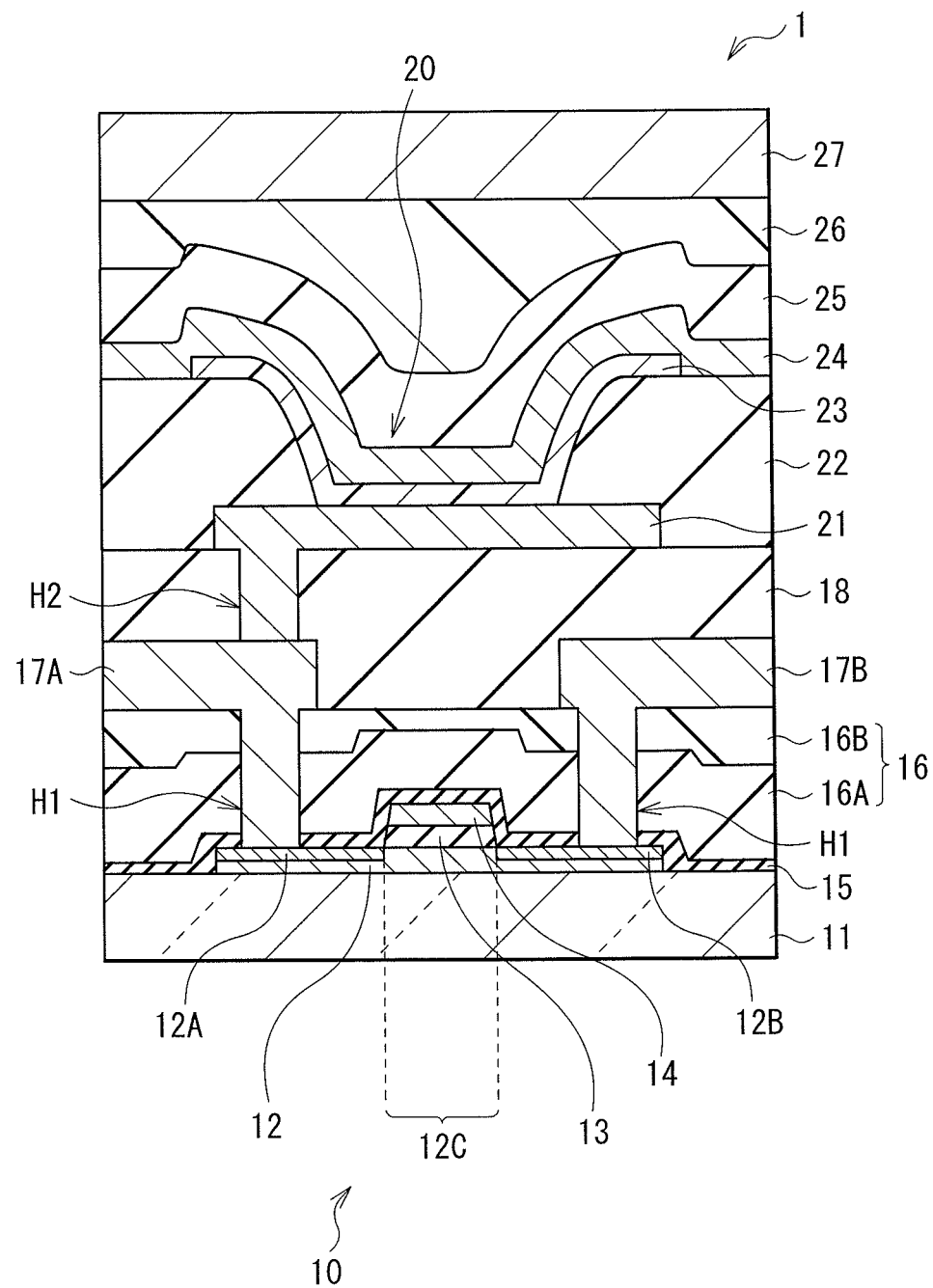
FIG. 1 is a cross-sectional view of a configuration of a display unit according to a first embodiment of the present application.

FIG. 1 illustrates a cross-sectional configuration of a display unit 1 (semiconductor device) according to a first embodiment of the present application. The display unit 1 is an active-matrix type organic electroluminescence (EL) display unit. The display unit 1 includes, on a substrate 11, a plurality of pairs of a transistor 10 and an organic EL device 20 driven by the transistor 10. FIG. 1 illustrates a region (sub-pixel) corresponding to one pair of the transistor 10 and the organic EL device 20.

The transistor 10 is a TFT of a staggered structure (top-gate type) that includes an oxide semiconductor film 12, a gate insulating film 13, and a gate electrode 14 in this order on the substrate 11. A high resistance film 15 covers the oxide semiconductor film 12 and the gate electrode 14. In other words, the oxide semiconductor film 12, the gate insulating film 13, the gate electrode 14, and the high resistance film 15 are provided in this order. An inter-layer insulating film 16 is provided on the high resistance film 15. The oxide semiconductor film 12 is connected to source-drain electrodes 17A and 17B through connection holes H1 that are provided in the inter-layer insulating film 16 and the high resistance film 15. A planarization film 18 covers the source-drain electrodes 17A and 17B and the organic EL device 20 is further provided on the planarization film 18.

[Transistor 10]

The substrate 11 may be configured, for example, of a plate of a material such as quartz, glass, silicon, and a resin (plastic) film. A low-cost resin film is allowed to be used since the oxide semiconductor film 12 is formed without heating the substrate 11 during later-described sputtering. Examples of the resin materials include PET (polyethylene terephthalate) and PEN (polyethylene naphthalate). A metal substrate made of metal such as stainless steel (SUS) may also be used depending on the purpose.

The oxide semiconductor film 12 is provided in a selective region on the substrate 11 and functions as an active layer of the transistor 10. The oxide semiconductor film 12 may include, as a main component, for example, an oxide of one or more elements of indium (In), gallium (Ga), zinc (Zn), and tin (Sn). Specifically, examples of an amorphous oxide include indium-tin-zinc oxide (ITZO) and indium-gallium-zinc oxide (IGZO: InGaZnO), and examples of a crystalline oxide include zinc oxide (ZnO), indium-zinc oxide (IZO (registered trademark)), indium-gallium oxide (IGO), indium-tin oxide (ITO), and indium oxide (InO). When a surface (surface in contact with the high resistance film 15) of the oxide semiconductor film 12 is crystallized, it is possible, for example, to improve etching selectivity between the oxide semiconductor film 12 and the insulating film (insulating film 13A in FIG. 4B which will be described later) upon forming the gate insulating film 13 and to improve etching selectivity between the oxide semiconductor film 12 and the high resistance film 15 upon forming the connection holes H1. In order to allow the surface of the oxide semiconductor film 12 to be crystallized, the oxide semiconductor film 12 may be configured of a crystalline oxide semiconductor material, or the oxide semiconductor film 12 may be configured of a laminate including an amorphous oxide semiconductor material and a crystalline oxide semiconductor material formed thereon. It is preferable to use amorphous oxide semiconductor material so as to suppress moisture diffusion into the oxide semiconductor film 12. The oxide semiconductor film 12 may have a thickness (thickness in a lamination direction, hereinafter, simply referred to as "thickness") of, for example, about 50 nm.

The oxide semiconductor film 12 includes a channel region 12C that faces the gate electrode 14 thereabove. The oxide semiconductor film 12 also has a pair of regions (source-drain regions 12A and 12B) that are adjacent to the channel region 12 from both sides thereof and that have electric resistivity lower than that of the channel region 12C. The source-drain regions 12A and 12B are provided in part of the oxide semiconductor film 12 from the surface (top face) thereof along a thickness direction. The source-drain regions 12A and 12B may be formed, for example, by allowing metal such as aluminum (Al) to react with an oxide semiconductor material so as to diffuse the metal (dopant) into the oxide semiconductor material. In the transistor 10, a self-aligned structure is achieved due to the source-drain regions 12A and 12B, and thereby, high-quality images are displayed. The transistor 10 with a self-aligned structure is applicable to larger screens, higher definition, and higher frame rate of displays. Further, the display unit 1 with the transistor 10 is allowed to adopt layout with small retention capacity. This allows less-defect and high-yield manufacturing of the display unit 1 and improves reliability thereof. The source-drain regions 12A and 12B not only achieves the self-aligned structure as described above but also has a role of stabilizing characteristics of the transistor 10.

For example, an insulating film (not illustrated) such as a silicon oxide film, a silicon nitride film, and an aluminum oxide film may be provided between the substrate 11 and the oxide semiconductor film 12. This insulating film suppresses intrusion of moisture or other impurities from the substrate 11 into the oxide semiconductor film 12.

The gate electrode 14 is provided on the channel region 12C with the gate insulating film 13 in between. The gate electrode 14 and the gate insulating film 13 have the same shape in a planer view. The gate insulating film 13 may have a thickness of, for example, about 300 nm and may be configured of a single-layer film formed of one of a silicon oxide film (SiO), a silicon nitride film (SiN), a silicon nitride oxide film (SiON), and an aluminum oxide film (AlO) or of a laminate film formed of two or more thereof. The gate insulating film 13 is preferably formed of a material less likely to reduce the oxide semiconductor film 12, for example, a film of silicon oxide or aluminum oxide.

The gate electrode 14 controls carrier density in the oxide semiconductor film 12 (channel region 12C) with use of a gate voltage (Vg) applied to the transistor 10. The gate electrode 14 also functions as a wiring that supplies potentials. The gate electrode 14 may be configured, for example, of a simple substance of one of molybdenum (Mo), titanium (Ti), aluminum, silver (Ag), neodymium (Nd), and copper (Cu), or of an alloy thereof. The gate electrode 14 may have a laminate structure that includes a plurality of simple substances or alloys. The gate electrode 14 is preferably configured of a low resistance metal such as aluminum and copper. Alternatively, the gate electrode 14 may be formed of a laminate that includes a layer (low resistance layer) of low resistance metal and a layer (barrier layer) of a material such as titanium and molybdenum formed thereon. Alternatively, an alloy that includes low resistance metal such as an alloy of aluminum and neodymium (Al—Nd) may be used. The gate electrode 14 may be configured of a transparent conductive film such as a film of ITO. The gate electrode 14 may have a thickness, for example, from 10 nm to 500 nm both inclusive.

The high resistance film 15 on the gate electrode 14 is in contact with the source-drain regions 12A and 12B of the oxide semiconductor film 12. The high resistance film 15 is a remained oxidized film (oxide film) of metal that is a supplier of metal to be diffused into the source-drain regions 12A and 12B in the manufacturing processes described later. The high resistance film 15 may have a thickness, for example, of about 20 nm or less and may be configured of a material such as titanium oxide, aluminum oxide, indium oxide, and tin oxide, or may be configured of a laminate including two or more thereof. The high resistance film 15 has not only a role in the above-described process but also a function to reduce influence of oxygen, moisture, etc. that changes characteristics of the oxide semiconductor film 12, i.e., a barrier function. Therefore, provision of the high resistance film 15 stabilizes electric characteristics of the transistor 10 and further improves effects of the later-described inter-layer insulating film 16.

In order to improve the barrier function, for example, a protection film (not illustrated) of aluminum oxide or titanium oxide with a thickness of about 10 nm to 50 nm both inclusive may be laminated on the high resistance film 15. This further stabilizes the electric characteristics of the oxide semiconductor film 12 in the transistor 10 and improves reliability thereof.

The inter-layer insulating film 16 covers the oxide semiconductor film 12 with the high resistance film 15 in between. In the present embodiment, the inter-layer insulating film 16 has a laminate structure that includes a plurality of layers (inter-layer insulating films 16A and 16B) configured of resin materials with different polarities. This suppresses intrusion of moisture from the atmosphere and the upper layers of the inter-layer insulating film 16 into the oxide semiconductor film 12.

The inter-layer insulating film 16 includes the inter-layer insulating film 16A (first insulating film) and the inter-layer insulating film 16B (second insulating film) in order from the high resistance film 15. The inter-layer film 16A is formed of a resin with low polarity or with no polarity. Examples of a low-polarity or non-polarity resin include polysiloxane (silicone resin), polyolefin-based resins, polyethylene-based resins, and polystyrene-based resins. Other organic materials or other inorganic materials may be added to the low-polarity or non-polarity resin materials described above. Alternatively, the inter-layer insulating film 16A may be formed of an organic inorganic hybrid resin that has low polarity. Further, the inter-layer insulating film 16A may be formed of a resin material to which a number of low-polarity or non-polarity functional groups or hydrophobic groups are introduced. Examples of the low-polarity functional groups include a siloxane group (—Si—O—Si—), an ether group, and an ester group. Examples of the non-polarity functional group includes an alkyl group (—$C_nH_{2n+1}$), an aryl group (—$C_6H_5$), and an acetyloxy group (—$OCOCH_3$). Examples of the hydrophobic group include halogen groups (—C—X where X is one of F, Cl, Br, and I) and a disulfide group (—S—S—).

The low-polarity or non-polarity resin exhibits low water absorbability. To give an example, polysiloxane is a hydrophobic resin in which a low-polarity functional group repels, at an upper-most surface of the film, water which has high polarity. It is preferable that the inter-insulating film 16A be formed, for example, of a resin with water absorption rate of 0.5% or less, preferably, 0.3% or less. On the other hand, a low-polarity resin material allows moisture intruded therein to be easily diffused (has high water permeability) and has moisture vapor transmission rate of, for example, more than 100 $g/m^2$·day. It is preferable to use a resin with moisture vapor transmission rate of 500 $g/m^2$·day or less for the inter-layer insulating film 16A.

The inter-layer insulating film 16B is laminated on the inter-layer insulating film 16A and includes a resin material with polarity that is higher than the polarity of the resin material forming the inter-layer insulating film 16A. The inter-layer insulating film 16B may be configured of, for example, a material such as polyimide, acrylic-based resins, novolac-based resins, phenol-based resins, polyester-based resins, epoxy-based resins, vinyl-chloride-based resins, and polybenzimidazole-based resins. Other organic materials or other inorganic materials may be added to the high-polarity resin materials described above. Alternatively, the inter-layer insulating film 16B may be formed of an organic inorganic hybrid resin that has high polarity. Further, the inter-layer insulating film 16B may be formed of a resin material to which a number of high-polarity functional groups or hydrophilic groups are introduced. Examples of the high-polarity functional group include an aldehyde group, a ketone group, a carboxyl group (—COOH), an amide group (—$CONH_2$), an imide group, a phosphodiethyl group (—O—P(=O)OH—O—), and a peptide group (—CONH—). Examples of the hydrophilic group include a hydroxy group (—OH), an amino group (—$NH_2$), a thiol group (—SH), a carboxyl group, an amide group, a carbonyl group (—C=0), an alkanoyl group (R—CO—), and an acryloyl group ($H_2$C=CH—C(—O)—).

A resin with higher polarity such as the resins described above exhibits low water permeability. To give an example, a resin such as polyimide and acrylic-based resins is a hydrophilic resin in which a high-polarity functional group absorbs, at the upper-most surface of the film, water which also has high polarity (has high water absorbability), however, moisture is absorbed at the film surface, and therefore, moisture is less likely to be diffused or to intrude therein. The resin material included in the inter-layer insulating film 16B may have moisture vapor transmission rate, for example, of 100 $g/m^2$·day or less. Although a high-polarity resin material typically has high water absorbability (for example, water absorption rate higher than 0.5%), it is preferable to use a resin material with water absorption rate of 10% or less, more preferably, 2.0% or less, for the inter-layer insulating film 16B.

It is possible to suppress moisture intrusion into the oxide semiconductor film 12 by laminating, on the oxide semiconductor film 12, the inter-layer insulating film 16A formed of a resin material with low water absorbability and the inter-layer insulating film 16B formed of a resin material with low water permeability. In a view point of lamination order, it is preferable to provide the inter-layer insulating film 16A with low water absorbability and the inter-layer insulating film 16B with low water permeability in this order from the oxide semiconductor film 12 (high resistance film 15). In the inter-layer insulating film 16 configured of a laminate formed in the above-described order, first, the inter-layer insulating film 16B with high water absorbability absorbs moisture that exists in the atmosphere and moisture remained above the inter-layer insulating film 16 during the manufacturing processes. The moisture that has once been absorbed by the surface of the inter-layer insulating film 16B is less likely to diffuse in the inter-layer insulating film 16B, and is repelled by the surface of the inter-layer insulating film 16A with low water absorbability and is extracted to the atmosphere, for example, even when the moisture is extricated from the resin included in the inter-layer insulating film 16B through a process such as baking. Therefore, moisture intrusion into the oxide semiconductor film 12 is effectively suppressed by the above-described lamination order.

Moreover, the inter-layer insulating film 16 including a resin material is allowed to be easily thickened, for example, up to about 2 μm. The thickened inter-layer insulating film 16 may, for example, sufficiently cover a level difference between components such as the gate insulating film 13 and the gate electrode 14, thereby securing insulation between electrodes. Therefore, short circuits resulting from the level difference etc. are suppressed. Moreover, the inter-layer insulating film 16 including a resin material reduces wiring capacity resulting from metal wiring and allows the display unit 1 to have larger size and higher frame rate.

The pair of source-drain electrodes 17A and 17B are patterned on the inter-layer insulating film 16 and are connected to the source-drain regions 12A and 12B of the oxide semiconductor film 12 through the connection holes H1 that run through the inter-layer insulating film 16 and the high resistance film 15. The source-drain electrodes 17A and 17B are preferably provided avoiding a region immediately above the gate electrode 14 so as to suppress formation of parasitic capacity in intersection regions of the gate electrode 14 and the source-drain electrodes 17A and 17B. The source-drain electrodes 17A and 17B each have a thickness of, for example, about 200 nm and are each formed of a material similar to metal and transparent conductive film mentioned above for the gate electrode 14. It is preferable that the source-drain electrodes 17A and 17B each be configured of a laminate film including a low resistance layer and a barrier layer. One reason for this is that driving with less wiring delay is achievable by configuring the source-drain electrodes 17A and 17B of the above-described laminate film.

[Organic EL Device 20]

The organic EL device 20 is formed on the planarization film 18. The organic EL device 20 includes a first electrode 21, a pixel separation film 22, an organic layer 23, and a second electrode 24 in order from the planarization film 18 and is sealed by a protection layer 25. A sealing substrate 27 is attached on the protection layer 25 with an adhesion layer 26 formed of a thermoset resin or an ultraviolet-curable resin in between. The display unit 1 may be of a bottom emission type that extracts light generated in the organic layer 23 from the substrate 11, or may be of a top emission type that extracts the light from the sealing substrate 27.

The planarization film 18 is provided on the source-drain electrodes 17A and 17B and on the inter-layer insulating film 16, in an entire display region (later-described display region 50 in FIG. 2) of the substrate 11. The planarization film 18 has a connection hole H2. The connection hole H2 connects the source-drain electrodes 17A and 17B of the transistor 10 to the first electrode 21 of the organic EL device 20. The planarization film 18 may be formed of a resin material similar to that of the inter-layer insulating film 16 described above.

The first electrode 21 is provided on the planarization film 18 so as to fill the connection hole H2. The first electrode 21 may function, for example, as an anode and is provided for each device. In the display unit 1 of the bottom emission type, the first electrode 21 may be formed of a transparent conductive film, for example, a single-layer film of one of materials such as indium-tin oxide (ITO), indium-zinc oxide (IZO), and indium-zinc oxide (InZnO) or a laminate film of two or more thereof. On the other hand, in the display unit 1 of the top emission type, the first electrode 21 may be formed of reflective metal, for example, a single-layer film made of simple substance metal of one of aluminum, magnesium (Mg), calcium (Ca), and sodium (Na) or an alloy including one or more thereof, or a multi-layered film including lamination of simple substance metal or alloys.

The pixel separation film 22 secures insulation between the first electrode 21 and the second electrode 24 and partitions light emitting regions of the respective devices. The pixel separation film 22 has an aperture that faces the light emitting region of each device. The pixel separation film 22 may be configured of, for example, a photosensitive resin such as polyimide, an acrylic resin, and novolac-based resins.

The organic layer 23 covers the aperture of the pixel separation film 22. The organic layer 23 includes an organic electroluminescence layer (organic EL layer) and emits light in response to drive current application. The organic layer 23 may include, for example, a hole injection layer, a hole transport layer, the organic EL layer, and an electron transport layer in order from the substrate 11 (first electrode 21) and emits light resulting from recombination of electrons and holes in the organic EL layer. The organic EL layer is not particularly limited as long as the organic EL layer is formed of any typical low-molecular or high-molecular organic material. For example, organic EL layers emitting red, green, or blue light may be provided for respective device to exhibit different colors. Alternatively, an organic EL layer emitting white light (for example, a laminate of red, green, and blue organic EL layers) may be provided over the entire surface of the substrate 11. The hole injection layer increases hole injection efficiency and suppresses current leakage. The hole transport layer increases efficiency of hole transport to the organic EL layer. Layers other than the organic EL layer such as the hole injection layer, the hole transport layer, and the electron transport layer may be provided as necessary.

The second electrode 24 may function, for example, as a cathode and may be configured of a metal conductive film. In the display unit 1 of the bottom emission type, the second electrode 24 may be formed of reflective metal, for example, a single-layer film made of simple substance metal of one of aluminum, magnesium (Mg), calcium (Ca), and sodium (Na) or an alloy including one or more thereof, or a multi-layered film including lamination of simple substance metal or alloys. On the other hand, in the display unit 1 of the top emission type, the second electrode 24 may be formed of a transparent conductive film made of a material such as ITO and IZO. The second electrode 24 is insulated from the first electrode 21 and may be shared by the devices, for example.

The protection layer 25 may be configured of either of an insulating material or an electrically-conductive material. Examples of the insulating material include amorphous silicon (a-Si), amorphous carbonized silicon (a-SiC), amorphous silicon nitride (a-Si$_{(1-x)}$N$_x$), and amorphous carbon (a-C).

The sealing substrate 27 is so arranged as to face the substrate 11 with the transistor 10 and the organic EL device 20 in between. The sealing substrate 27 may be formed of a material similar to that of the substrate 11 described above. In the display unit 1 of the top emission type, the sealing substrate 27 is formed of a transparent material and components such as a color filter and a light shielding film may be provided on the sealing substrate 27 side. In the display unit 1 of the bottom emission type, the substrate 11 is configured of a transparent material and components such as a color filter and a light shielding film may be provided on the substrate 11 side.

[Configurations of Peripheral Circuits and Pixel Circuit]

Figure 2:
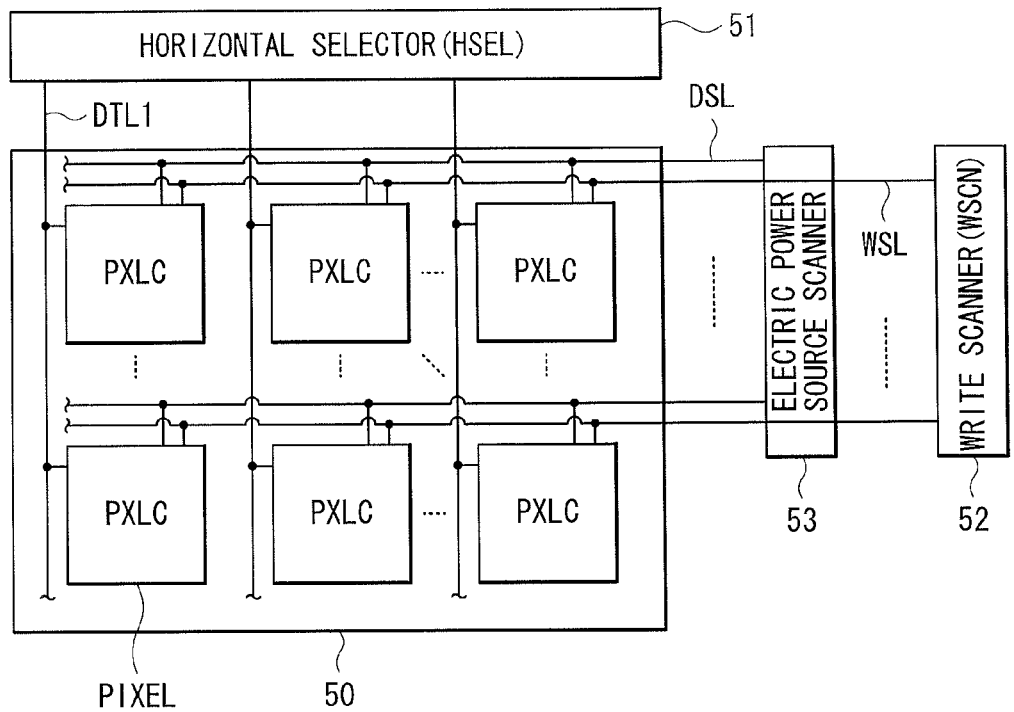
FIG. 2 is a diagram illustrating a general configuration including peripheral circuits of the display unit shown in FIG. 1.

As shown in FIG. 2, the display unit 1 includes a plurality of pixels PXLC that each include the above-described organic EL device 20. The pixels PXLC may be arranged, for example, in matrix, in the display region 50 on the substrate 11. A horizontal selector (HSEL) 51, a write scanner (WSCN) 52, and an electric power source scanner 53 that function as a signal line drive circuit, a scanning line drive circuit, and a power source line scanning circuit, respectively, are provided around the display region 50.

In the display region 50, a plurality of (n-number of) signal lines DTL1 to DTLn are arranged in a column direction and a plurality of (m-number of) scanning lines WSL1 to WSLm are arranged in a row direction. The pixel PXLC (one of pixels corresponding to R, G, and B) is provided at each intersection of the signal line DTL and the scanning line DSL. Each signal line DTL is electrically connected to the horizontal selector 51. The horizontal selector 51 supplies an image signal to each pixel PXLC through the signal line DTL. On the other hand, each scanning line WSL is electrically connected to the write scanner 52. The write scanner 52 supplies a scanning signal (selection pulse) to each pixel PXLC through the scanning line WSL. Each electric power source line DSL is connected to the electric power source scanner 53. The electric power source scanner 53 supplies an electric power source signal (control pulse) to each PXLC through the electric power source line DSL.

Figure 3:
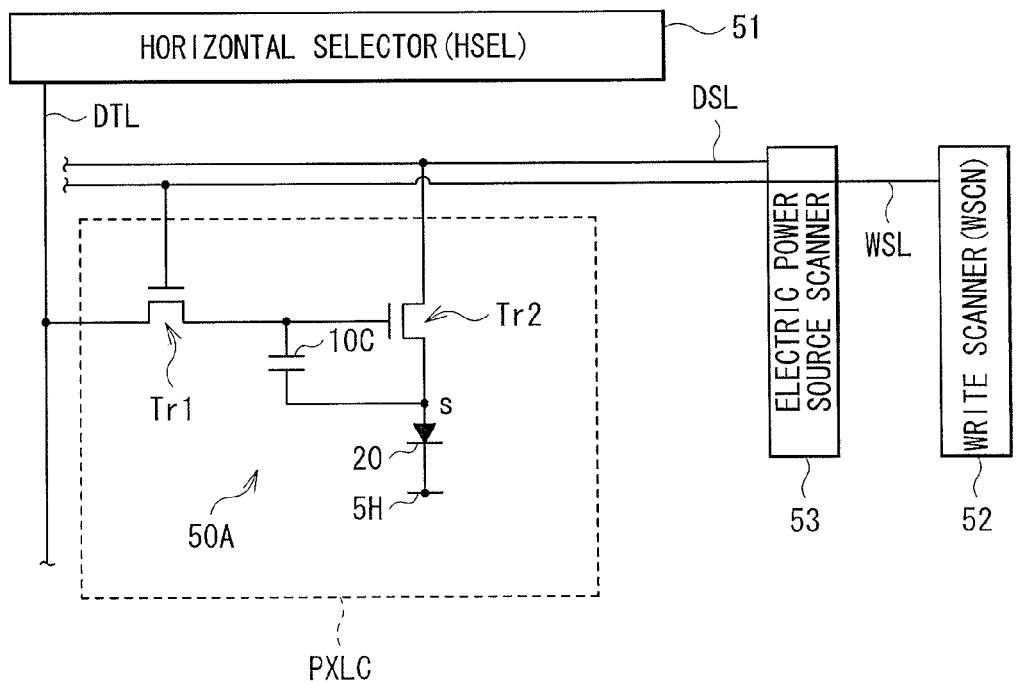
FIG. 3 is a diagram illustrating a circuit configuration of a pixel shown in FIG. 2.

FIG. 3 illustrates a specific circuit configuration example in the pixel PXLC. Each pixel PXLC includes a pixel circuit 50A that includes the organic EL device 20. The pixel circuit 50A is an active drive circuit that includes a sampling transistor Tr1, a driving transistor Tr2, a retention capacitor (retention capacitor 10C), and the organic EL device 20. It is to be noted that one or both of the sampling transistor Tr1 and the driving transistor Tr2 correspond to the above-described transistor 10.

A gate of the sampling transistor Tr1 is connected to the scanning line WSL corresponding thereto. One of a source and a drain of the sampling transistor Tr1 is connected to the signal line DTL corresponding thereto and the other thereof is connected to a gate of the driving transistor Tr2. A drain of the driving transistor Tr2 is connected to the electric power source line DSL corresponding thereto and a source of the driving transistor Tr2 is connected to the anode of the organic EL device 20. Further, the cathode of the organic EL device 20 is connected to a ground wiring 5H. It is to be noted that the ground wiring 5H is shared by all of the pixels PXLC. The retention capacitor 10C is arranged between the source and the gate of the driving transistor Tr2.

The sampling transistor Tr1 becomes conductive in response to the scanning signal (selection pulse) supplied from the scanning line WSL, thereby sampling a signal potential supplied from the signal line DTL and holding the signal potential in the retention capacitor 10C. The driving transistor Tr2 receives a current supplied from the electric power source line DSL set at a predetermined first potential (not illustrated), and supplies a drive current to the organic EL device 20 in accordance with the signal potential retained in the retention capacitor 10C. The organic EL device 20 emits light with luminance in accordance with the signal potential of the image signal, in response to the drive current supplied from the driving transistor Tr2.

In the above-described circuit configuration, the sampling transistor Tr1 becomes conductive in response to the scanning signal (selection pulse) supplied from the scanning line WSL, and the signal potential of the image signal supplied from the signal line DTL is thereby sampled and retained in the retention capacitor 10C. Further, the electric power source line DSL set at the above-described first electric potential supplies a current to the driving transistor Tr2 and the driving transistor Tr2 supplies the drive current to the organic EL device 20 (each of the organic EL devices of red, green, and blue) in response to the signal potential retained by the retention capacitor 10C. Each organic EL device 20 emits light with luminance in accordance with the signal potential of the image signal in response to the supplied drive current. Thus, the display unit 1 displays an image based on the image signal.

The display unit 1 may be manufactured as follows, for example.

[Step of Forming Transistor 10]

Figure 4A:
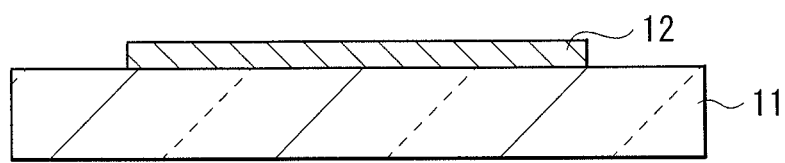
FIGS. 4A to 4C are cross-sectional views illustrating a method of manufacturing the display unit shown in FIG. 1 in process order.

First, as shown in FIG. 4A, the oxide semiconductor film 12 made of the above-described material is formed on the substrate 11. Specifically, an oxide semiconductor film (not illustrated) is formed, for example, to a thickness of about 50 nm by a method such as sputtering. A ceramic with a composition same as that of the oxide semiconductor to be formed in a film is used as a target upon this sputtering. Further, partial pressure of oxygen is so controlled as to obtain preferable transistor characteristics since carrier concentration in the oxide semiconductor largely depends on the partial pressure of oxygen upon sputtering. At this time, it is possible to improve etching selectivity upon etching of the insulating film 13A (see later-described FIG. 4B) and the high resistance film 15 by using the crystalline oxide semiconductor material as described above. Subsequently, the formed oxide semiconductor material film is patterned in a predetermined shape, for example, by photolithography and etching. At that time, it is preferable to process the formed oxide semiconductor material film by wet etching with use of mixture of phosphoric acid, nitric acid, and acetic acid. The mixture of phosphoric acid, nitric acid, and acetic acid allows selection ratio with an underlayer to be sufficiently large and allows relatively-easy process.

Figure 4B:
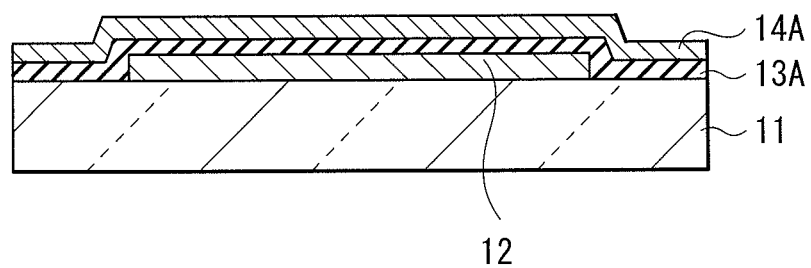

Subsequently, as shown in FIG. 4B, for example, the insulating film 13A made of a silicon oxide film with a thickness of 300 nm and a conductive film 14A made of molybdenum with a thickness of 200 nm are formed in this order on the oxide semiconductor 12 so as to cover the entire surface above the substrate 11. The insulating film 13A may be formed, for example, by a plasma chemical vapor deposition (CVD) method. Alternatively, the insulating film 13A made of a silicon oxide film may be formed by reactive sputtering other than the plasma CVD method. An atomic layer deposition may be used in addition to the above-described reactive sputtering and CVD method when the insulating film 13A is formed of an aluminum oxide film. The conductive film 14A may be formed, for example, by sputtering.

Figure 4C:
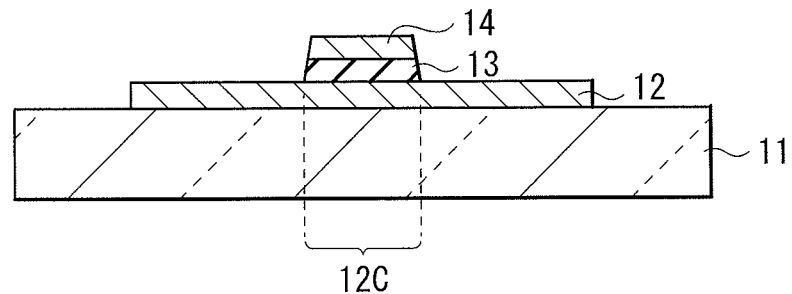

After forming the conductive film 14A, the conductive film 14A may be patterned, for example, by photolithography and etching to form the gate electrode 14 in a selective region on the oxide semiconductor film 12. Subsequently, the insulating film 13A is etched with use of the gate electrode 14 as a mask. Thus, the gate insulating film 13 is patterned in a shape substantially the same as that of the gate electrode 14 in a planar view (FIG. 4C). When the surface of the oxide semiconductor film 12 is crystallized, the process is easily performed with maintaining an extremely large etching selection ratio by using chemical such as hydrofluoric acid in this etching step.

Figure 5A:
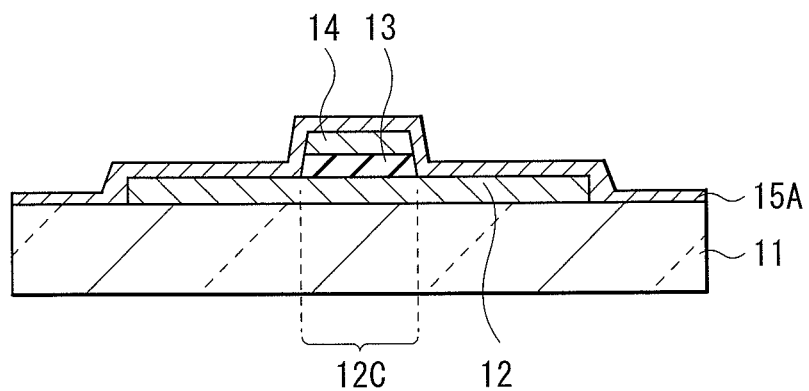
FIGS. 5A and 5B are cross-sectional views illustrating steps following the step shown in FIG. 4C.

Subsequently, as shown in FIG. 5A, a metal film 15A made of metal such as titanium, aluminum, tin, and indium is formed with a thickness from 5 nm to 10 nm both inclusive on the entire surface over the substrate 11, for example, by sputtering or by atomic layer deposition. The metal film 15A is configured of metal that reacts with oxygen at a relatively-low temperature and is brought into contact with a region adjacent to the channel region 12C of the oxide semiconductor film 12. After forming the metal film 15A, for example, a protection film (not illustrated) made of titanium oxide or aluminum oxide with a thickness of about 50 nm may be formed by sputtering or by atomic layer deposition.

Figure 5B:
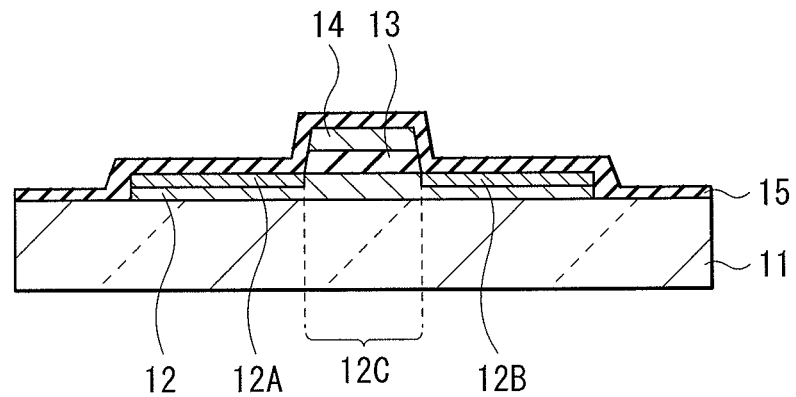

Subsequently, as shown in FIG. 5B, the metal film 15A is oxidized, for example, by annealing at about 300° C., and the high resistance film 15 is formed thereby. At this time, the source-drain regions 12A and 12B are formed on the high resistance film 15 side of part of the oxide semiconductor film 12 along the thickness direction, that is in contact with the high resistance film 15, i.e., that is in a position adjacent to the channel region 12C. An oxidization reaction of the metal film 15A utilizes part of oxygen included in the oxide semiconductor film 12. Therefore, in the oxide semiconductor film 12, oxygen concentration decreases from the surface (top face) in contact with the metal film 15A as the oxidation of the metal film 15A proceeds. On the other hand, metal such as aluminum is diffused into the oxide semiconductor film 12 from the metal film 15A. This metal element functions as a dopant and lowers resistance in a region on the top face side of the oxide semiconductor film 12 that is in contact with the metal film 15A. Thus, the source-drain regions 12A and 12B that have electric resistance lower than that of the channel region 12C are formed.

Upon annealing the metal film 15A, it is preferable to anneal the metal film 15A under oxidizing gas atmosphere including oxygen etc. One reason is that this suppresses decrease in oxygen concentration in the source-drain regions 12A and 12B and allows the oxide semiconductor film 12 to be supplied with sufficient amount of oxygen. This allows reduction in later annealing steps, which results in process simplification.

The high resistance film 15 may be formed, for example, by setting temperature of the substrate 11 to be relatively high when the metal film 15A is formed on the substrate 11, instead of the above-described annealing step. For example, in the step shown in FIG. 5A, when the metal film 15A is formed while retaining the temperature of the substrate 11 at about 200° C., resistance in a predetermined region in the oxide semiconductor film 12 is lowered without annealing. Thus, it is possible to lower the carrier concentration in the oxide semiconductor film 12 to a level necessary for a transistor.

The metal film is preferably formed with a thickness of 10 nm or less as described above. One reason is that the metal film 15A is completely oxidized (the high resistance film 15 is formed) by annealing under oxygen atmosphere when the metal film 15A has a thickness of 10 nm or less. Further, oxidation is preceded by oxygen plasma when a protection film is formed on the metal film 15A. When the metal film 15A is not completely oxidized, it may be necessary to provide a step of removing the non-oxidized metal film 15A, for example, by dry etching using gas including chlorine etc. One reason is that leakage current may occur when the metal film 15A that is not fully oxidized remains on the gate electrode 14. When the metal film 15A is completely oxidized and the high resistance film 15 is formed thereby, the above-described removing step is not necessary, which results in simplification of manufacturing processes. In other words, occurrence of leakage current is suppressed without the removing step by etching. It is to be noted that the thickness of the high resistance film 15 after the heat treatment is about 20 nm or less when the metal film 15A is formed with a thickness of 10 nm or less.

The metal film 15A may be oxidized by a method such as oxidation under water vapor atmosphere and plasma oxidation, other than the above-described heat treatment. Upon plasma oxidation, it is preferable to set the temperature of the substrate 11 to be about from 200° C. to 400° C. both inclusive and to generate plasma in gas atmosphere including oxygen such as gas atmosphere of mixture gas of oxygen and carbon dioxide to process the metal film 15A. The thus-formed high resistance film 15 has favorable barrier characteristics as described above and reduces influence of oxygen, moisture, etc. with respect to the oxide semiconductor film 12, thereby stabilizing electric characteristics of the transistor 10 together with the inter-layer insulating film 16.

Moreover, the resistance of the predetermined region in the oxide semiconductor film 12 may be lowered by plasma treatment using, for example, hydrogen, argon, ammonium gas, or the like in a plasma CVD apparatus, other than by the above-described method utilizing reaction between the metal film 15A and the oxide semiconductor film 12. In addition thereto, a silicon nitride film, a silicon oxide film, or a silicon oxide nitride film that includes hydrogen may be formed, for example, by a plasma CVD method and the resistance in the predetermined region of the oxide semiconductor film 12 may be lowered by, for example, hydrogen diffusion from this silicon nitride film or the like.

Figure 6A:
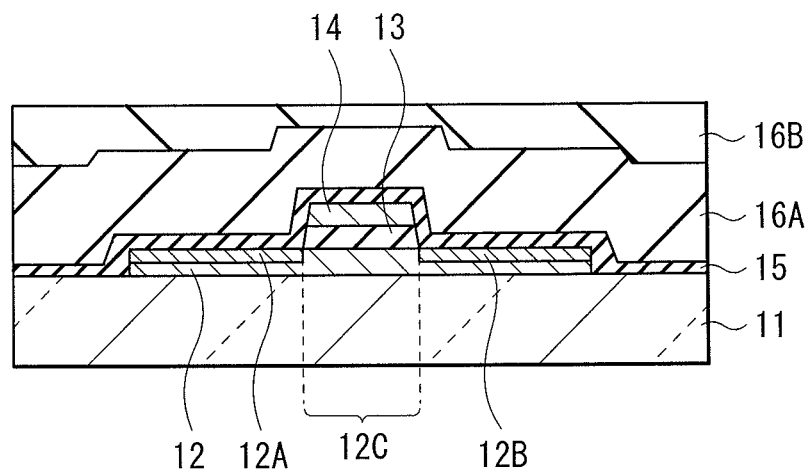
FIGS. 6A and 6B are cross-sectional view illustrating steps following the step shown in FIG. 5B.

After forming the high resistance film 15, as shown in FIG. 6A, for example, the inter-layer insulating film 16A configured of polysiloxane with a thickness of 1 μm to 2 μm both inclusive and the inter-layer insulating film 16B configured of polyimide with a thickness of 1 μm to 2 μm both inclusive may be formed in this order on an entire surface of the high resistance film 15. Resin materials for the respective inter-layer insulating films 16A and 16B are applied on the high resistance film 15, for example, by spin coating or by slit coating. Thereafter, exposure and development are performed to provide the connection holes H1 (not illustrated in FIG. 6A) in preferable positions. The resultant is annealed at a temperature of about 150° C. to 300° C., and thereby, the inter-layer insulating films 16A and 16B are formed. The exposure and the development may be separately performed for the inter-layer insulating film 16A and for the inter-layer insulating film 16B and may be performed at the same time when the inter-layer insulating films 16A and 16B are configured of resins with substantially the same exposure sensitivity. As described above, a vacuum process that may be necessary in methods such as a CVD method is not necessary in a case of the inter-layer insulating film 16 formed of a resin material. Therefore, it is possible to suppress oxygen desorption, a reduction reaction due to factors such as hydrogen, etc. in the oxide semiconductor film 12. Accordingly, it is possible to form the transistor 10 with high electric stability and high reliability. Although the inter-layer insulating film 16 may be formed of three or more layers (FIG. 8) as will be described later, it is preferable to provide the inter-layer insulating film 16 of two layers (inter-layer insulating films 16A and 16B) in order to lower the cost by reducing the number of steps.

After forming the inter-layer insulating film 16, apertures are provided in the high resistance film 15, for example, by photolithography and dry etching to form the connection holes H1 that reach the source-drain regions 12A and 12B of the oxide semiconductor film 12. When the surface of the oxide semiconductor film 12 is crystallized as described above, for example, it is possible to perform wet etching with use of dilute hydrofluoric acid with maintaining sufficient etching selectivity between the oxide semiconductor film 12 and the high resistance film 15. In other words, it is possible to easily form the connection holes H1 in the high resistance film 15, configured of, for example, an aluminum oxide film, that is difficult to be dry-etched.

Figure 6B:
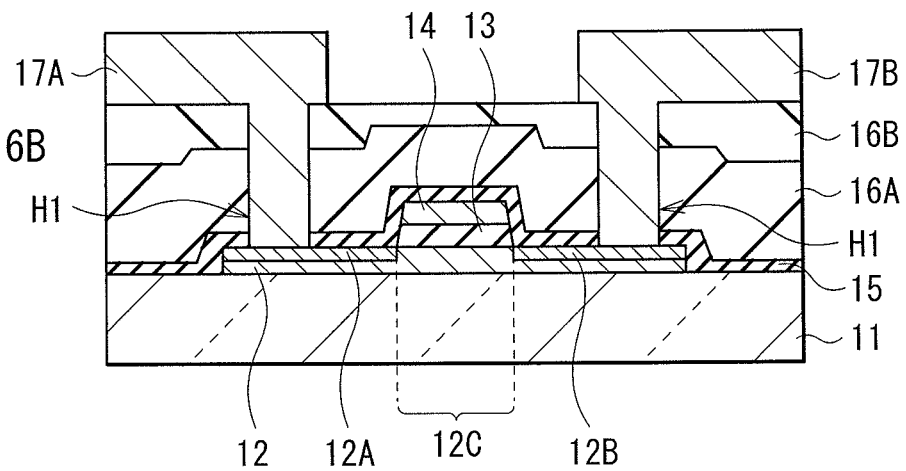

Subsequently, a conductive film (not illustrated) made of the above-described material of the source-drain electrodes 17A and 17B is formed on the inter-layer insulating film 16, for example, by sputtering, and the connection holes H1 are filled with the conductive film. Thereafter, the conductive film is patterned in a predetermined shape, for example, by photolithography and etching. Accordingly, the pair of source-drain electrodes 17A and 17B are formed on the inter-layer insulating film 16 and the source-drain electrodes 17A and 17B are electrically connected to the source-drain regions 12A and 12B of the oxide semiconductor film 12 through the connection holes H1 (FIG. 6B). The transistor 10 is formed on the substrate 11 by the above-described processes.

[Step of Forming Planarization Film 18]

Subsequently, the planarization film 18 made of the above-described material is formed, for example, by a coating method such as spin coating and slit coating so as to cover the inter-layer insulating film 16 and the source-drain electrodes 17A and 17B, and the connection hole H2 is formed in part of the region facing the source-drain electrodes 17A and 17B.

[Step of Forming Organic EL Device 20]

Subsequently, the organic EL device 20 is formed on the planarization film 18. Specifically, the first electrode 21 configured of the above-described material is formed on the planarization film 18 by a method such as sputtering so as to fill the connection hole H2, which is patterned, for example, by photolithography and etching. Thereafter, the pixel separation film 22 with an aperture is formed on the first electrode 21, and then, the organic layer 23 is formed by a method such as vacuum deposition. Subsequently, the second electrode 24 configured of the above-described material is formed on the organic layer 23, for example, by sputtering. Subsequently, the protection layer 25 is formed on the second electrode 24, for example, by a CVD method, and then, the sealing substrate 27 is attached on the protection layer 25 with use of the adhesion layer 26. Thus, the display unit 1 shown in FIG. 1 is completed.

In the display unit 1, for example, when each pixel PXLC corresponding to one of R, G, and B receives a drive current in accordance with an image signal of each color, electrons and holes are injected into the organic layer 23 through the first electrode 21 and the second electrode 24. The electrons and the holes are recombined in the organic EL layer included in the organic layer 23, which results in light emission. Thus, the display unit 1 displays full-color images, for example, of R, G, and B.

In the present example, the inter-layer insulating films 16A and 16B having different physical properties are laminated on the oxide semiconductor film 12. Therefore, moisture intrusion into the oxide semiconductor film 12 is suppressed and TFT characteristics of the transistor 10 are improved. This will be described in detail below.

Figure 7:
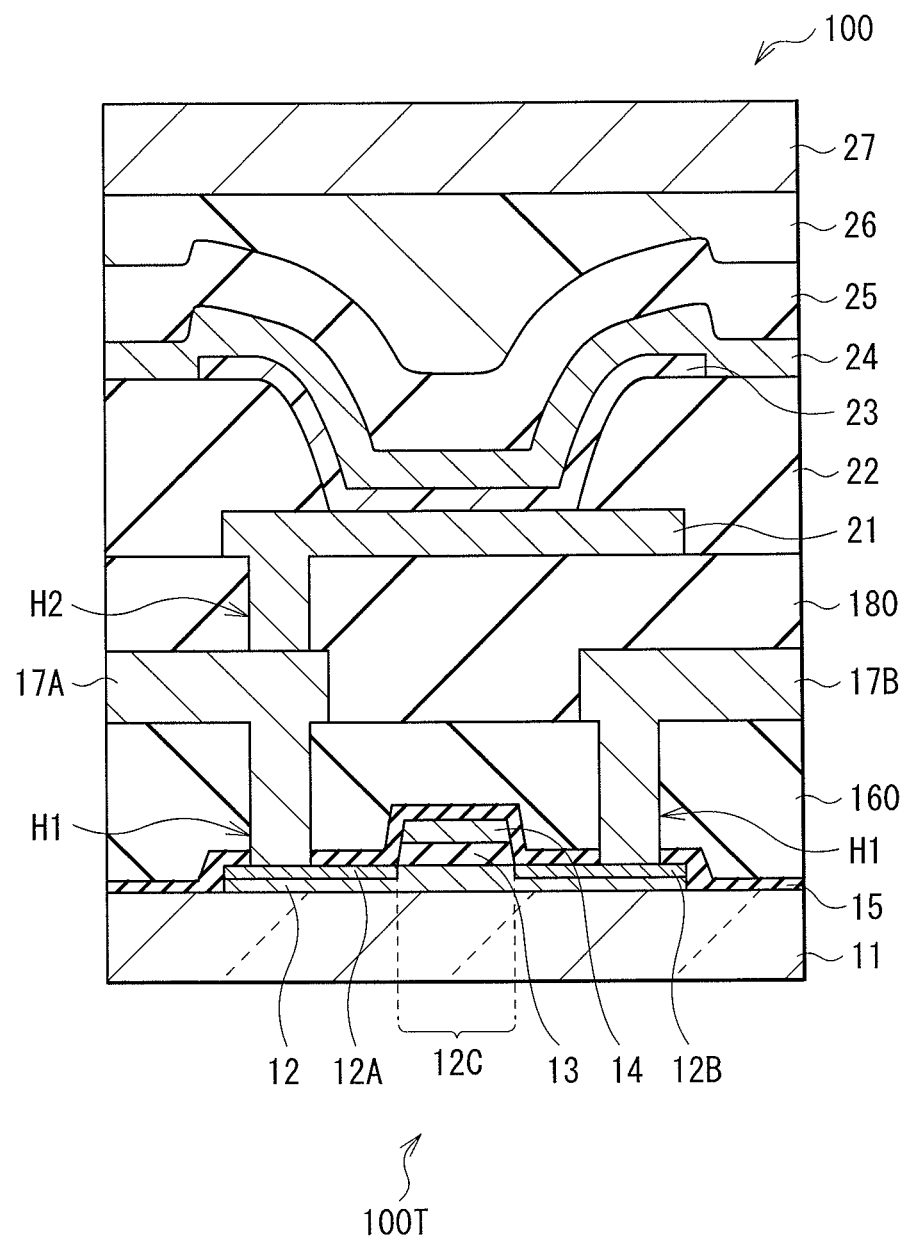
FIG. 7 is a cross-sectional view illustrating a configuration of a display unit according to Comparative Example 1.

FIG. 7 illustrates a cross-sectional configuration of a display unit (display unit 100) according to Comparative Example 1. A transistor 100T in the display unit 100 includes an inter-layer insulating film 160 of a single layer including one kind of resin material. Further, a planarization film 180 on the transistor 100T is configured of a resin material same as that of the inter-layer insulating film 160.

In the transistor 100T of a self-aligned structure, the inter-layer insulating film 160 is preferably formed of a resin material as described above and is specifically formed of a resin with high heat resistance such as polyimide. However, polyimide has high water absorption rate. Therefore, moisture easily intrudes into the oxide semiconductor film 12 from the atmosphere and the upper layers through the inter-layer insulating film 160 and the planarization film 180. In particular, moisture may be diffused into the oxide semiconductor film 12 through the source-drain regions 12A and 12B that are closer to the inter-layer insulating film 160 compared to the channel region 12C. The TFT characteristics of the transistor 100T are lowered influenced by such moisture. Moreover, although the inter-layer insulating film 160 and the planarization film 180 may be configured of a material with low water absorption rate such as polysiloxane, polysiloxane having high water permeability allows once-absorbed moisture to be easily transmitted into the oxide semiconductor layer 12, which may result in degradation of the oxide semiconductor layer 12. In other words, water absorbability and water permeability are in a relation of trade-off. Therefore, it is difficult to sufficiently protect the oxide semiconductor film 12 from moisture by only one kind of resin material.

On the other hand, in the display unit 1, the inter-layer insulating film 16B made of the high-polarity resin material suppresses moisture transmission and the inter-layer insulating film 16A made of the low-polarity resin material repels water at the surface thereof. Due to the above-described inter-layer insulating film 16 that has both low water permeability and low water absorbability, moisture intrusion into the oxide semiconductor film 12 is suppressed, and TFT characteristics, in particular, reliability is improved in the transistor 10.

As described above, in the present embodiment, the inter-layer insulating film 16 is configured of a plurality of layers (inter-layer insulating films 16A and 16B) made of resin materials having different polarities. Therefore, moisture intrusion into the oxide semiconductor film 12 is reduced and the TFT characteristics of the transistor 10 are improved.

Moreover, the transistor 10 of a self-aligned structure is provided. Therefore, occurrence of parasitic capacity between the gate electrode 13 and the source-drain electrodes 17A and 17B is suppressed, and thereby, high-quality images are displayed. Moreover, the display unit 1 is allowed to have larger screen size, higher definition, and higher frame rate.

Modifications of the present embodiment and other embodiments will be described below. Components same as that of the above-described embodiment will be designated by the same numerals and description thereof will be omitted as appropriate.

[Modification 1]

Figure 8:
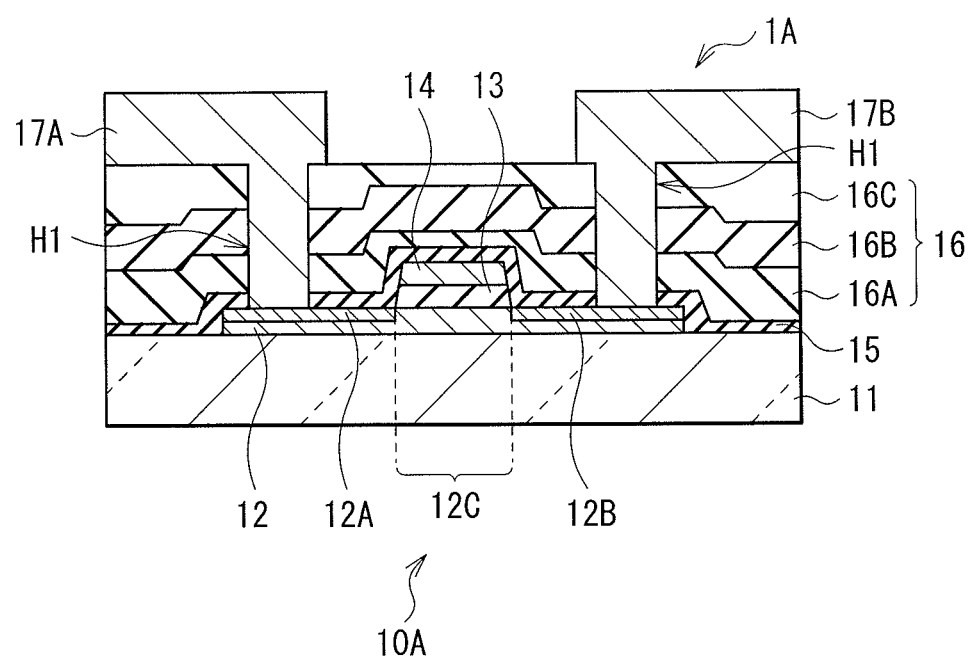
FIG. 8 is a cross-sectional view illustrating a main part configuration of a display unit according to Modification 1.

FIG. 8 illustrates a cross-sectional configuration of a main part of a display unit (display unit 1A) according to Modification 1 of the above-described first embodiment. The display unit 1A further includes an inter-layer insulating film 16C (third insulating film) on the inter-layer insulating film 16B of the above-described embodiment. The connection holes H1 run through the inter-layer insulating film 16C as well as the inter-layer insulating films 16A and 16B. The inter-layer insulating film 16C includes a resin material with polarity that is different from the polarity of the inter-layer insulating film 16B. Except for this point, the display unit 1A has a configuration similar to that of the display unit 1 of the above-described embodiment and has functions and effects similar to those of the display unit 1 of the above-described embodiment.

The polarity of the resin material configuring the inter-layer insulating film 16C may be higher than that of the inter-layer insulating film 16B or may be lower than that of the inter-layer insulating film 16A. Alternatively, the polarity of the resin material configuring the inter-layer insulating film 16C may be equal to or higher than that of the inter-layer insulating film 16A and lower than that of the inter-layer insulating film 16B. Further, the inter-layer insulating film 16C may be configured of a resin material same as that of the inter-layer insulating film 16A. A waterproof effect is especially high when the polarity of the resin material configuring the inter-layer insulating film 16C is higher than that of the inter-layer insulating film 16A and is lower than that of the inter-layer insulating film 16B, that is, when the polarity is larger in order of "inter-layer insulating film 16B>inter-layer insulating film 16C>inter-layer insulating film 16A". In the above-described inter-layer insulating film 16, moisture once absorbed in the inter-layer insulating film 16B is diffused toward the inter-layer insulating film 16C that has water permeability that is larger than that of the inter-layer insulating film 16A. Therefore, moisture intrusion into the inter-layer insulating film 16A that is located closest to the oxide semiconductor film 12 is suppressed. FIG. 8 illustrates the inter-layer insulating film 16C of a single layer. However, the inter-layer insulating film 16C may be configured of a plurality of films. Each of the plurality of films includes a resin material with polarity that is different from that of films on the top and on the bottom thereof. The above-described inter-layer insulating film 16 configured of three or more layers suppresses moisture intrusion into the oxide semiconductor film 12 more effectively.

[Modification 2]

Figure 9:
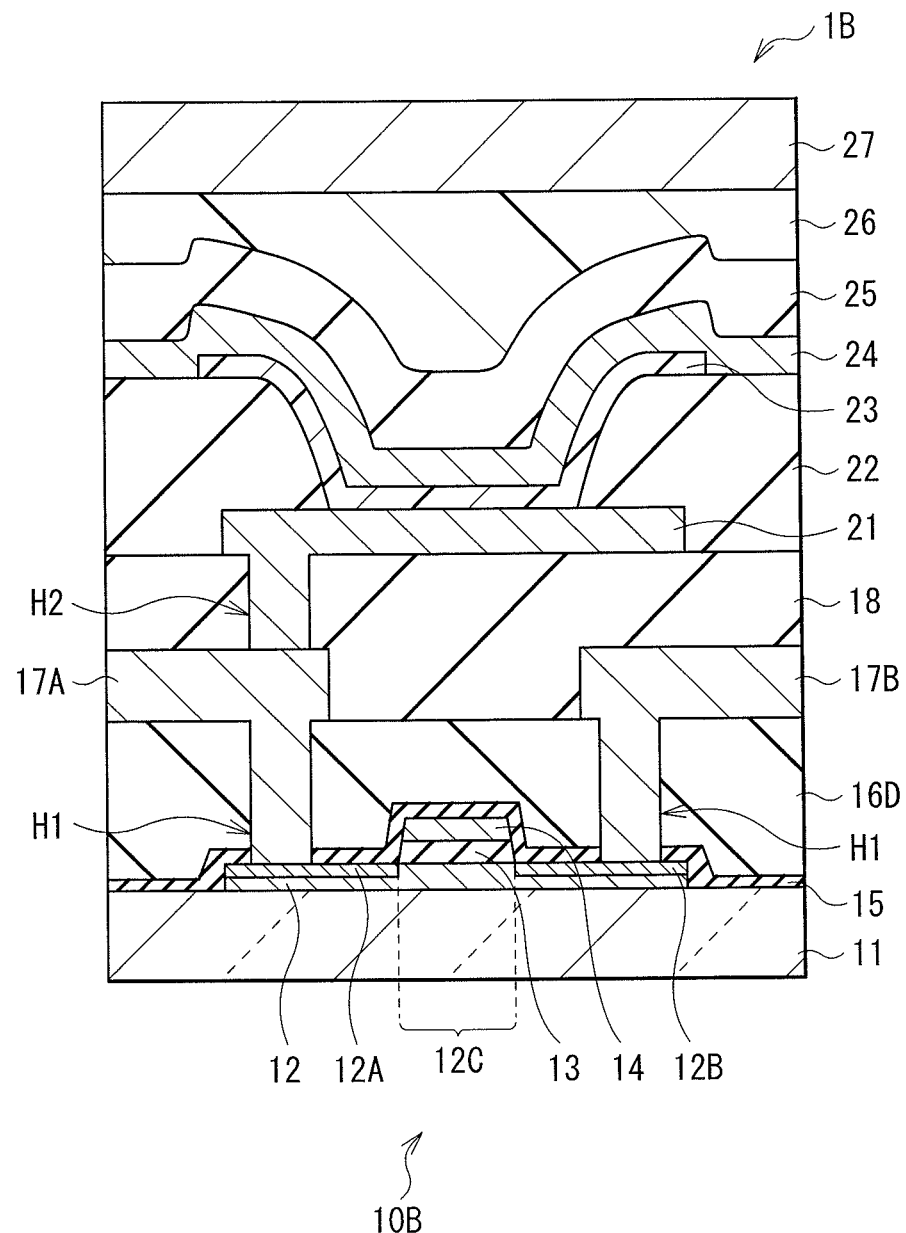
FIG. 9 is a cross-sectional view illustrating a configuration of a display unit according to Modification 2.

FIG. 9 is a cross-sectional configuration of a display unit (display unit 1B) according to Modification 2 of the above-described first embodiment. The display unit 1B includes an inter-layer insulating film (inter-layer insulating film 16D) that is configured of a single kind of resin material. The material configuring the inter-layer insulating film 16D has polarity that is different from the polarity of the resin material configuring the planarization film 18. Except for this point, the display unit 1B has a configuration similar to that of the display unit 1 of the above-described embodiment and has functions and effects similar to those of the display unit 1 of the above-described embodiment.

The inter-layer insulating film 16D (first insulating film) of a single layer may be configured of a material such as polysiloxane, polyolefin-based resins, polyethylene-based resins, and polystyrene-based resins. The source-drain electrodes 17A and 17B are electrically connected to the oxide semiconductor film 12 through the connection holes H1 that run through the inter-layer insulating film 16D. The planarization film 18 (second insulating film) is provided on the inter-layer insulating film 16D and covers the source-drain electrodes 17A and 17B. The planarization film 18 is configured of a resin with polarity different from that of the inter-layer insulating film 16D, for example, a material with polarity higher than that of the resin material configuring the inter-layer insulating film 16D, such as polyimide, acrylic-based resins, novolac-based resins, phenol-based resins, polyester-based resins, epoxy-based resins, vinyl-chloride-based resins, and polybenzimidazole-based resins. The inter-layer insulating film 16D and the planarization film 18 may be configured of organic inorganic hybrid resins with different polarities. A planarization film (for example, a planarization film 18C described later) including a plurality of layers may be laminated on the inter-layer insulating film 16D.

[Modification 3]

Figure 10:
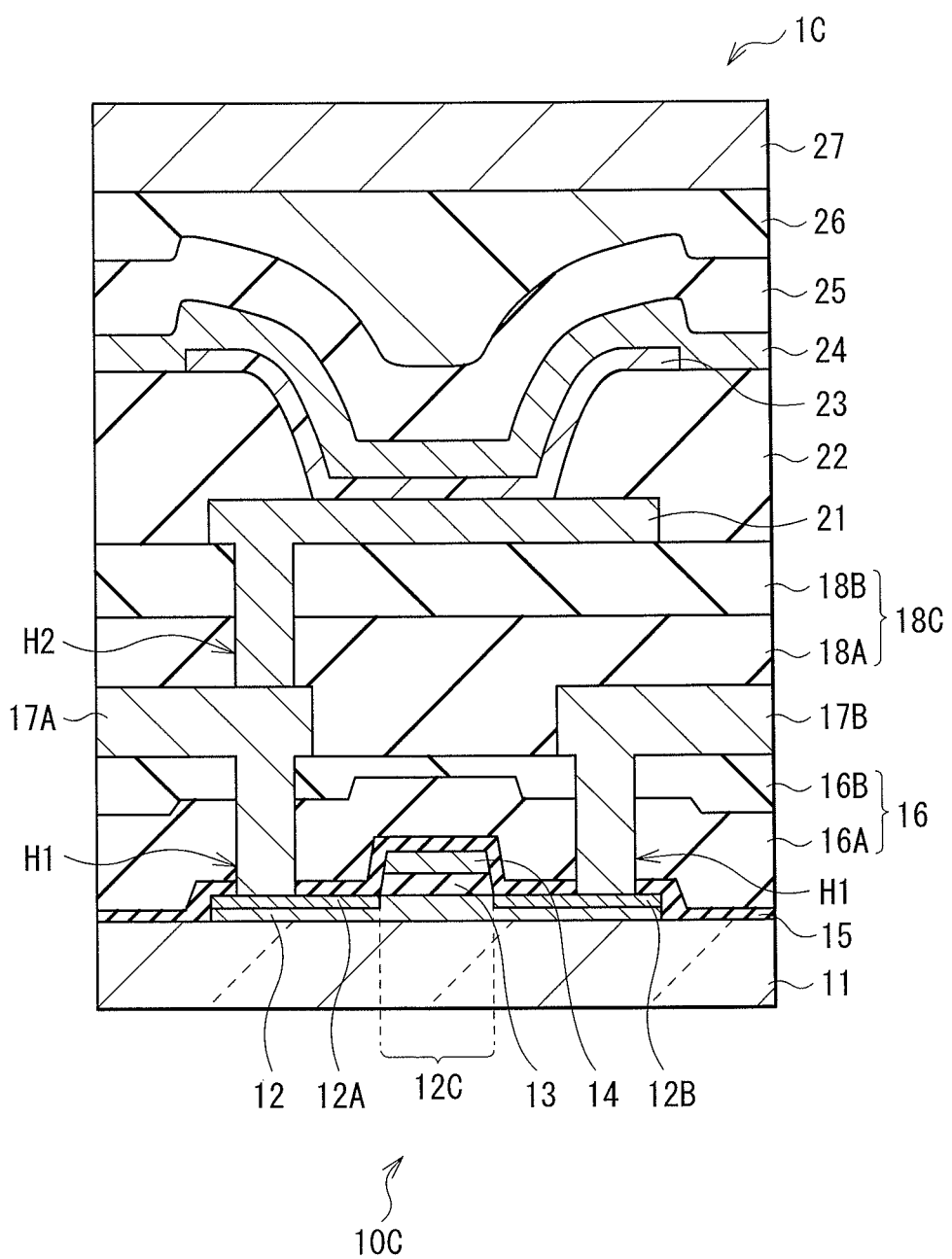
FIG. 10 is a cross-sectional view illustrating a configuration of a display unit according to Modification 3.

FIG. 10 illustrates a cross-sectional configuration of a display unit (display unit 1C) according to Modification 3 of the above-described first embodiment. The display unit 1C includes the inter-layer insulating film 16 (inter-layer insulating films 16A and 16B) with a laminate structure and includes a planarization film (planarization film 18C) with a laminate structure on a transistor (transistor 10C). The planarization film 18C covers the source-drain electrodes 17A and 17B of the transistor 10C. Except for this point, the display unit 1C has a configuration similar to that of the display unit 1 of the above-described embodiment and has functions and effects similar to those of the display unit 1 of the above-described embodiment.

The planarization film 18C includes a planarization film 18A (third insulating film) and a planarization film 18B (fourth insulating film) in order from the inter-layer insulating film 16 (source-drain electrodes 17A and 17B). The planarization film 18A is configured of a resin material that has polarity different from that of the resin material configuring the inter-layer insulating film 16B. Examples thereof include polysiloxane, polyolefin-based resins, polyethylene-based resins, and polystyrene-based resins. The planarization film 18B is configured of a resin material that has polarity different from that of the material configuring the planarization film 18A. Examples thereof include materials with polarity higher than that of the planarization film 18A, such as polyester-based resins, epoxy-based resins, vinyl-chloride-based resins, and polybenzimidazole-based resins. Moisture intrusion into the oxide semiconductor film 12 is suppressed more effectively by providing the planarization film 18C configured of a plurality of layers in addition to the inter-layer insulating film 16.

[Modification 4]

Figure 11:
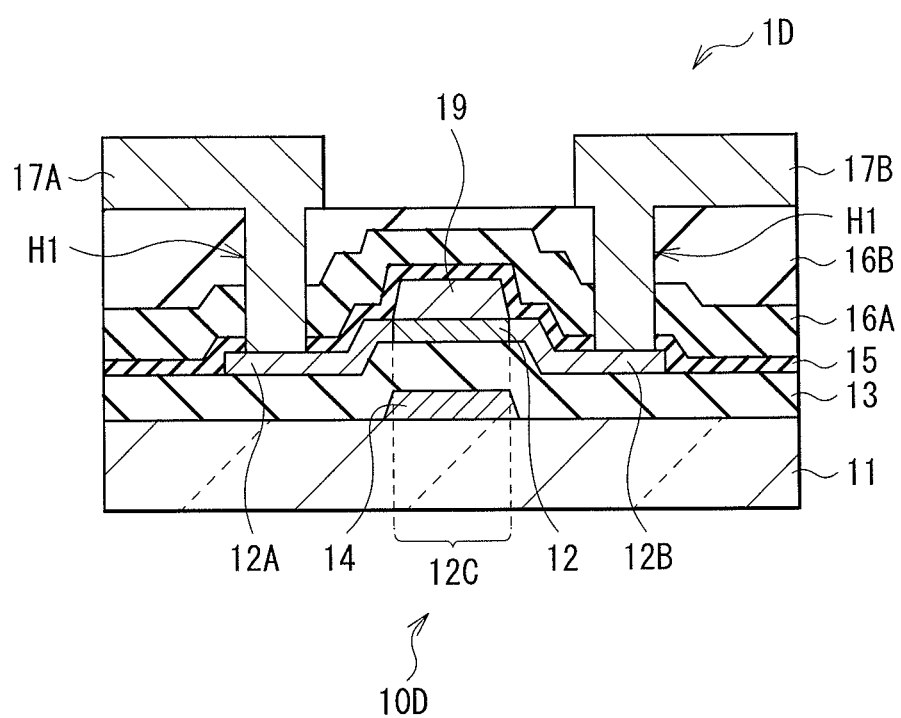
FIG. 11 is a cross-sectional view illustrating a configuration of a display unit according to Modification 4.

FIG. 11 is a cross-sectional configuration of a display unit (display unit 1D) according to Modification 4 of the above-described first embodiment. The display unit 1D includes a transistor (transistor 10D) of a bottom-gate type (inversed-staggered structure). Except for this point, the display unit 1D has a configuration similar to that of the display unit 1 of the above-described embodiment and has functions and effects similar to those of the display unit 1 of the above-described embodiment.

The transistor 10D includes the gate electrode 14, the gate insulating film 13, and the oxide semiconductor film 12 in order from the substrate 11. A channel protection film 19 is provided on the channel region 12C of the oxide semiconductor film 12. The high resistance film 15 covers the channel protection film 19 and the oxide semiconductor film 12. In other words, the gate electrode 14, the gate insulating film 13, the oxide semiconductor film 12, and the high resistance film 15 are provided in this order. Further, the transistor 10D includes the inter-layer insulating film 16 (inter-layer insulating films 16A and 16B) on the high resistance film 15. The source-drain electrodes 17A and 17B are electrically connected to the source-drain regions 12A and 12B of the oxide semiconductor film 12 through the connection holes H1 in the inter-layer insulating film 16. As described above, also in the transistor 10D of a bottom-gate type, it is possible to provide the source-drain regions 12A and 12B in the oxide semiconductor film 12, and thereby, to suppress occurrence of parasitic capacity between the gate electrode 14 and the source-drain electrodes 17A and 17B. Also, it is possible to stabilize electric characteristics of the transistor 10D by the high resistance film 15.

Figure 12A:
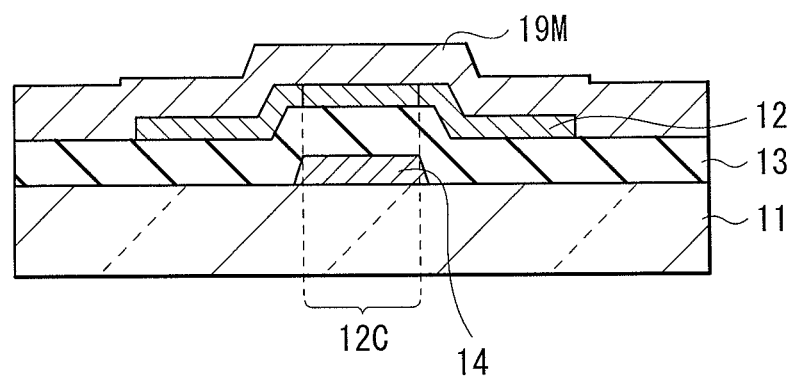
FIGS. 12A and 12B are cross-sectional views illustrating a method of manufacturing a transistor shown in FIG. 11 in process order.
Figure 12B:
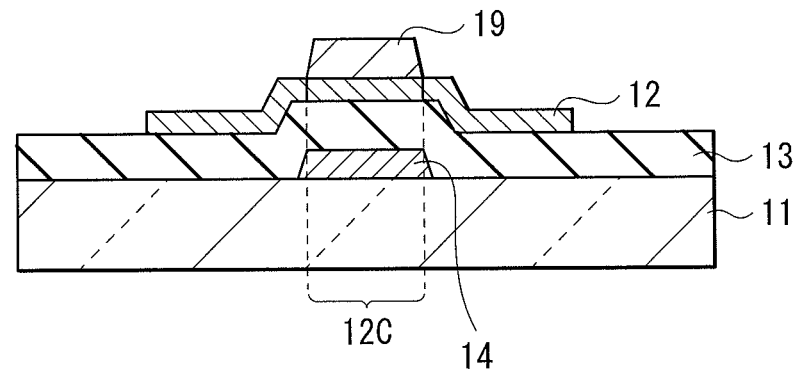
Figure 13A:
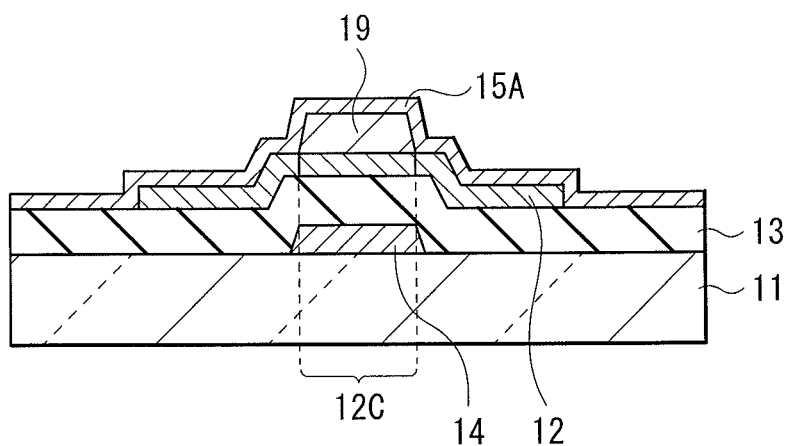
FIGS. 13A and 13B are cross-sectional views illustrating steps following the step shown in FIG. 12B.
Figure 13B:
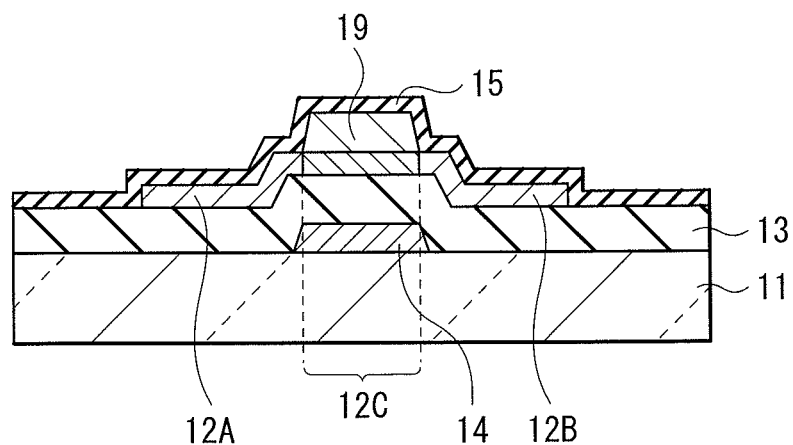

The transistor 10D may be manufactured as follows, for example. First, the gate electrode 14, the gate insulating film 13, and the oxide semiconductor film 12 are formed on the substrate 11 in this order. Thereafter, a protection material film 19M configured of a material configuring the channel protection film 19 is formed on the oxide semiconductor film 12 (FIG. 12A). The protection material film 19M may be formed of a material such as SiN, SiO, and AlO. Subsequently, as shown in FIG. 12B, the protection material film 19M is patterned by back exposure with use of the gate electrode 14 as a mask, and thereby, the channel protection film 19 is formed. Subsequently, the metal film 15A is formed on the channel protection film 19 and on the oxide semiconductor film 12 (FIG. 13A), and then, the laminate is annealed in a manner similar to that of the above-described embodiment. Thus, the metal film 15A becomes the high resistance film 15 and the source-drain regions 12A and 12B are formed in the oxide semiconductor film 12 (FIG. 13B). Subsequently, the inter-layer insulating film 16 and the source-drain electrodes 17A and 17B are formed on the high resistance film 15 in a manner similar to that of the above-described embodiment, and the transistor 10D is completed thereby.

[Second Embodiment]

Figure 14:
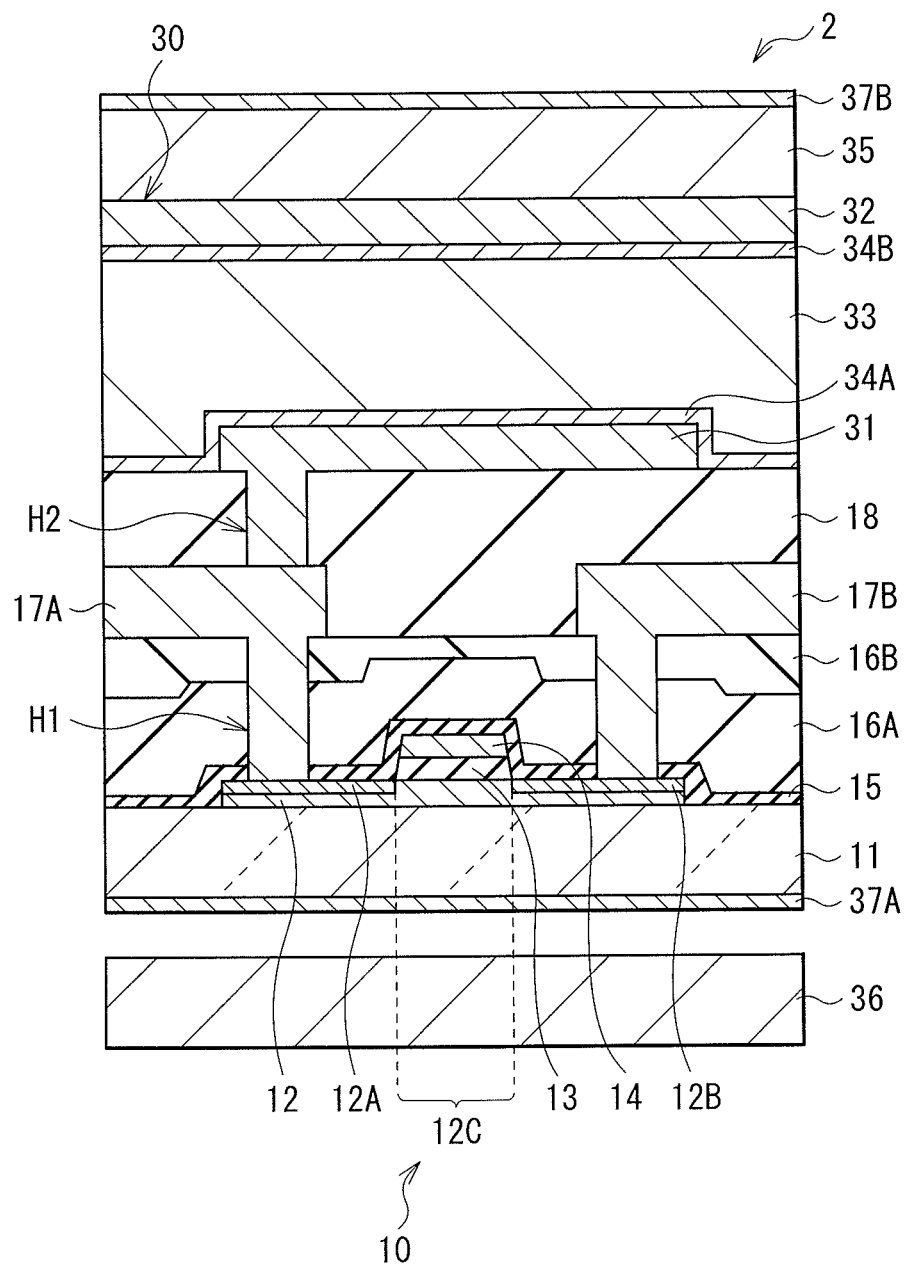
FIG. 14 is a cross-sectional view illustrating a configuration of a display unit according to a second embodiment of the present application.

FIG. 14 illustrates a cross-sectional configuration of a display unit (display unit 2) according to a second embodiment of the present application. The display unit 2 includes a liquid crystal display device 30 instead of the organic EL device 20 in the above-described first embodiment (display unit 1). Except for this point, the display unit 2 has a configuration similar to that of the display unit 1 of the above-described first embodiment and has functions and effects similar to those of the display unit 1 of the above-described first embodiment.

The display unit 2 includes the transistor 10 similar to that of the display unit 1. The liquid crystal display device 30 is provided above the transistor 10 with the planarization film 18 in between.

The liquid crystal display device 30 may include, for example, a liquid crystal layer 33 sealed between a pixel electrode 31 and a counter electrode 32. Alignment films 34A and 34B are provided on the respective surfaces on the liquid crystal layer 33 side of the pixel electrode 31 and the counter electrode 32. The pixel electrode 31 is provided for each pixel and may be electrically connected to the source-drain electrodes 17A and 17B of the transistor 10, for example. The counter electrode 32 is provided, on a counter substrate 35, as an electrode shared by a plurality of pixels and may be retained, for example, at a common potential. The liquid crystal layer 33 is configured of liquid crystal that is driven in a mode such as a vertical alignment (VA) mode, a twisted nematic (TN) mode, and an in-plane switching (IPS) mode.

Moreover, a backlight 36 is provided below the substrate 11. Polarizing plates 37A and 37B are attached on the backlight 36 side of the substrate 11 and on the counter substrate 35, respectively.

The backlight 36 is a light source that applies light toward the liquid crystal layer 33 and may include, for example, a plurality of light emitting diodes (LEDs), cold cathode fluorescent lamps (CCFLs), or the like. A backlight drive section which is not illustrated controls the backlight 36 to be turned on or off.

The polarizing plates (polarizers or analyzers) 37A and 37B may be arranged in a crossed-Nicols state, for example. This may allow illumination light from the backlight 36 to be shielded when a voltage is not applied (off state) or to be transmitted when a voltage is applied (on state), for example.

In the display unit 2, as in the display unit 1 of the above-described first embodiment, it is possible to suppress moisture intrusion into the oxide semiconductor film 12 by the inter-layer insulating films 16A and 16B. Accordingly, the TFT characteristics of the transistor 10 are improved also in the present embodiment.

[Third Embodiment]

Figure 15:
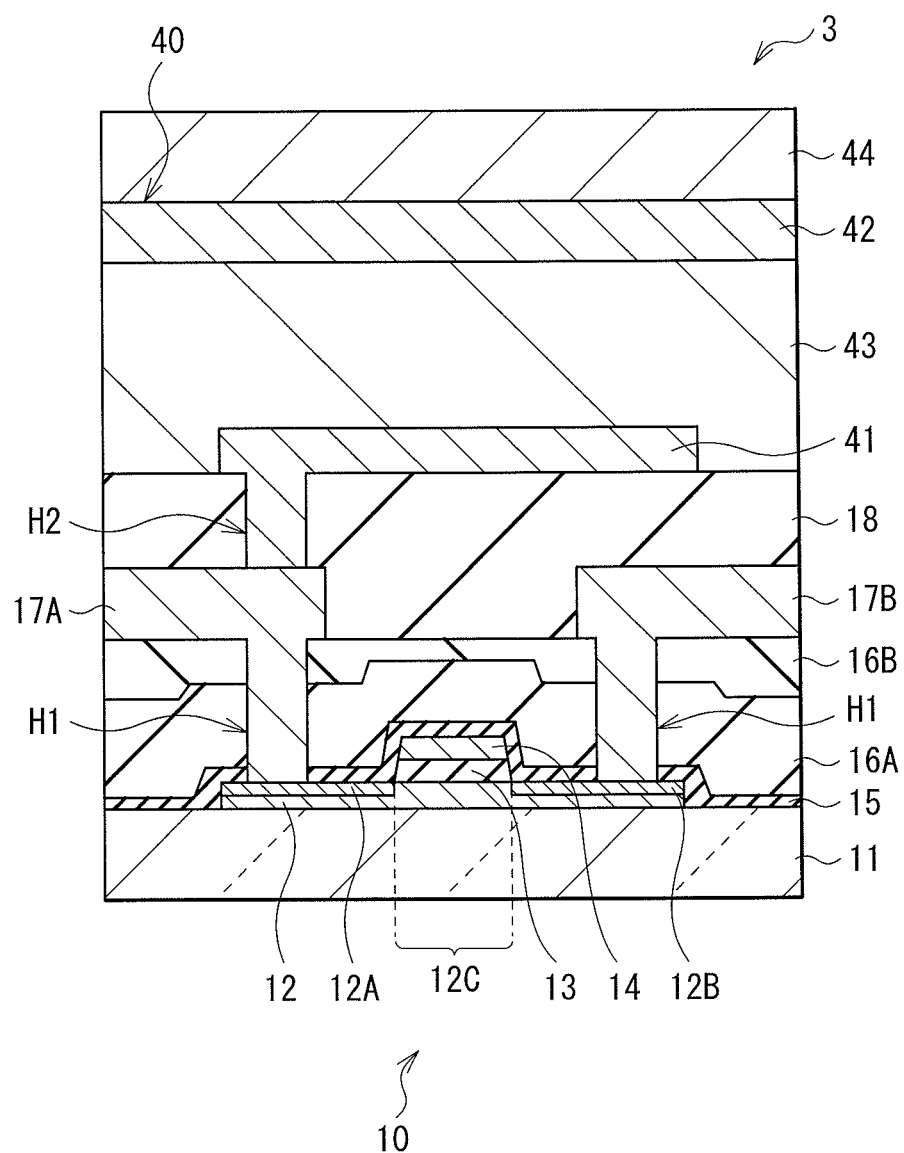
FIG. 15 is a cross-sectional view illustrating a configuration of a display unit according to a third embodiment of the present application.

FIG. 15 illustrates a cross-sectional configuration of a display unit (display unit 3) according to a third embodiment of the present application. The display unit 3 is a so-called electronic paper and has an electrophoretic display device 40 instead of the organic EL device 20 in the display unit 1. Except for this point, the display unit 3 has a configuration similar to that of the display unit 1 of the above-described first embodiment and has functions and effects similar to those of the display unit 1 of the above-described first embodiment.

The display unit 3 has the transistor 10 similar to that in the display unit 1. The electrophoretic display device 40 is provided above the transistor 10 with the planarization film 18 in between.

The electrophoretic display device 40 may include, for example, a display layer 43 that is configured of an electrophoretic material and is sealed between a pixel electrode 41 and a common electrode 42. The pixel electrode 41 is provided for each pixel and may be electrically connected to the source-drain electrodes 17A and 17B of the transistor 10, for example. The common electrode 42 is provided, on a counter substrate 44, as an electrode shared by a plurality of pixels.

In the display unit 3, as in the display unit 1 of the above-described first embodiment, it is possible to suppress moisture intrusion into the oxide semiconductor film 12 by the inter-layer insulating films 16A and 16B. Accordingly, the TFT characteristics of the transistor 10 are improved also in the present embodiment.

APPLICATION EXAMPLES

Hereinafter, description will be given of examples in which the above-described display units (display units 1, 1A, 1B, 1C, 1D, 2, and 3) are applied to electronic apparatuses. Examples of the electronic apparatus include televisions, digital cameras, notebook personal computers, personal digital assistants such as mobile phones, and video camcorders. In other words, the above-described display units are applicable to an electronic apparatus in any field that displays an externally-inputted or internally-generated image signal as an image or a moving picture.

[Module]

Figure 16:
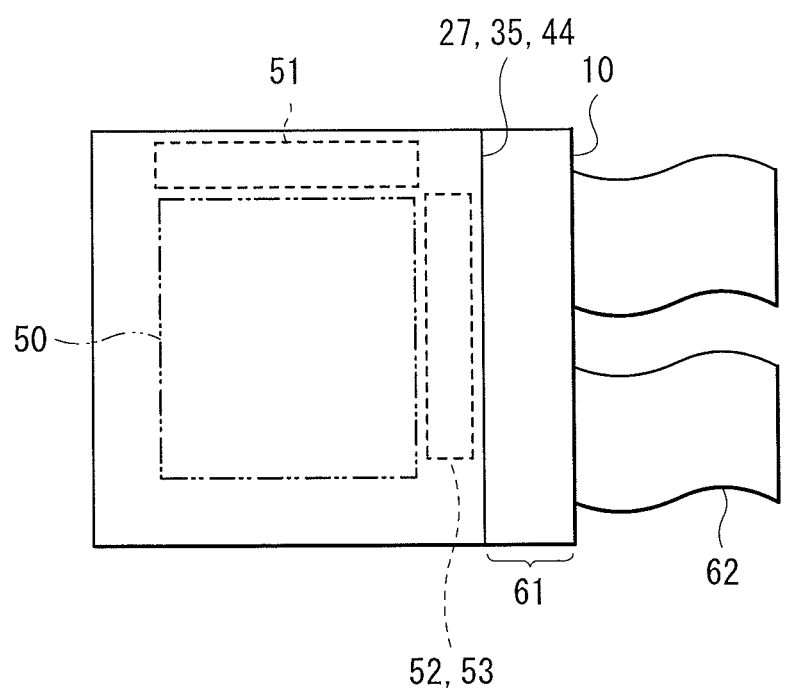

For example, the above-described display units may be assembled, as a module shown in FIG. 16, in various electronic apparatuses such as later-described Application Examples 1 to 7. The module may include, for example, a region 61 that is exposed from the sealing substrate 27 or from the counter substrate 35 or 44 on a side of the substrate 11. Wirings of the horizontal selector 51, the write scanner 52, and the electric power source scanner 53 are extended to form external connection terminals (not illustrated) on the exposed region 61. A flexible printed circuit (FPC) 62 for input and output of signals may be provided in the external connection terminals.

Application Example 1

Figure 17A:
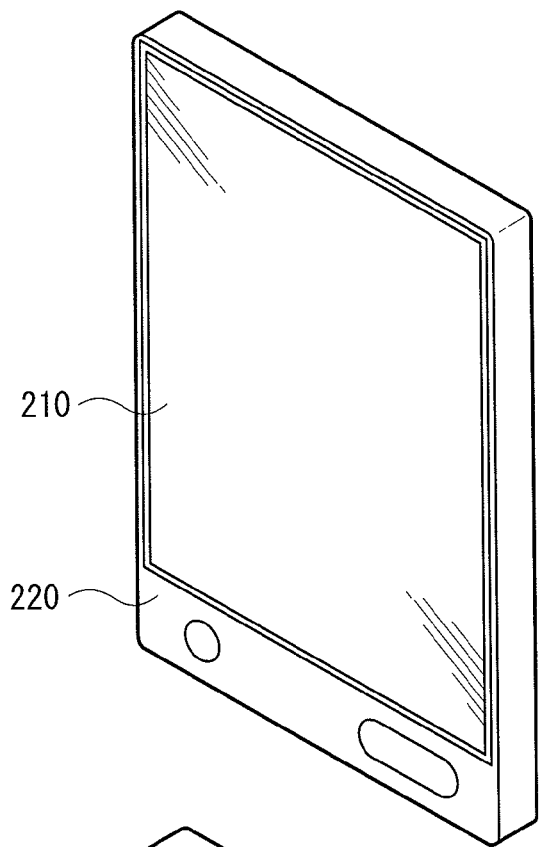
Figure 17B:
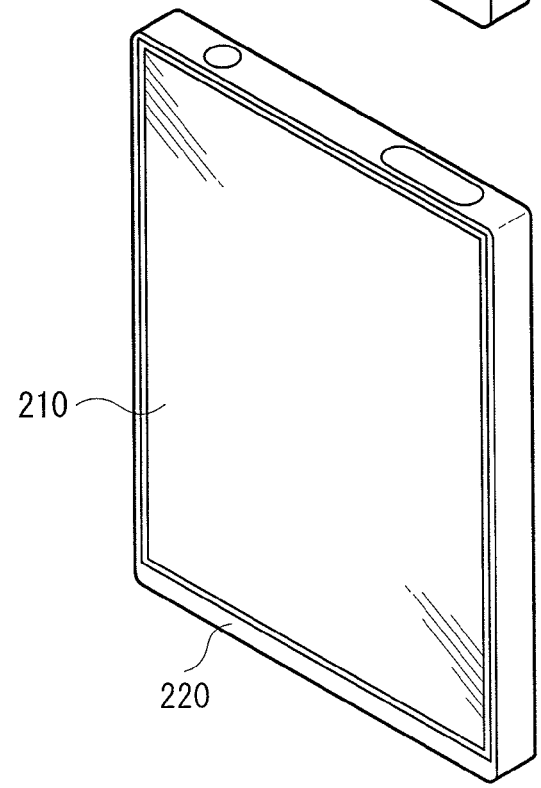

FIGS. 17A and 17B each illustrate an appearance of an electronic book to which any of the display units according to the above-described embodiments and the like is applied. The electronic book may include, for example, a display section 210 and a non-display section 220. The display section 210 is configured of one of the display units according to the above-described embodiments and the like.

Application Example 2

Figure 18:
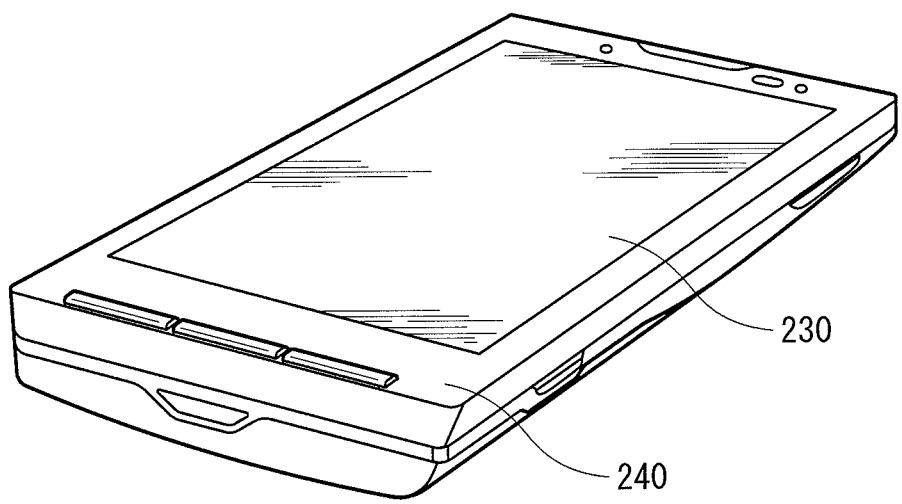
FIG. 18 is a perspective view illustrating an appearance of Application Example 2.

FIG. 18 illustrates an appearance of a smartphone to which any of the display units according to the above-described embodiments and the like is applied. The smartphone may include, for example, a display section 230 and a non-display section 240. The display section 230 is configured of one of the display units according to the above-described embodiments and the like.

Application Example 3

Figure 19:
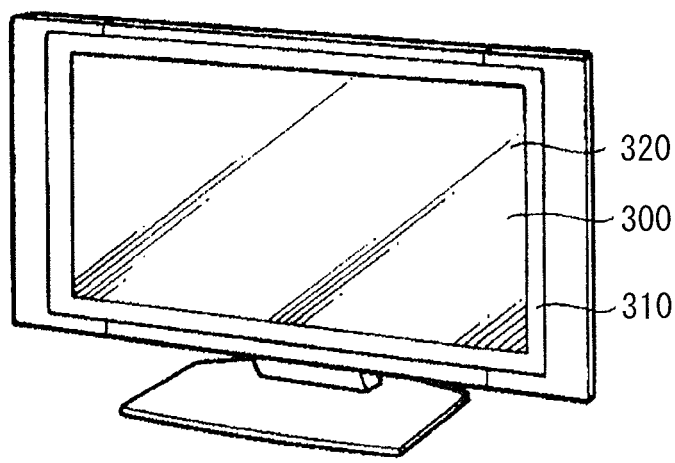
FIG. 19 is a perspective view illustrating an appearance of Application Example 3.

FIG. 19 illustrates an appearance of a television to which any of the display units according to the above-described embodiments and the like is applied. The television may include, for example, an image display screen section 300 that includes a front panel 310 and a filter glass 320. The image display screen section 300 is configured of one of the display units according to the above-described embodiments and the like.

Application Example 4

Figure 20A:
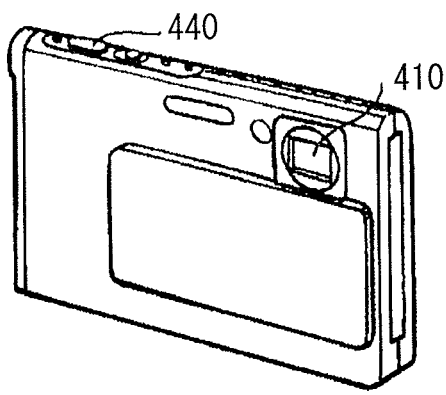
FIGS. 20A and 20B are perspective views each illustrating an appearance of Application Example 4 from the front and from the back, respectively.
Figure 20B:
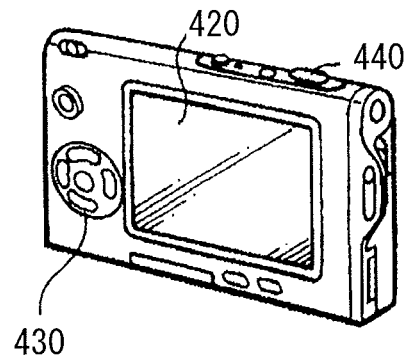

FIGS. 20A and 20B each illustrate an appearance of a digital camera to which any of the display units according to the above-described embodiments and the like is applied. The digital camera may include, for example, a light emitting section 410 for flash, a display section 420, a menu switch 430, and a shutter button 440. The display section 420 is configured of one of the display units according to the above-described embodiments and the like.

Application Example 5

Figure 21:
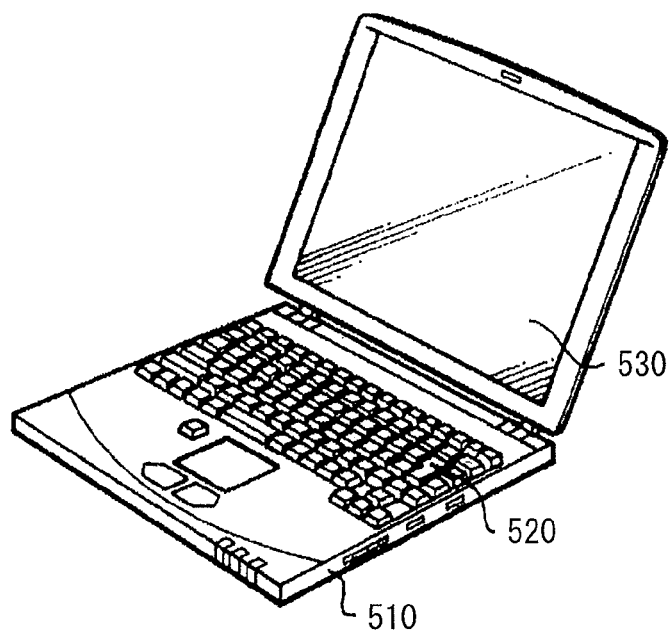
FIG. 21 is a perspective view illustrating an appearance of Application Example 5.

FIG. 21 illustrates an appearance of a notebook personal computer to which any of the display units according to the above-described embodiments and the like is applied. The notebook personal computer may include, for example, a main body 510, a keyboard 520 for operation of inputting characters etc., and a display section 530 that displays an image. The display section 530 is configured of one of the display units according to the above-described embodiments and the like.

Application Example 6

Figure 22:
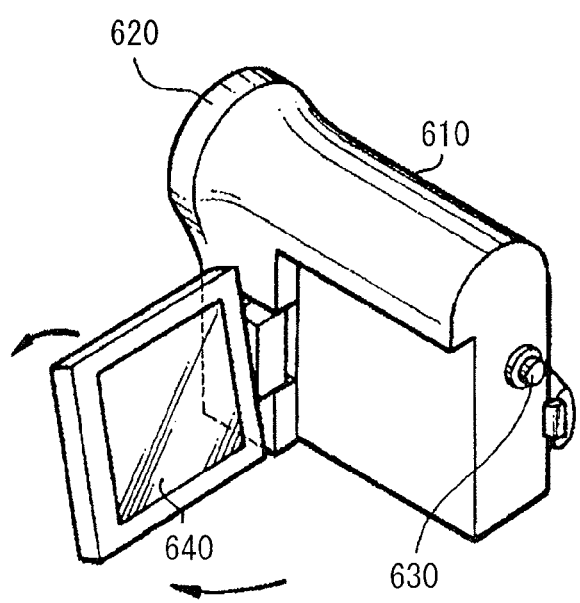
FIG. 22 is a perspective view illustrating an appearance of Application Example 6.
Figure 23:
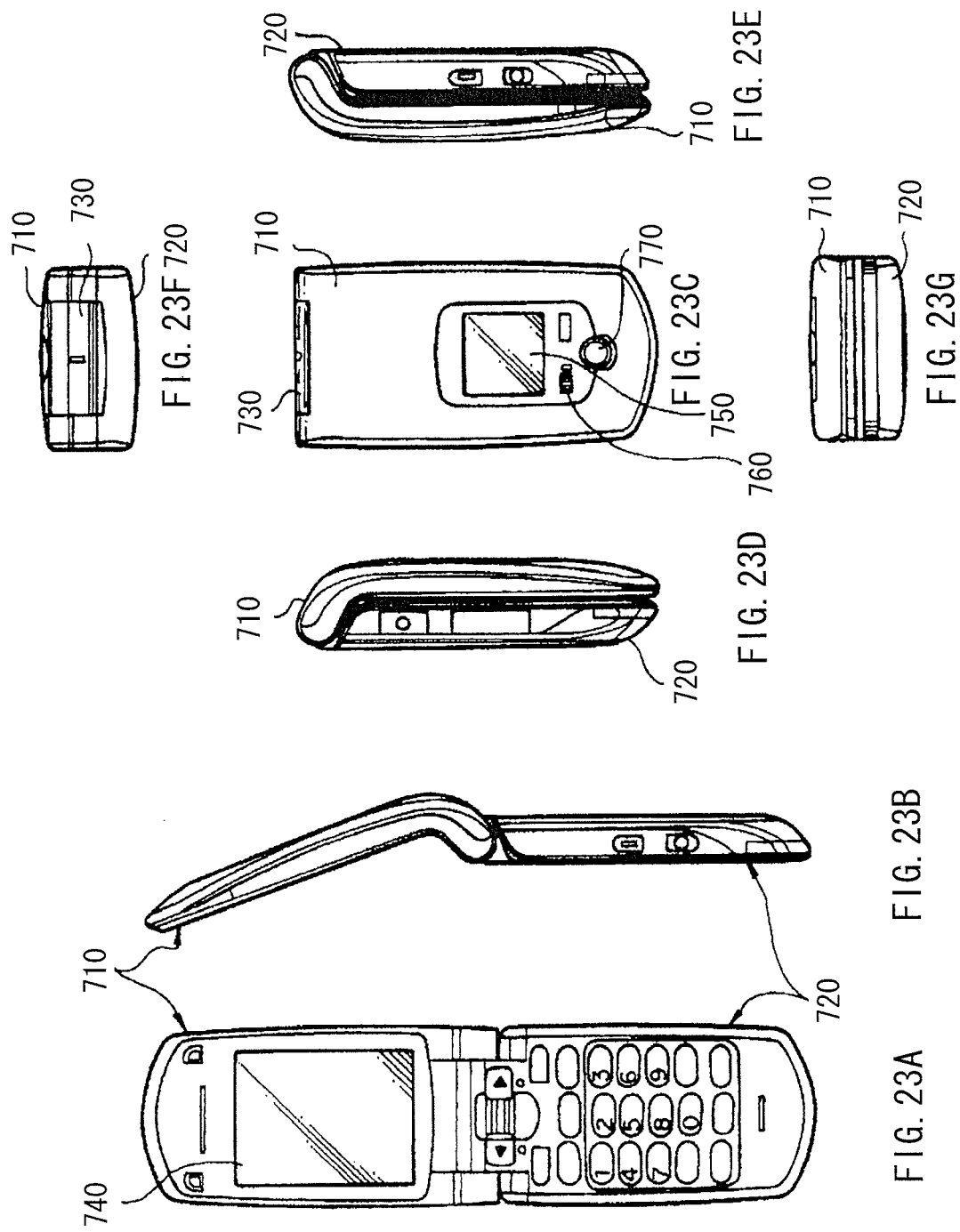
FIGS. 23A and 23B are a front view and a side view, respectively, of Application Example 7 in an opened state.
FIGS. 23C to 23G are a front view, a left side view, a right side view, a top view, and a bottom view, respectively, of Application Example 7 in a closed state.

FIG. 22 illustrates an appearance of a video camcorder to which any of the display units according to the above-described embodiments and the like is applied. The video camcorder may include, for example, a main body section 610, a lens 620 for shooting a subject provided on a front side face of the main body section 610, a start-stop switch 630 used upon shooting, and a display section 640. The display section 640 is configured of one of the display units according to the above-described embodiments and the like.

Application Example 7

FIGS. 23A to 23G each illustrate an appearance of a mobile phone to which any of the display units according to the above-described embodiments and the like is applied. The mobile phone may include, for example, a top housing 710 and a bottom housing 720 connected with a connection section (hinge section) 730, and may include a display 740, a sub-display 750, a picture light 760, and a camera 770. The display 740 and the sub-display 750 are each configured of one of the display units according to the above-described embodiments and the like.

EXAMPLES

Hereinafter, description will be given of specific examples of the preferred embodiments of the present application.

Examples 1-1 to 1-4

A transistor (transistor 100T) including an inter-layer insulating film (inter-layer insulating film 160) configured of only a single kind of resin material was fabricated and thermal decomposition temperature, water absorption rate, and water permeability of the inter-layer insulating film and reliability of the transistor were measured. Polysiloxane (Example 1-1), a low-polarity organic inorganic hybrid resin (Example 1-2), polyimide (Example 1-3), and an acrylic-resin (Example 1-4) were used as the inter-layer insulating film.

Water absorption rate was measured as follows. That is, a resin material of each inter-layer insulating film was formed on a glass substrate by spin coating, and then, pre-bake and post-bake were performed on the resin film under predetermined conditions. The resultant was put in a constant temperature layer of 90% RH at 60° C. for 100 hours, and then, the water absorption rate was measured. In detail, the resin material after being left in the constant temperature layer for 100 hours was curved out by 2.0 mg. This was used as a sample and thermogravimetry differential thermal analysis was performed thereon (with use of TG-DTA6300 available from Seiko Instruments Inc.). The thermogravimetry differential thermal analysis was performed under nitrogen ($N_2$) atmosphere. During the thermogravimetry differential thermal analysis, temperature was increased up to 100° C. with a temperature increase speed of 5° C./min and the temperature was maintained at 100° C. for 30 minutes. The water absorption rate was calculated assuming that all weight reduction at the time was caused by drying out of moisture.

The water permeability was measured as follows. That is, a film of IGZO was formed on a glass substrate, and then, a resin material of each inter-layer insulating film was spin-coated on the IGZO film. This was used for measuring the water permeability. Specifically, pre-bake and post-bake were performed on the laminate including IGZO and the resin material under predetermined conditions. The resultant was left in the constant temperature layer of 90% RH at 60° C. for 100 hours, and then, sheet resistance of the IGZO was measured with use of a non-contact resistance measurement instrument. Thus, the water permeability was measured. It is known that the resistance of IGZO is lowered when IGZO includes moisture. Therefore, the sheet resistance of IGZO after being left in the constant temperature layer was compared with sheet resistance of a reference (simple substance of IGZO immediately after a film thereof is formed). It was determined that the IGZO had high water permeability ("high") when a difference between the resistance values was by one digit or larger, and that the IGZO had low water permeability ("low") when the difference was smaller than by one digit (see later-described Table 1).

The reliability of the transistor was determined by performing+BT (bias-temperature) test under the conditions of Vg=10V and Vd=10V. The inter-layer insulating film was formed above the oxide semiconductor film by spin coating, and then, pre-bake and post-bake were performed thereon under predetermined conditions. The resultant was placed in a constant temperature layer of 90% RH at 60° for 100 hours and ΔVth thereof after 10000 seconds was measured. It was determined that the transistor had high reliability ("good") when the value of ΔVth was 1.0 V or smaller and that the transistor had low reliability ("poor") when the value was larger than 1.0 V (see later-described Table 1).

Examples 2-1 to 2-4

The transistor (transistor 10) with an inter-layer insulating film (inter-layer insulating film 16) of a laminate structure was fabricated and thermal decomposition temperature, water absorption rate, and water permeability of the inter-layer insulating film and reliability of the transistor were measured. An inter-layer insulating film including polysiloxane (lower layer) and polyimide (upper layer) in order from a substrate (substrate 11) was used in Example 2-1, an inter-layer insulating film including an organic inorganic hybrid resin same as that in Example 1-2 and polyimide in order from a substrate was used in Example 2-2, an inter-layer insulating film including polysiloxane and an acrylic-resin in order from a substrate was used in Example 2-3, and an inter-layer insulating film including an organic inorganic hybrid resin same as that in Example 1-2 and an acrylic resin in order from a substrate was used in Example 2-4. Water absorption rate, water permeability, and reliability of the transistor were measured by methods similar to those in the above-described Examples 1-1 to 1-4.

Results of the above-described Examples 1-1 to 1-4 and Examples 2-1 to 2-4 are shown in Table 1. The inter-layer insulating film of 2 μm thick was used in each of Examples 1-1 to 1-4 and Examples 2-1 to 2-4. The inter-layer insulating film with the lower and upper layers each being 1 μm thick was used in Examples 2-1 to 2-4.

TABLE 1

| Example | Inter-layer insulating film material | | Film thickness (μm) | Thermal decomposition temperature (° C.) | Water absorption rate | Water permeability (%) | Reliability |
|---|---|---|---|---|---|---|---|
| | Lower layer | Upper layer | | | | | |
| 1-1 | polysiloxane | | 2 | 425 | 0.22 | high | poor |
| 1-2 | organic inorganic hybrid resin | | | 369 | 0.05 | high | poor |
| 1-3 | polyimide | | | 384 | 1.2 | low | poor |
| 1-4 | acrylic resin | | | 309 | 0.68 | low | poor |
| 2-1 | polysiloxane | polyimide | | 380 | 1.1 | low | good |
| 2-2 | organic inorganic hybrid resin | polyimide | | 390 | 1.2 | low | good |
| 2-3 | polysiloxane | acrylic resin | | 321 | 0.37 | low | good |
| 2-4 | organic inorganic hybrid resin | acrylic resin | | 308 | 0.63 | low | good |

As can be seen from Table 1, high reliability was obtained in the transistor with the inter-layer insulating film of a laminate structure (Examples 2-1 to 2-4). Further, Example 2-1 in which polysiloxane and polyimide were used as the inter-layer insulating film was superior in terms of heat resistance and of cost. It is to be noted that there was no significant difference in water absorption rate between Examples 1-1 to 1-4 and Examples 2-1 to 2-4. One reason for this was that the water permeability that was measured was that at the time when the resin material absorbed the maximum amount of moisture and reached to the equilibrium state. In other words, one reason was that water absorption rate measured at this time was the saturated water absorption rate.

Hereinbefore, the present application has been described with reference to the preferred embodiments and the modifications. However, the present application is not limited thereto and may be variously modified. For example, a case where the inter-layer insulating film 16A (or the inter-layer insulating film 16D or the planarization film 18A) configured of the resin material with low polarity and the inter-layer insulating film 16B (or the planarization film 18 or 18B) configured of the resin material with higher polarity are provided in order from the high resistance film 15 was described in the above-described embodiments and the like. However, the inter-layer insulating film 16B may be provided closer to the high resistance film 15.

Moreover, a case where the source-drain regions 12A and 12B are provided in part of a portion adjacent to the channel region 12C from the surface (top face) thereof along the thickness direction was described in the above-described embodiment and the like. However, the source-drain regions 12A and 12B may be provided in all of the oxide semiconductor film 12 from the surface (top face) thereof along the thickness direction.

Moreover, the structure provided with the high resistance film 15 was described as an example in the above-described embodiments and the like. However, the high resistance film 15 may be removed after forming the source-drain regions 12A and 12B. However, it is preferable to leave the high resistance film 15 so as to stably retain the electric characteristics of the transistor 10.

In addition thereto, the material and the thickness of each layer, the film formation methods, and the film formation conditions that have been described in the above-described embodiments and the like are not limitative, and other materials, other thicknesses, other film formation methods, and other film formation conditions may be employed.

Moreover, the configurations of the organic EL device 20, of the liquid crystal display device 30, of the electrophoretic display device 40, and of the transistor 10 have been specifically described in the above embodiments and the like. However, it is not necessary to provide all of the layers and other layers may be further provided. For example, FIGS. 14 and 15 each illustrate the transistor 10 shown in FIG. 1. However, the liquid crystal display device 30 or the electrophoretic display device 40 may be formed on the transistors 10A, 10B, 10C, and 10D and the planarization films 18 and 18C shown in FIG. 8 (Modification 1), FIG. 9 (Modification 2), FIG. 10 (Modification 3), and FIG. 11 (Modification 4).

Moreover, the present application is applicable to a display unit that uses a display device such as an inorganic electroluminescence device other than the organic EL device 20, the liquid crystal display device 30, and the electrophoretic display device 40.

Moreover, for example, the configuration of the display unit was described with specific examples in the above embodiments and the like. However, it is not necessary to provide all of the components and other components may be further provided.

It is possible to achieve at least the following configurations from the above-described example embodiments and the modifications of the disclosure.

(1) A semiconductor device including:
a transistor including an oxide semiconductor film;
a first insulating film covering the oxide semiconductor film and including a first resin material; and
a second insulating film including a second resin material that has polarity different from polarity of the first resin material, the second insulating film being laminated on the first insulating film.

(2) The semiconductor device according to (1), wherein a source-drain electrode of the transistor is electrically connected to the oxide semiconductor film through a connection hole in the first insulating film and the second insulating film.

(3) The semiconductor device according to (1) or (2), wherein the oxide semiconductor film includes a channel region and a source-drain region that is adjacent to the channel region and has resistivity lower than resistivity of the channel region, and
the transistor includes a gate electrode facing the channel region.

(4) The semiconductor device according to any one of (1) to (3), wherein the polarity of the second resin material is higher than the polarity of the first resin material.

(5) The semiconductor device according to any one of (1) to (4), wherein
the first resin material has water absorption rate of 0.5 percent or lower, and
the second resin material has moisture vapor transmission rate of 100 g/m$^2$·day or lower.

(6) The semiconductor device according to any one of (1) to (5), wherein
the first resin material is one or more selected from a group consisting of polysiloxane, polyolefin-based resins, polyethylene-based resins, and polystyrene-based resins, and
the second resin material is one or more selected from a group consisting of polyimide, acrylic-based resins, novolac-based resins, phenol-based resins, polyester-based resins, epoxy-based resins, vinyl-chloride-based resins, and polybenzimidazole-based resins.

(7) The semiconductor device according to any one of (1) to (6), wherein
the first resin material is polysiloxane, and
the second resin material is polyimide.

(8) The semiconductor device according to (3), further including a high resistance film being in contact with the source-drain region.

(9) The semiconductor device according to any one of (1) to (8), further including a third insulating film laminated on the second insulating film, the third insulating film including a third resin material having polarity that is different from the polarity of the second resin material.

(10) The semiconductor device according to (9), wherein the source-drain electrode of the transistor is electrically connected to the oxide semiconductor film through a connection hole in the first insulating film, the second insulating film, and the third insulating film.

(11) The semiconductor device according to (9), wherein
the source-drain electrode of the transistor is electrically connected to the oxide semiconductor film through the connection hole in the first insulating film and the second insulating film,
a fourth insulating film including a fourth resin material that has polarity different from the polarity of the third resin material is laminated on the third insulating film, and
the third insulating film and the fourth insulating film cover the source-drain electrode.

(12) The semiconductor device according to (1), wherein
a source-drain electrode of the transistor is electrically connected to the oxide semiconductor film through the connection hole in the first insulating film, and
the second insulating film covers the source-drain electrode.

(13) The semiconductor device according to (8), wherein the oxide semiconductor film, the gate electrode, and the high resistance film are included in this order.

(14) The semiconductor device according to (8), wherein the gate electrode, the oxide semiconductor film, and the high resistance film are included in this order.

(15) A display unit including:
a display device;
a transistor driving the display device and including an oxide semiconductor film;
a first insulating film covering the oxide semiconductor film and including a first resin material; and
a second insulating film including a second resin material that has polarity different from polarity of the first resin material, the second insulating film being laminated on the first insulating film.

(16) The display unit according to (15), wherein the display device is an organic electroluminescence (EL) device.

(17) An electronic apparatus with a display unit, the display unit including:
a display device;
a transistor driving the display device and including an oxide semiconductor film;
a first insulating film covering the oxide semiconductor film and including a first resin material; and
a second insulating film including a second resin material that has polarity different from polarity of the first resin material, the second insulating film being laminated on the first insulating film.

[Fourth Embodiment]

Figure 24:
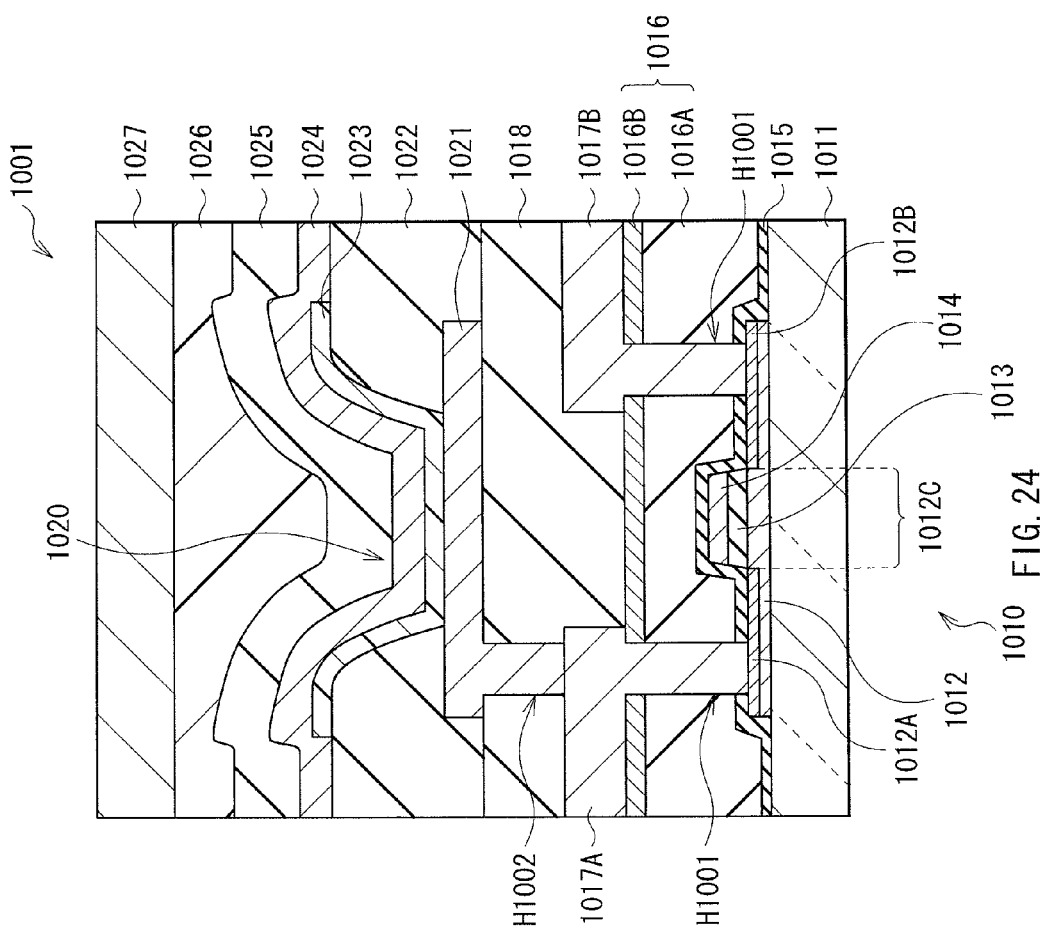
FIG. 24 is a cross-sectional view illustrating a configuration of a display unit according to a fourth embodiment of the present application.

FIG. 24 illustrates a cross-sectional configuration of a display unit 1001 (semiconductor device) according to a fourth embodiment of the present application. The display unit 1001 is an active-matrix type organic electroluminescence (EL) display unit. The display unit 1001 includes, on a substrate 1011, a plurality of pairs each including a transistor 1010 and an organic EL device 1020 driven by the transistor 1010. FIG. 24 illustrates a region (sub-pixel) corresponding to one pair of the transistor 1010 and the organic EL device 1020.

The transistor 1010 is a TFT of a staggered structure (top-gate type) that includes an oxide semiconductor film 1012, a gate insulating film 1013, and a gate electrode 1014 in this order on the substrate 1011. A high resistance film 1015 covers the oxide semiconductor film 1012 and the gate electrode 1014. In other words, the oxide semiconductor film 1012, the gate insulating film 1013, the gate electrode 1014, and the high resistance film 1015 are provided in this order.

An inter-layer insulating film 1016 is provided on the high resistance film 1015. The oxide semiconductor film 1012 is connected to source-drain electrodes 1017A and 1017B through connection holes H1001 that are provided in the inter-layer insulating film 1016 and the high resistance film 1015. A planarization film 1018 covers the source-drain electrodes 1017A and 1017B and the organic EL device 1020 is provided on the planarization film 1018.

[Transistor 1010]

The substrate 1011 may be configured, for example, of a plate of a material such as quartz, glass, silicon, and a resin (plastic) film. A low-cost resin film is allowed to be used since the oxide semiconductor film 1012 is formed without heating the substrate 1011 in later-described sputtering. Examples of the resin materials include PET (polyethylene terephthalate) and PEN (polyethylene naphthalate). A metal substrate made of metal such as stainless steel (SUS) may also be used depending on the purpose.

The oxide semiconductor film 1012 is provided in a selective region on the substrate 1011 and functions as an active layer of the transistor 1010. The oxide semiconductor film 1012 may include, as a main component, for example, an oxide of one or more elements of indium (In), gallium (Ga), zinc (Zn), and tin (Sn). Specifically, examples of an amorphous oxide include indium-tin-zinc oxide (ITZO) and indium-gallium-zinc oxide (IGZO: InGaZnO), and examples of a crystalline oxide include zinc oxide (ZnO), indium-zinc oxide (IZO (registered trademark)), indium-gallium oxide (IGO), indium-tin oxide (ITO), and indium oxide (InO). When a surface (surface in contact with the high resistance film 1015) of the oxide semiconductor film 1012 is crystallized, it is possible to improve etching selectivity between the oxide semiconductor film 1012 and the insulating film (insulating film 1013A in FIG. 27 which will be described later) upon forming the gate insulating film 1013 and to improve etching selectivity between the oxide semiconductor film 1012 and the high resistance film 1015 upon forming the connection holes H1001. In order to allow the surface of the oxide semiconductor film 1012 to be crystallized, the oxide semiconductor film 1012 may be configured of a crystalline oxide semiconductor material, or the oxide semiconductor film 1012 may be configured of a laminate including an amorphous oxide semiconductor material and a crystalline oxide semiconductor material formed thereon. It is preferable to use the amorphous oxide semiconductor material so as to suppress moisture diffusion into the oxide semiconductor film 1012. The oxide semiconductor film 1012 may have a thickness (thickness in a lamination direction, hereinafter, simply referred to as "thickness") of, for example, about 50 nm.

The oxide semiconductor film 1012 includes a channel region 1012C that faces the gate electrode 1014 thereabove. The oxide semiconductor film 1012 also includes a pair of regions (source-drain regions 1012A and 1012B) that have electric resistivity lower than that of the channel region 1012C. The source-drain regions 1012A and 1012B are provided in part of the oxide semiconductor film 12 from the surface (top face) thereof along a thickness direction. The source-drain regions 1012A and 1012B may be formed, for example by allowing metal such as aluminum (Al) to react with an oxide semiconductor material so as to diffuse the metal (dopant) into the oxide semiconductor material. In the transistor 1010, a self-aligned structure is achieved by the source-drain regions 1012A and 1012B, and high-quality images are displayed due to the following reasons.

A display unit of an active-drive type uses a TFT as a drive device, and retains, in a retention capacitor, an electric charge corresponding to a signal voltage for writing an image. However, when parasitic capacity occurred at an intersection region of the gate electrode and the source-drain electrode of the TFT increases, the signal voltage varies, which may cause degradation in image quality. In particular, in the organic EL display unit, yield in manufacturing may be decreased in accordance with this parasitic capacity issue. In the display unit 1001, it is possible to reduce the parasitic capacity by the source-drain regions 1012A and 1012B, and to improve image quality thereby.

The transistor 1010 with a self-aligned structure is applicable to larger screens, higher definition, and higher frame rate of displays. Further, the display unit 1001 with the transistor 1010 is allowed to adopt layout with small retention capacity. This allows less-defect and high-yield manufacturing of the display unit 1001 and improves reliability thereof. The source-drain regions 1012A and 1012B not only achieves the self-aligned structure as described above but also has a role of stabilizing characteristics of the transistor 1010.

For example, an insulating film (not illustrated) such as silicon oxide film, a silicon nitride film, and an aluminum oxide film may be provided between the substrate 1011 and the oxide semiconductor film 1012. Intrusion of moisture or other impurities from the substrate 1011 into the oxide semiconductor film 1012 is suppressed by this insulating film.

The gate electrode 1014 is provided on the channel region 1012C with the gate insulating film 1013 in between. The gate electrode 1014 and the gate insulating film 1013 have the same shape in a planer view. The gate insulating film 1013 may have a thickness of, for example, about 300 nm and may be configured of a single-layer film formed of one of a silicon oxide film (SiO), a silicon nitride film (SiN), a silicon nitride oxide film (SiON), and an aluminum oxide film (A10) or of a laminate film formed of two or more thereof. The gate insulating film 1013 is preferably formed of a material less likely to reduce the oxide semiconductor film 1012, for example, a film of silicon oxide or aluminum oxide.

The gate electrode 1014 controls carrier density in the oxide semiconductor film 1012 (channel region 1012C) with use of a gate voltage (Vg) applied to the transistor 1010. The gate electrode 1014 also functions as a wiring that supplies potentials. The gate electrode 1014 may be configured, for example, of a simple substance of one of molybdenum (Mo), titanium (Ti), aluminum, silver (Ag), neodymium (Nd), and copper (Cu), or of an alloy thereof. The gate electrode 1014 may have a laminate structure that includes a plurality of simple substances or alloys. The gate electrode 1014 is preferably configured of low resistance metal such as aluminum and copper. Alternatively, the gate electrode 1014 may be formed of a laminate that includes a layer (low resistance layer) of low resistance metal and a layer (barrier layer) of a material such as titanium and molybdenum formed thereon. Alternatively, an alloy that includes low resistance metal such as an alloy of aluminum and neodymium (Al—Nd) may be used. The gate electrode 1014 may be configured of a transparent conductive film such as a film of ITO. The gate electrode 1014 may have a thickness, for example, from 10 nm to 500 nm both inclusive.

The high resistance film 1015 on the gate electrode 1014 is in contact with the source-drain regions 1012A and 1012B of the oxide semiconductor film 1012. The high resistance film 1015 is a remained oxidized film (oxide film) of metal that is a supplier of metal to be diffused into the source-drain regions 1012A and 1012B in the manufacturing processes described later. The high resistance film 1015 may have a thickness, for example, of about 20 nm or less and may be configured of a material such as titanium oxide, aluminum oxide, indium oxide, and tin oxide, or may be configured of a laminate including two or more thereof. The high resistance film 1015 described above has not only a role in the above-described process but also a function to reduce influence of oxygen, moisture, etc. that changes characteristics of the oxide semiconductor film 1012, i.e., a barrier function. Therefore, provision of the high resistance film 1015 stabilizes electric characteristics of the transistor 1010 and further improves effects of the later-described inter-layer insulating film 1016.

In order to improve the barrier function, for example, a protection film (not illustrated) of aluminum oxide or titanium oxide with a thickness of about 10 nm to 50 nm both inclusive may be laminated on the high resistance film 1015. This further stabilizes the electric characteristics of the oxide semiconductor film 1012 in the transistor 1010 and improves reliability thereof.

The inter-layer insulating film 1016 covers the oxide semiconductor film 1012 with the high resistance film 1015 in between. In the present embodiment, the inter-layer insulating film 1016 includes a hydrophobic surface modification layer 1016B on a surface thereof (a surface on the source-drain electrodes 1017A and 1017B side or on the planarization film 1018 side thereof). This suppresses moisture intrusion from the atmosphere and from the layers above the inter-layer insulating film 1016 into the oxide semiconductor film 1012. A contact angle of the inter-layer insulating film 1016 including the hydrophobic surface modification layer 1016B may be, for example, 90° or larger.

The inter-layer insulating film 1016 includes a resin layer 1016A and the surface modification layer 1016B. The surface modification layer 1016B covers a surface of the resin layer 1016A. The resin layer 1016A may include, for example, a resin material such as polyimide, acrylic-based resins, novolac-based resins, phenol-based resins, polyester-based resins, epoxy-based resins, vinyl-chloride-based resins, polybenzimidazole-based resins, polysiloxane (silicone resin), polyolefin-based resins, polyethylene-based resins, and polystyrene-based resins. In particular, polyimide, acrylic-based resins, and polysiloxane are superior in terms of heat resistance and of cost. The resin layer 1016A may be formed of an organic inorganic hybrid resin.

The surface modification layer 1016B has hydrophobicity that is higher than hydrophobicity of the resin material included in the above-described resin layer 1016A, and may mainly include, for example, a modifier such as a so-called leveling agent. A modifier is added to the resin material included in the resin layer 1016A, and then, the modifier is separated from the resin material to form the surface modification layer 1016B, which will be described later. The modifier may be, for example, a material such as a silicone-based oligomer and a fluorine-containing oligomer with a molecular weight of about 5000 to 20000 both inclusive, preferably, of about 5000 to 10000 both inclusive. Specifically, examples of the silicone-based oligomer include BYK-350 (registered trademark), BYK-352 (registered trademark), BYK-354 (registered trademark), BYK-355 (registered trademark), BYK-356 (registered trademark), BYK-358N (registered trademark), BYK-361N (registered trademark), BYK-381 (registered trademark), BYK-382 (registered trademark), BYK-394 (registered trademark), BYK-3441 (registered trademark), BYK-3500 (registered trademark), BYK-3510 (registered trademark), BYK-3530 (registered trademark), BYK-3570 (registered trademark), BYK-3455 (registered trademark) (all available from BYK Japan KK), FM-0711, FM-0721, FM-0725, FM-7711, FM-7721, FM-7725 (all available from Chisso Corporation), SIU2400 (available from Miwon Specialty Chemical Co., Ltd.), X-22-2426, X-22-164E, X-22-174DX (all available from Shin-Etsu Chemical Co., Ltd.), RAD-2700, CN990, CN9800 (all available from Sartomer), EB350, and EB1360 (both available from Daicel Corporation). Examples of the fluorine-containing oligomer include F410, F444, EXP. TF2066, F477, F552, F553, F554, F555, F556, F557, F558, F559, F561, F562, R40, R41, RS-72-K, RS-75, RS-76-E, RS-76-NS, RS-77, EXP.TF-1540, EXP.TF-1760 (all available from DIC Corporation), OPTOOL-DAC-HP (registered trademark), OPTOOL-DSX (registered trademark) (both available from Daikin Industries, Ltd.), ZX-201, ZX-202, ZX-212, and ZX-214-A (all available from T&K TOKA Corporation). It is preferable to use the fluorine-containing oligomer as the modifier since hydrophobicity of the inter-layer insulating film 1016 is further improved thereby. It is preferable to use the fluorine-containing oligomer such as RS-72-K and F555 as the modifier in terms of compatibility when polyimide is used as the resin material of the resin layer 1016A. When the acrylic-based resin is used as the resin material, for example, a fluorine-containing oligomer such as RS-72-K may be used as the modifier, or, for example, the silicone-based oligomer such as FM-7725 and EB350 may be used as the modifier. These modifiers are preferable in terms of compatibility and in a point that these modifiers each include a functional group that reacts with acrylic-based resins described later. It is preferable to use the fluorine-containing oligomer when the resin material is a photosensitive resin since alkaline development is necessary upon forming the inter-layer insulating film 1016.

The above-described modifier preferably includes a functional group for reacting with the resin material included in the resin layer 1016A and part or all of the modifier is preferably coupled with the resin material. Due to coupling of the modifier to the resin material, the surface modification layer 1016B is fixed to the resin layer 1016A and is less likely to be peeled off. Therefore, it is possible to stably maintain hydrophobicity of the inter-layer insulating film 1016, for example, also during the manufacturing processes and under environment tests. Examples of such a functional group that reacts with the resin material include an acryloyl group ($H_2C=CH-C(=O)-$), a methacryl group ($H_2C=C(CH_3)-C(=O)-$), a vinyl group, an epoxy group, an amino group, a hydroxyl group, a phenol group, a carboxyl group, and a mercapto group.

In the inter-layer insulating film 1016, it is preferable that the above-described modifier is included by 0.01 mass % to 10 mass % both inclusive, more preferably, 0.05 mass % to 5 mass % both inclusive, with respect to the resin material. Further, it is preferable to select a modifier that has low compatibility with the resin material. The resin layer 1016A may include a small amount of the modifier and the surface modification layer 1016B may include a small amount of the resin material. However, when a large amount of the modifier exists in the resin layer 1016A, the modifier influences physical properties of the resin layer 1016A, which may lead to decrease, for example, in heat resistance of the resin layer 1016A. On the other hand, when the amount of the modifier included in the inter-layer insulating film 1016 is excessively small, the resin layer 1016A may not be sufficiently covered, which leads to decrease in hydrophobicity. In other words, it is preferable that concentration of the modifier included in an inner part of the inter-layer insulating film 1016 (resin layer 1016A) be lower than concentration of the modifier included in the surface modification layer 1016B and little modifier exist in the resin layer 1016A.

The surface modification layer 1016B preferably has flatness (smoothness) higher than that of the resin material included in the resin layer 1016A. One reason for this is that the flat inter-layer insulating film 1016 provides uniform TFT characteristics in a plane of the substrate 1011 and provides uniform image quality.

Moreover, the inter-layer insulating film 1016 including the resin material is allowed to be easily thickened, for example, up to about 2 μm. The thickened inter-layer insulating film 1016 may, for example, sufficiently cover a level difference between components such as the gate insulating film 1013 and the gate electrode 1014, thereby securing insulation between electrodes. Therefore, short circuits resulting from the level difference etc. are suppressed. Moreover, the inter-layer insulating film 1016 including the resin material reduces wiring capacity resulting from metal wiring and allows the display unit 1001 to have larger size and higher frame rate.

The pair of source-drain electrodes 1017A and 1017B are patterned on the inter-layer insulating film 1016 and are connected to the source-drain regions 1012A and 1012B of the oxide semiconductor film 1012 through the connection holes H1001 that run through the inter-layer insulating film 1016 and the high resistance film 1015. The source-drain electrodes 1017A and 1017B are preferably provided avoiding a region immediately above the gate electrode 1014 so as to suppress formation of parasitic capacity in intersection regions of the gate electrode 1014 and the source-drain electrodes 1017A and 1017B. The source-drain electrodes 1017A and 1017B each have a thickness of, for example, about 200 nm and are each formed of a material similar to metal and transparent conductive film mentioned above for the gate electrode 1014. It is preferable that the source-drain electrodes 1017A and 1017B each be configured of a laminate film including a low resistance layer and a barrier layer. Driving with less wiring delay is achievable by configuring the source-drain electrodes 1017A and 1017B of the above-described laminate film.

[Organic EL device 1020]

The organic EL device 1020 is provided on the planarization film 1018. The organic EL device 1020 includes a first electrode 1021, a pixel separation film 1022, an organic layer 1023, and a second electrode 1024 in order from the planarization film 1018 and is sealed by a protection layer 1025. A sealing substrate 1027 is attached on the protection layer 1025 with an adhesion layer 1026 formed of a thermoset resin or an ultraviolet-curable resin in between. The display unit 1001 may be of a bottom emission type that extracts light generated in the organic layer 1023 from the substrate 1011, or may be of a top emission type that extracts the light from the sealing substrate 1027.

Figure 25:
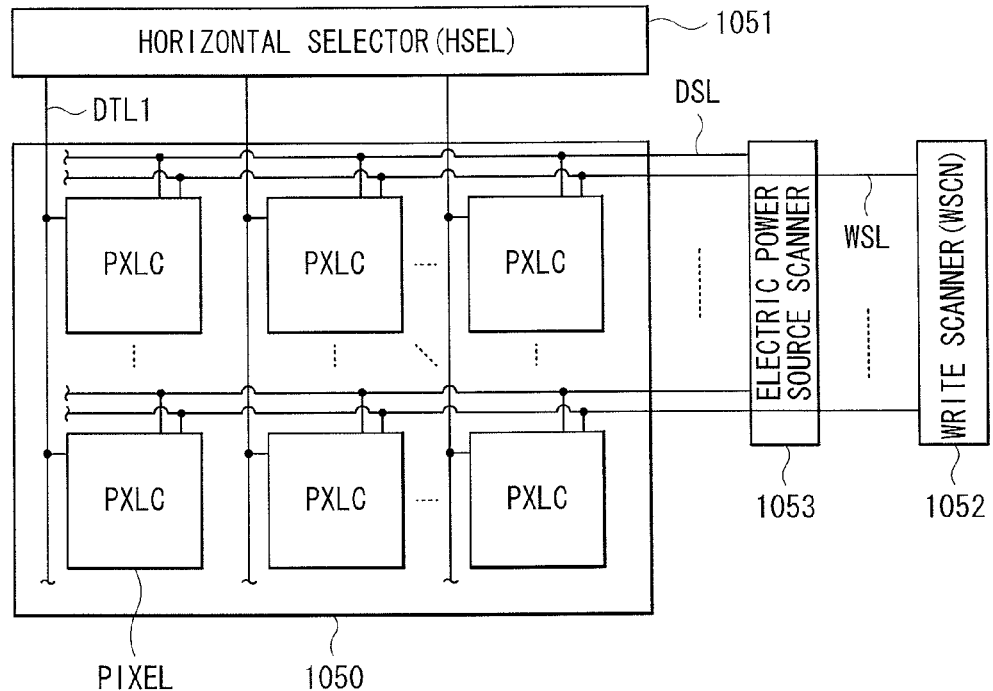
FIG. 25 is a diagram illustrating a general configuration including peripheral circuits of the display unit shown in FIG. 24.

The planarization film 1018 is provided on the source-drain electrodes 1017A and 1017B and on the inter-layer insulating film 1016, in an entire display region (later-described display region 1050 in FIG. 25) of the substrate 1011. The planarization film 1018 has a connection hole H1002. The connection hole H1002 connects the source-drain electrodes 1017A and 1017B of the transistor 1010 to the first electrode 1021 of the organic EL device 1020. The planarization film 1018 may be formed of a resin material similar to that of the inter-layer insulating film 1016 described above.

The first electrode 1021 is provided on the planarization film 1018 so as to fill the connection hole H1002. The first electrode 1021 may function, for example, as an anode and is provided for each device. In the display unit 1001 of the bottom emission type, the first electrode 1021 may be formed of a transparent conductive film, for example, a single-layer film of one of materials such as indium-tin oxide (ITO), indium-zinc oxide (IZO), and indium-zinc oxide (InZnO), or a laminate film of two or more thereof. On the other hand, in the display unit 1001 of the top emission type, the first electrode 1021 may be formed of reflective metal, for example, a single-layer film made of simple substance metal of one of aluminum, magnesium (Mg), calcium (Ca), and sodium (Na) or an alloy including one or more thereof, or a multi-layered film including lamination of simple substance metal or alloys.

The pixel separation film 1022 secures insulation between the first electrode 1021 and the second electrode 1024 and partitions light emitting regions of the respective devices. The pixel separation film 1022 has an aperture that faces the light emitting region of each device. The pixel separation film 1022 may be configured of, for example, a photosensitive resin such as polyimide, an acrylic resin, and novolac-based resins.

The organic layer 1023 covers the aperture of the pixel separation film 1022. The organic layer 1023 includes an organic electroluminescence layer (organic EL layer) and emits light in response to drive current application. The organic layer 1023 may include, for example, a hole injection layer, a hole transport layer, the organic EL layer, and an electron transport layer in order from the substrate 1011 (first electrode 1021) and emits light resulting from recombination of electrons and holes in the organic EL layer. A material configuring the organic EL layer is not particularly limited as long as the material is any typical low-molecular or high-molecular organic material. For example, organic EL layers emitting red, green, or blue light may be provided for respective devices to exhibit different colors. Alternatively, an organic EL layer emitting white light (for example, a laminate of red, green, and blue organic EL layers) may be provided over the entire surface of the substrate 1011. The hole injection layer increases hole injection efficiency and suppresses current leakage. The hole transport layer increases efficiency of hole transport to the organic EL layer. Layers other than the organic EL layer such as the hole injection layer, the hole transport layer, and the electron transport layer may be provided as necessary.

The second electrode 1024 may function, for example, as a cathode and may be configured of a metal conductive film. In the display unit 1001 of the bottom emission type, the second electrode 1024 may be formed of reflective metal, for example, a single-layer film made of simple substance metal of one of aluminum, magnesium (Mg), calcium (Ca), and sodium (Na) or an alloy including one or more thereof, or a multi-layered film including lamination of simple substance metal or alloys. On the other hand, in the display unit 1001 of the top emission type, the second electrode 1024 may be formed of a transparent conductive film made of a material such as ITO and IZO. The second electrode 1024 is insulated from the first electrode 1021 and may be shared by the devices, for example.

The protection layer 1025 may be configured of either of an insulating material or an electrically-conductive material. Examples of the insulating material include amorphous silicon (a-Si), amorphous carbonized silicon (a-SiC), amorphous silicon nitride (a-$Si_{(1-x)}N_x$), and amorphous carbon (a-C).

The sealing substrate 1027 is so arranged as to face the substrate 1011 with the transistor 1010 and the organic EL device 1020 in between. The sealing substrate 1027 may be formed of a material similar to that of the substrate 1011 described above. In the display unit 1001 of the top emission type, the sealing substrate 1027 is formed of a transparent material and components such as a color filter and a light shielding film may be provided on the sealing substrate 1027 side. In the display unit 1001 of the bottom emission type, the substrate 1011 is configured of a transparent material and components such as a color filter and a light shielding film may be provided on the substrate 1011 side.

[Configurations of Peripheral Circuits and Pixel Circuit]

Figure 26:
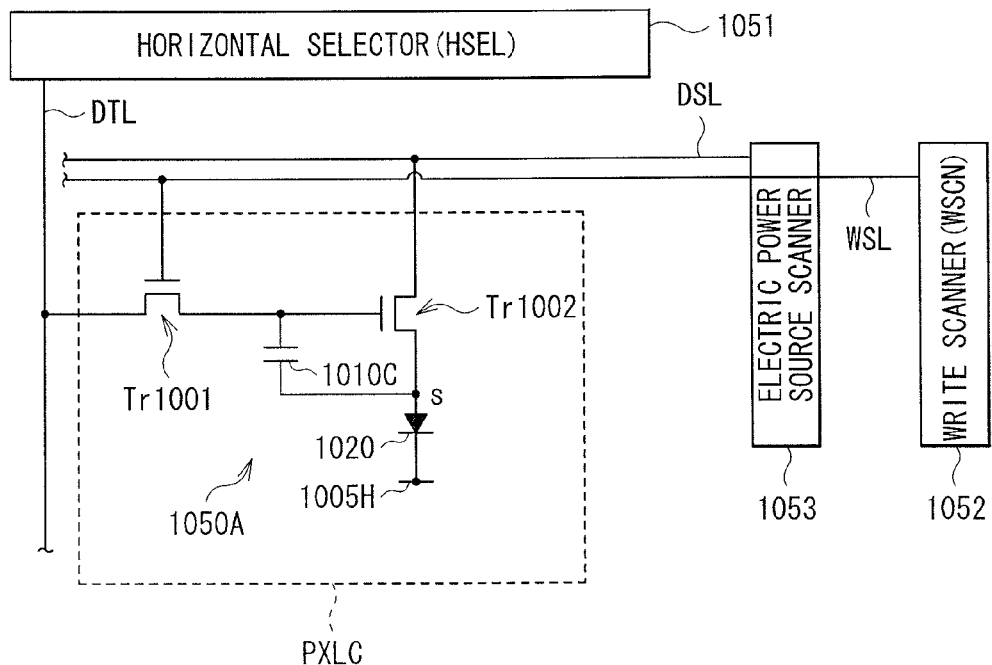
FIG. 26 is a diagram illustrating a circuit configuration of a pixel shown in FIG. 25.

As shown in FIG. 26, the display unit 1001 includes a plurality of pixels PXLC that each include the above-described organic EL device 1020. The pixels PXLC may be arranged, for example, in matrix, in the display region 1050 on the substrate 1011. A horizontal selector (HSEL) 1051, a write scanner (WSCN) 1052, and an electric power source scanner 1053 that function as a signal line drive circuit, a scanning line drive circuit, and a power source line scanning circuit, respectively, are provided around the display region 1050.

In the display region 1050, a plurality of (n-number of) signal lines DTL1 to DTLn are arranged in a column direction and a plurality of (m-number of) scanning lines WSL1 to WSLm are arranged in a row direction. The pixel PXLC (one of pixels corresponding to R, G, and B) is provided at each intersection of the signal line DTL and the scanning line DSL. Each signal line DTL is electrically connected to the horizontal selector 1051. The horizontal selector 1051 supplies an image signal to each pixel PXLC through the signal line DTL. On the other hand, each scanning line WSL is electrically connected to the write scanner 1052. The write scanner 1052 supplies a scanning signal (selection pulse) to each pixel PXLC through the scanning line WSL. Each electric power source line DSL is connected to the electric power source scanner 1053. The electric power scanner 1053 supplies an electric power source signal (control pulse) to each PXLC through the electric power source line DSL.

FIG. 26 illustrates a specific circuit configuration example in the pixel PXLC. Each pixel PXLC includes a pixel circuit 1050A that includes the organic EL device 1020. The pixel circuit 1050A is an active drive circuit that includes a sampling transistor Tr1001, a driving transistor Tr1002, a retention capacitor (retention capacitor 1010C), and the organic EL device 1020. It is to be noted that one or both of the sampling transistor Tr1001 and the driving transistor Tr1002 correspond to the above-described transistor 1010.

A gate of the sampling transistor Tr1001 is connected to the scanning line WSL corresponding thereto. One of a source and a drain of the sampling transistor Tr1001 is connected to the signal line DTL corresponding thereto and the other thereof is connected to a gate of the driving transistor Tr1002. A drain of the driving transistor Tr1002 is connected to the electric power source line DSL corresponding thereto and a source of the driving transistor Tr1002 is connected to the anode of the organic EL device 1020. Further, the cathode of the organic EL device 1020 is connected to a ground wiring 1005H. It is to be noted that the ground wiring 1005H is shared by all of the pixels PXLC. The retention capacitor 1010C is arranged between the source and the gate of the driving transistor Tr1002.

The sampling transistor Tr1001 becomes conductive in response to the scanning signal (selection pulse) supplied from the scanning line WSL, and thereby sampling a signal potential of an image signal supplied from the signal line DTL and holding the signal potential in the retention capacitor 1010C. The driving transistor Tr1002 receives a current supplied from the electric power source line DSL set at a predetermined first potential (not illustrated), and supplies a drive current to the organic EL device 1020 in accordance with the signal potential retained in the retention capacitor 1010C. The organic EL device 1020 emits light with luminance in accordance with the signal potential of the image signal, in response to the drive current supplied from the driving transistor Tr1002.

In the above-described circuit configuration, the sampling transistor Tr1001 becomes conductive in response to the scanning signal (selection pulse) supplied from the scanning line WSL, and the signal potential of the image signal supplied from the signal line DTL is thereby sampled and retained in the retention capacitor 1010C. Further, the electric power source line DSL set at the above-described first electric potential supplies a current to the driving transistor Tr1002 and the driving transistor Tr1002 supplies the drive current to the organic EL device 1020 (each of the organic EL devices of red, green, and blue) in response to the signal potential retained by the retention capacitor 1010C. Each organic EL device 1020 emits light with luminance in accordance with the signal potential of the image signal in response to the supplied drive current. Thus, the display unit 1001 displays an image based on the image signal.

The display unit 1001 may be manufactured as follows, for example.

[Step of Forming Transistor 1010]

First, as shown in FIG. 27A, the oxide semiconductor film 1012 made of the above-described material is formed on the substrate 1011. Specifically, an oxide semiconductor material film (not illustrated) is formed on an entire surface of the substrate 1011, for example, to a thickness of about 50 nm by a method such as sputtering. A ceramic with a composition same as that of the oxide semiconductor to be formed in a film is used as a target upon this sputtering. Further, partial pressure of oxygen is so controlled as to obtain preferable transistor characteristics since carrier density in the oxide semiconductor largely depends on the partial pressure of oxygen upon sputtering. At this time, it is possible to improve etching selectivity upon etching of the insulating film 1013A (see later-described FIG. 27B) and the high resistance film 1015 by using the crystalline oxide semiconductor material as described above. Subsequently, the formed oxide semiconductor material film is patterned in a predetermined shape, for example, by photolithography and etching. At that time, it is preferable to process the formed oxide semiconductor material film by wet etching with use of mixture of phosphoric acid, nitric acid, and acetic acid. The mixture of phosphoric acid, nitric acid, and acetic acid allows selection ratio with an underlayer to be sufficiently large and allows relatively-easy process.

Subsequently, as shown in FIG. 27B, for example, the insulating film 1013A made of a silicon oxide film with a thickness of 300 nm and a conductive film 1014A made of molybdenum with a thickness of 200 nm are formed in this order on the oxide semiconductor 1012 so as to cover the entire surface above the substrate 1011. The insulating film 1013A may be formed, for example, by a plasma chemical vapor deposition (CVD) method. Alternatively, the insulating film 1013A made of a silicon oxide film may be formed by reactive sputtering other than the plasma CVD method. Atomic layer deposition may be used in addition to the above-described reactive sputtering and CVD method when the insulating film 1013A is formed of an aluminum oxide film. The conductive film 1014A may be formed, for example, by sputtering.

After forming the conductive film 1014A, the conductive film 1014A may be patterned, for example, by photolithography and etching to form the gate electrode 1014 in a selective region on the oxide semiconductor film 1012. Subsequently, the insulating film 1013A is etched with use of the gate electrode 1014 as a mask. Thus, the gate insulating film 1013 is pattered in a shape substantially the same as that of the gate electrode 1014 in a planar view (FIG. 27C). When the surface of the oxide semiconductor film 1012 is crystallized, the process is easily performed with maintaining an extremely large etching selection ratio by using chemical such as hydrofluoric acid in this etching step.

Figure 28A:
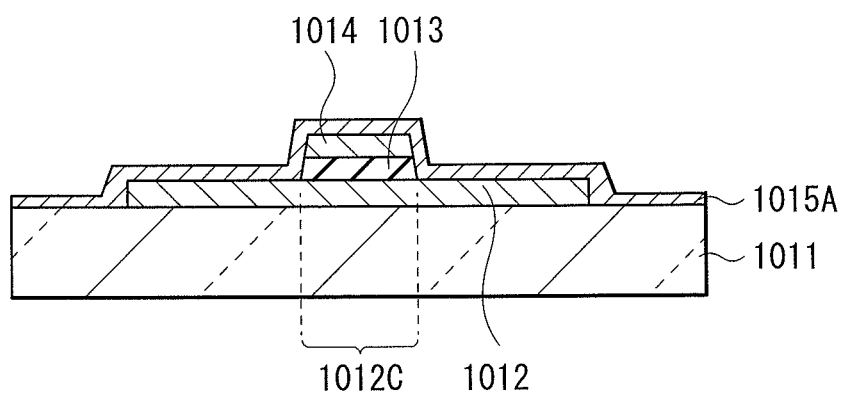
FIGS. 28A and 28B are cross-sectional views illustrating steps following a step shown in FIG. 27C.

Subsequently, as shown in FIG. 28A, a metal film 1015A made of metal such as titanium, aluminum, tin, and indium is formed with a thickness from 5 nm to 10 nm both inclusive on the entire surface over the substrate 1011, for example, by sputtering or by atomic layer deposition. The metal film 1015A is configured of metal that reacts with oxygen at relatively-low temperature and is brought into contact with a region adjacent to the channel region 1012C of the oxide semiconductor film 1012. After forming the metal film 1015A, for example, a protection film (not illustrated) made of titanium oxide or aluminum oxide with a thickness of about 50 nm may be formed by sputtering or by atomic layer deposition.

Figure 28B:
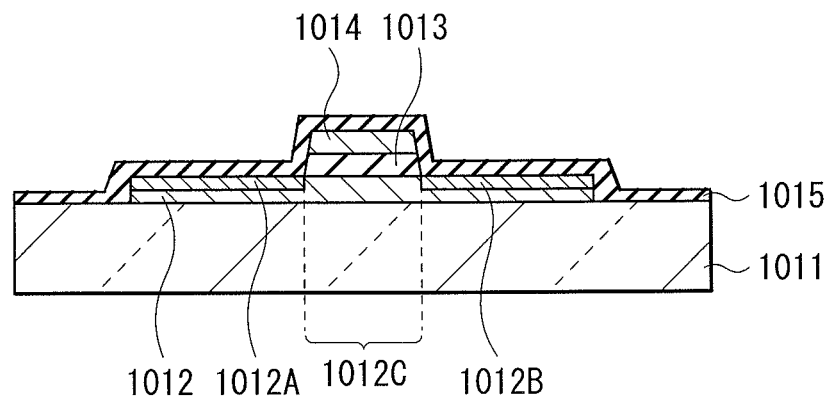

Subsequently, as shown in FIG. 28B, the metal film 1015A is oxidized, for example, by annealing at about 300° C., and the high resistance film 1015 is formed thereby. At this time, the source-drain regions 1012A and 1012B are formed in part of the high resistance film 1015 side of the oxide semiconductor film 1012 along the thickness direction, in a portion, of the oxide semiconductor film 1012, that is in contact with the high resistance film, i.e., in a position adjacent to the channel region 1012C. An oxidization reaction of the metal film 1015A utilizes part of oxygen included in the oxide semiconductor film 1012. Therefore, in the oxide semiconductor film 1012, oxygen concentration decreases from the surface (top face) in contact with the metal film 1015A as the oxidation of the metal film 1015A proceeds. On the other hand, metal such as aluminum is diffused into the oxide semiconductor film 1012 from the metal film 1015A. This metal element functions as a dopant and lowers resistance in a region on the top face side of the oxide semiconductor film 1012 that is in contact with the metal film 1015A. Thus, the source-drain regions 1012A and 1012B that have electric resistance lower than that of the channel region 1012C are formed.

Upon annealing the metal film 1015A, it is preferable to anneal the metal film 1015A under oxidizing gas atmosphere including oxygen etc. One reason is that this suppresses excessive decrease in oxygen concentration in the source-drain regions 1012A and 1012B and allows the oxide semiconductor film 1012 to be supplied with sufficient amount of oxygen. This allows reduction in later annealing steps, which results in process simplification.

The high resistance film 1015 may be formed, for example, by setting temperature of the substrate 1011 to be relatively high when the metal film 1015A is formed on the substrate 1011, instead of the above-described annealing step. For example, in the step shown in FIG. 28A, when the metal film 1015A is formed while retaining the temperature of the substrate 1011 at about 200° C., resistance in a predetermined region in the oxide semiconductor film 1012 is lowered without annealing. Thus, it is possible to lower the carrier concentration in the oxide semiconductor film 1012 to a level necessary for a transistor.

The metal film 1015A is preferably formed with a thickness of 10 nm or less as described above. One reason is that the metal film 1015A is completely oxidized (the high resistance film 1015 is formed) by annealing under oxygen atmosphere when the metal film 1015A has a thickness of 10 nm or less. Further, oxidation is preceded by oxygen plasma when a protection film is formed on the metal film 1015A. When the metal film 1015A is not completely oxidized, it may be necessary to provide a step of removing the non-oxidized metal film 1015A, for example, by dry etching using gas including chlorine etc. One reason is that leakage current may occur when the metal film 1015A that is not fully oxidized remains on the gate electrode 1014. When the metal film 1015A is completely oxidized and the high resistance film 1015 is formed thereby, the above-described removing step is not necessary, which results in simplification of manufacturing processes. In other words, occurrence of leakage current is suppressed without the removing step by etching. It is to be noted that the thickness of the high resistance film 1015 after the heat treatment is about 20 nm or less when the metal film 1015A is formed with a thickness of 10 nm or less.

The metal film 1015A may be oxidized by a method such as oxidation under water vapor atmosphere and plasma oxidation, other than the above-described heat treatment. Upon plasma oxidation, it is preferable to set the temperature of the substrate 1011 to be about from 200° C. to 400° C. both inclusive and to generate plasma in gas atmosphere including oxygen such as mixture gas of oxygen and carbon dioxide to process the metal film 1015A. The thus-formed high resistance film 1015 has favorable barrier characteristics as described above and reduces influence of oxygen, moisture, etc. with respect to the oxide semiconductor film 1012, thereby stabilizing electric characteristics of the transistor 1010 together with the inter-layer insulating film 1016.

Moreover, the resistance of the predetermined region in the oxide semiconductor film 1012 may be lowered by plasma treatment using, for example, hydrogen, argon, ammonium gas, or the like in a plasma CVD apparatus, other than by the above-described method utilizing reaction between the metal film 1015A and the oxide semiconductor film 1012. In addition thereto, a silicon nitride film, a silicon oxide film, or a silicon oxide nitride film that includes hydrogen may be formed, for example, by a plasma CVD method and the resistance in the predetermined region of the oxide semiconductor film 1012 may be lowered by, for example, hydrogen diffusion from this silicon nitride film or the like.

Figure 29A:
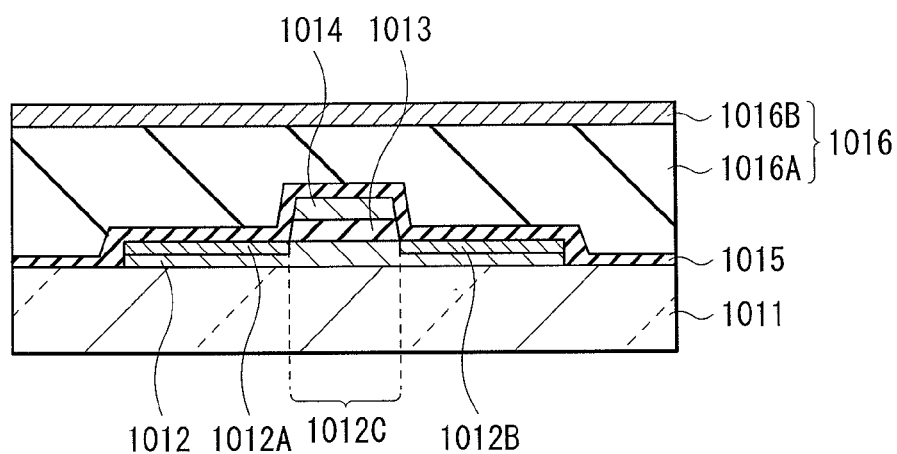
FIGS. 29A and 29B are cross-sectional views illustrating steps following the step shown in FIG. 28B.

After forming the high resistance film 1015, as shown in FIG. 29A, for example, the inter-layer insulating film 1016 with a thickness from 1 μm to 2 μm both inclusive may be formed on the entire surface of the high resistance film 1015. The inter-layer insulating film 1016 may be formed as follows, for example. First, solution in which the modifier configuring the surface modification layer 1016B is added to the resin material configuring the resin layer 1016A by about 0.01 wt % to 10 wt % both inclusive with respect to the resin material configuring the resin layer 1016A is applied on the high resistance film 1015 by a method such as spin coating and slit coating. Subsequently, the solution is dried, for example, at a temperature from 50° C. to 150° C. both inclusive. At this time, the resin material and the modifier are separated from each other, and thereby, the resin layer 1016A and the surface modification layer 1016B are formed. When the solution is dried at a temperature lower than 50° C., efficiency is lowered. When the solution is dried at a temperature higher than 150° C., the modifier may be degraded. It is preferable that the drying is performed at a temperature of 100° C. or lower so as to sufficiently separate the resin material from the modifier without lowering efficiency. Subsequently, exposure and development are performed on the resin layer 1016A and the surface modification layer 1016B to form the connection holes H1001 (not illustrated in FIG. 29A) at preferable positions. The resultant is annealed at a temperature of about 150° C. to 300° C. both inclusive. Thus, the inter-layer insulating film 1016 is formed. In the above-described inter-layer insulating film 1016, moisture intrusion into the oxide semiconductor film 1012 is suppressed without increasing the number of steps or cost since the inter-layer insulating film 1016 is separated into the resin layer 1016A and the surface modification layer 1016B during the drying step by adding the modifier to the resin material. Moreover, a vacuum process that may be necessary in methods such as a CVD method is not necessary upon forming the inter-layer insulating film 1016 (resin layer 1016A). Therefore, it is possible to suppress oxygen desorption, a reduction reaction due to factors such as hydrogen, etc in the oxide semiconductor film 1012. Accordingly, it is possible to form the transistor 1010 with high electric stability and high reliability.

After forming the inter-layer insulating film 1016, apertures are provided in the high resistance film 1015, for example, by photolithography and dry etching to form the connection holes H1001 that reach the source-drain regions 1012A and 1012B of the oxide semiconductor film 1012. When the surface of the oxide semiconductor film 1012 is crystallized as described above, for example, it is possible to perform wet etching with use of dilute hydrofluoric acid with maintaining sufficient etching selectivity between the oxide semiconductor film 1012 and the high resistance film 1015. In other words, it is possible to easily form the connection holes H1001 in the high resistance film 1015 configured of, for example, an aluminum oxide film that is difficult to be dry-etched.

Figure 29B:
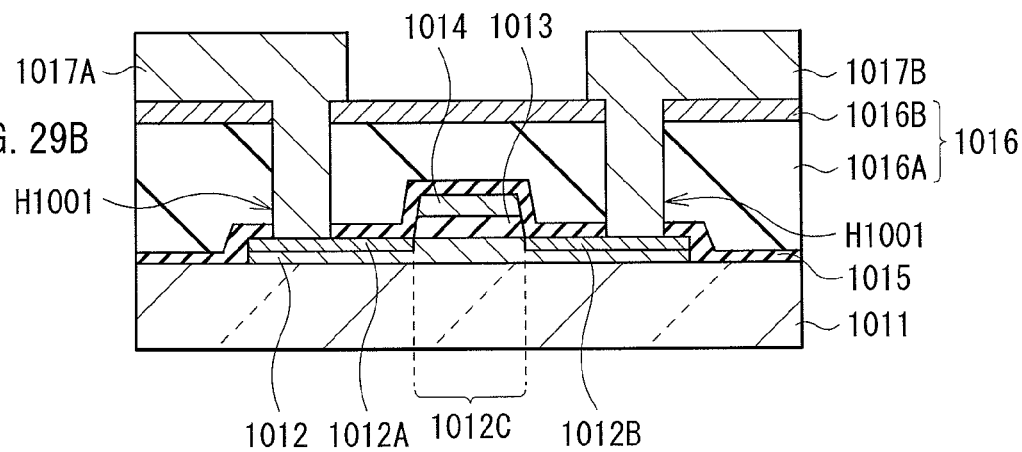

Subsequently, a conductive film (not illustrated) made of the above-described material configuring the source-drain electrodes 1017A and 1017B is formed on the inter-layer insulating film 1016, for example, by sputtering, and the connection holes H1001 are filled with the conductive film. Thereafter, the conductive film is patterned in a predetermined shape, for example, by photolithography and etching. Accordingly, the pair of source-drain electrodes 1017A and 1017B are formed on the inter-layer insulating film 1016 and the source-drain electrodes 1017A and 1017B are electrically connected to the source-drain regions 1012A and 1012B of the oxide semiconductor film 1012 through the connection holes H1001 (FIG. 29B). The transistor 1010 is formed on the substrate 1011 by the above-described processes.

[Step of Forming Planarization Film 1018]

Subsequently, the planarization film 1018 configured of the above-described material is formed by a coating method such as spin coating and slit coating so as to cover the inter-layer insulating film 1016 and the source-drain electrodes 1017A and 1017B, and the connection hole H1002 is formed in a part of a region facing the source-drain electrodes 1017A and 1017B.

[Step of Forming Organic EL Device 1020]

Subsequently, the organic EL device 1020 is formed on the planarization film 1018. Specifically, the first electrode 1021 made of the above-described material is formed on the planarization film 1018 by a method such as sputtering so as to fill the connection hole H1002, which is patterned, for example, by photolithography and etching. Thereafter, the pixel separation film 1022 with an aperture is formed on the first electrode 1021, and then, the organic layer 1023 is formed by a method such as vacuum deposition. Subsequently, the second electrode 1024 made of the above-described material is formed on the organic layer 1023, for example, by sputtering. Subsequently, the protection layer 1025 is formed on the second electrode 1024, for example, by a CVD method, and then, the sealing substrate 1027 is attached on the protection layer 1025 with use of the adhesion layer 1026. Thus, the display unit 1001 shown in FIG. 24 is completed.

In the display unit 1001, for example, when each pixel PXLC corresponding to one of R, G, and B receives the drive current in accordance with an image signal of each color, electrons and holes are injected into the organic layer 1023 through the first electrode 1021 and the second electrode 1024. The electrons and the holes are recombined in the organic EL layer included in the organic layer 1023, which results in light emission. Thus, the display unit 1001 displays full-color images, for example, of R, G, and B.

In the present example, the inter-layer insulating film 1016 that includes the surface modification layer 1016B provided on the oxide semiconductor film 1012. Therefore, moisture intrusion into the oxide semiconductor film 1012 is suppressed and TFT characteristics of the transistor 1010 are improved thereby. This will be described in detail below.

Figure 30:
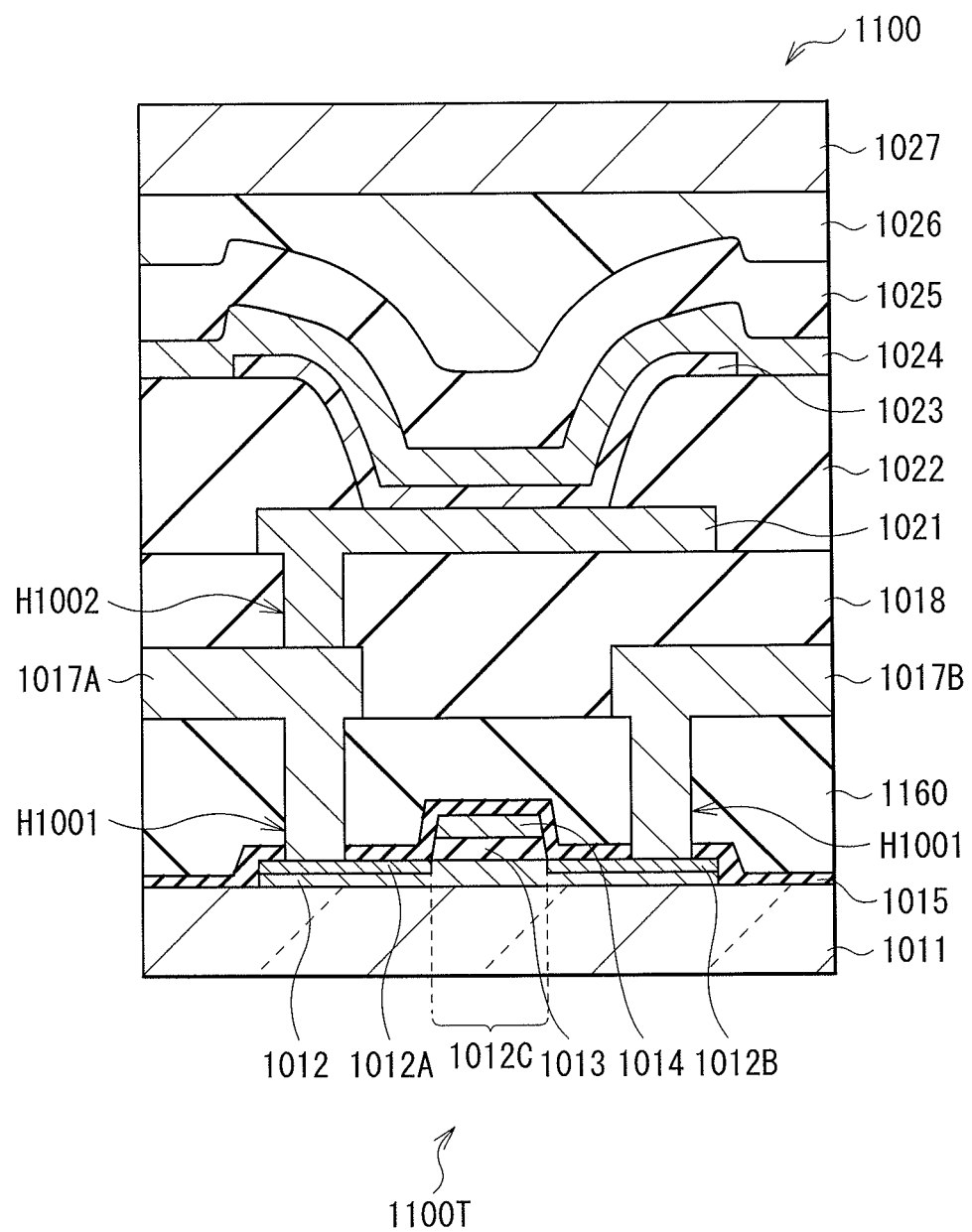
FIG. 30 is a cross-sectional view illustrating a configuration of a display unit according to Comparative Example 2.

FIG. 30 illustrates a cross-sectional configuration of a display unit (display unit 1100) according to Comparative Example 2. The display unit 1100 includes an inter-layer insulating film 1160 formed of a resin material on the oxide semiconductor layer 1012 of the transistor 1100T. However, the inter-layer insulating film 1160 does not include a modifier. In other words, a surface modification layer is not provided in the inter-layer insulating film 1160.

In the transistor 1100T of a self-aligned structure, the inter-layer insulating film 1160 is preferably formed of a resin material as described above and is specifically formed of a resin with high heat resistance such as polyimide and acrylic-based resins. However, such resins have high water absorption rate. Therefore, moisture easily intrudes into the oxide semiconductor film 1012 from the atmosphere and the upper layers through the inter-layer insulating film 1160. In particular, moisture may be diffused into the oxide semiconductor film 1012 through the source-drain regions 1012A and 1012B that are closer to the inter-layer insulating film 1160 compared to the channel region 1012C. The TFT characteristics of the transistor 1100T are lowered influenced by such moisture.

On the other hand, in the display unit 1001, the resin layer 1016A formed mainly of a resin material such as polyimide is covered with the surface modification layer 1016B with higher hydrophobicity. As a result, moisture in the atmosphere and in the upper layers is repelled by the surface modification layer 1016B. The oxide semiconductor film 1012 is covered with the inter-layer insulating film 1016 that includes the above-described surface modification layer 1016B. Therefore, moisture intrusion into the oxide semiconductor film 1012 is suppressed, and TFT characteristics, in particular, reliability is improved in the transistor 1010.

As described above, in the present embodiment, the surface modification layer 1016B is provided in the inter-layer insulating film 1016. Therefore, moisture intrusion into the oxide semiconductor film 1012 is reduced and the TFT characteristics of the transistor 1010 are improved.

Moreover, the surface modification layer 1016B may improve flatness of the resin layer 1016A, thereby improving uniformity of the transistor 1010 in the plane of the substrate 1011.

Moreover, the display unit 1001 includes the transistor 1010 of a self-aligned structure. Therefore, occurrence of parasitic capacity between the gate electrode 1013 and the source-drain electrodes 1017A and 1017B is suppressed, and thereby, high-quality images are displayed. Moreover, the display unit 1001 is allowed to have larger screen size, higher definition, and higher frame rate.

Modifications of the present embodiment and other embodiments will be described below. Components same as that of the above-described embodiment will be designated by the same numerals and description thereof will be omitted as appropriate.

[Modification 5]

Figure 31:
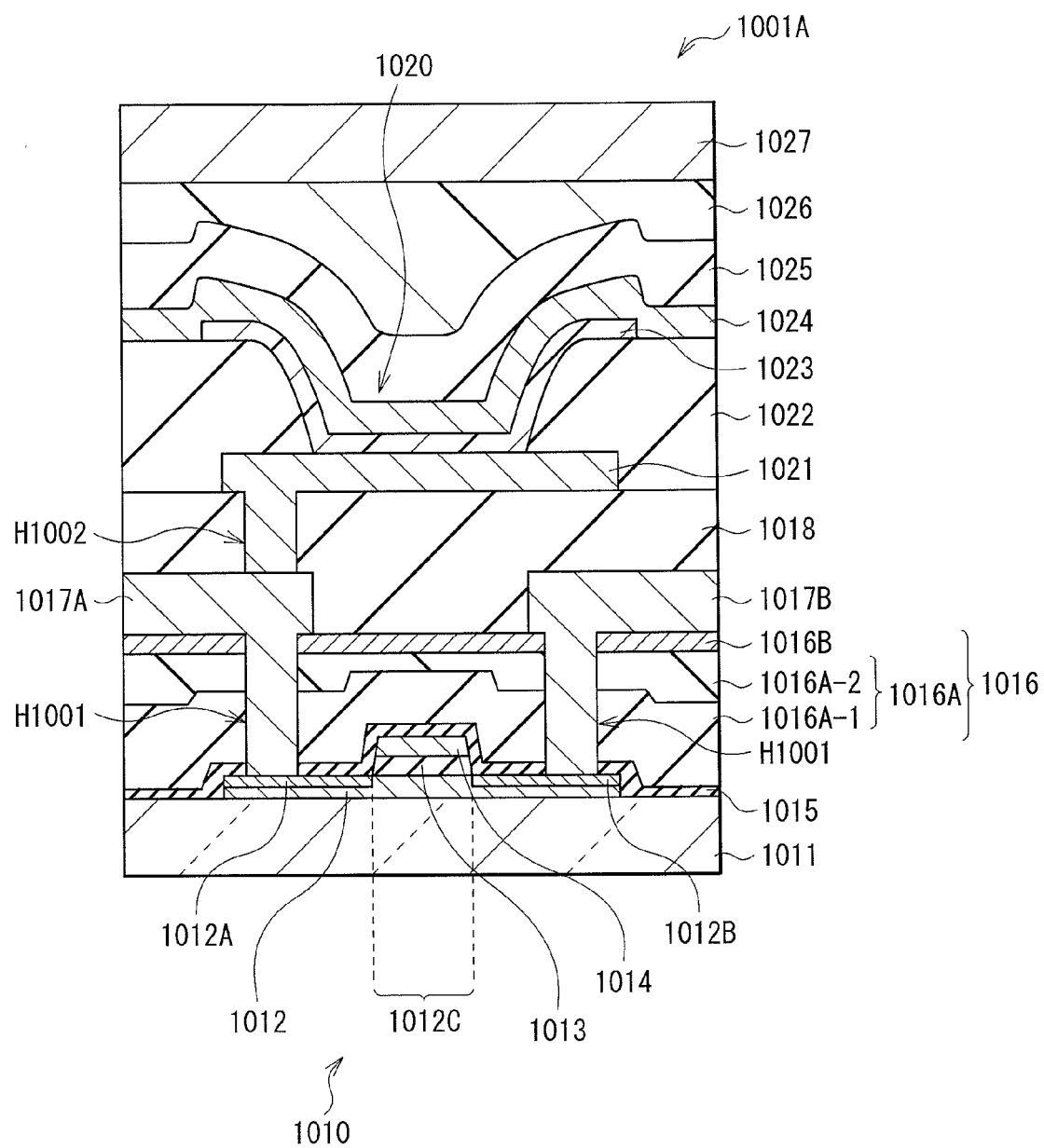
FIG. 31 is a cross-sectional view illustrating a main part configuration of a display unit according to Modification 5.

FIG. 31 illustrates a cross-sectional configuration of a display unit (display unit 1001A) according to Modification 5 of the above-described fourth embodiment. In the display unit 1001A, the resin layer 1016A in the inter-layer insulating film 1016 has a laminate structure (resin layers 1016A-1 and 1016A-2). Except for this point, the display unit 1001A has a configuration similar to that of the display unit 1001 of the above-described embodiment and has functions and effects similar to those of the display unit 1001 of the above-described embodiment.

The resin layer 1016A includes the resin layer 1016A-1 and the resin layer 1016A-2 in order from the substrate 1011 (high resistance film 1015). The resin layer 1016A-1 has polarity that is different from polarity of the resin layer 1016A-2. For example, the resin layer 1016A-1 may be formed of a low-polarity resin or a non-polarity resin. Examples of the low-polarity or non-polarity resin include polysiloxane (silicone resin), polyolefin-based resins, polyethylene-based resins, and polystyrene-based resins. Other organic materials or other inorganic materials may be added to the low-polarity or non-polarity resin materials described above. Alternatively, the resin layer 1016A-1 may be formed of an organic inorganic hybrid resin that has low polarity. Further, the resin layer 1016A-1 may be formed of a resin material to which a number of low-polarity or non-polarity functional groups or hydrophobic groups are introduced. Examples of the low-polarity functional groups include a siloxane group (—Si—O—Si—), an ether group, and an ester group. Examples of the non-polarity functional group includes an alkyl group (—$C_nH_{2n+1}$), an aryl group (—$C_6H_5$), and an acetyloxy group (—$OCOCH_3$). Examples of the hydrophobic group include halogen groups (—C—X where X is one of F, Cl, Br, and I) and a disulfide group (—S—S—).

The above-described low-polarity or non-polarity resin exhibits low water absorbability. To give an example, polysiloxane is a hydrophobic resin in which a low-polarity functional group repels, at an upper-most surface thereof, water which has high polarity. It is preferable that the resin layer 1016A-1 be formed, for example, of a resin with water absorption rate of 0.5% or less, preferably, 0.3% or less. On the other hand, a low-polarity resin material allows moisture intruded therein to be easily diffused (has high water permeability) and has moisture vapor transmission rate of, for example, more than 100 g/m$^2$·day. It is preferable to use a resin with moisture vapor transmission rate of 500 g/m$^2$·day or less for the resin layer 1016A-1.

The resin layer 1016A-2 is laminated on the resin layer 1016A-1 and includes a resin material with polarity that is higher than the polarity of the resin material forming the resin layer 1016A-1. The resin layer 1016A-2 may be configured of, for example, a material such as polyimide, acrylic-based resins, novolac-based resins, phenol-based resins, polyester-based resins, epoxy-based resins, vinyl-chloride-based resins, and polybenzimidazole-based resins. Other organic materials or other inorganic materials may be added to the high-polarity resin materials described above. Alternatively, the resin layer 1016A-2 may be formed of an organic inorganic hybrid resin that has high polarity. Further, the resin layer 1016A-2 may be formed of a resin material to which a number of high-polarity functional groups or hydrophilic groups are introduced. Examples of the high-polarity functional group include an aldehyde group, a ketone group, a carboxyl group (—COOH), an amide group (—$CONH_2$), an imide group, a phosphodiethyl group (—O—P(=O)OH—O—), and a peptide group (—CONH—). Examples of the hydrophilic group include a hydroxy group (—OH), an amino group (—$NH_2$), a thiol group (—SH), a carboxyl group, an amide group, a carbonyl group (—C=O), an alkanoyl group (R—CO—), and an acryloyl group ($H_2C$=CH—C(=O)—).

A resin with higher polarity such as resins described above exhibits low water permeability. To give an example, a resin such as polyimide and acrylic-based resins is a hydrophilic resin in which a high-polarity functional group absorbs, at the upper-most surface of the film, water which also has high polarity (has high water absorbability), however, moisture is absorbed at the film surface, and therefore, the moisture is less likely to be diffused or to intrude therein. The resin material included in the resin layer 1016A-2 may have moisture vapor transmission rate, for example, of 100 g/m$^2$·day or less. Although a high-polarity resin material typically has high water absorbability (for example, water absorption rate higher than 0.5%), it is preferable to use a resin material with water absorption rate of 10% or less, more preferably, 2.0% or less, for the resin layer 1016A-2.

It is possible to more effectively suppress moisture intrusion into the oxide semiconductor film 1012 by laminating, on the oxide semiconductor film 1012, the resin layer 1016A-1 formed of a resin material with low water absorbability and the resin layer 1016A-2 formed of a resin material with low water permeability. In a view point of lamination order, it is preferable to provide the resin layer 1016A-1 with low water absorbability and the resin layer 1016A-2 with low water permeability in this order from the oxide semiconductor film 1012 (high resistance film 1015). In the resin layer 1016A configured of a laminate formed in the above-described order, first, the resin layer 1016A-2 with high water absorbability absorbs moisture that exists in the atmosphere and moisture remained above the inter-layer insulating film 1016 during the manufacturing processes even when the moisture has not been repelled by the surface modification layer 1016B. The moisture that has once been absorbed by the resin layer 1016A-2 is less likely to diffuse in the resin layer 1016A-2, and is repelled by the surface of the resin layer 1016A-1 with low water absorbability and is extracted to the atmosphere, for example, even when the moisture is extricated from the resin included in the resin layer 1016A-2 through a process such as baking. Therefore, moisture intrusion into the oxide semiconductor film 1012 is more effectively suppressed by the above-described lamination order.

[Modification 6]

Figure 32:
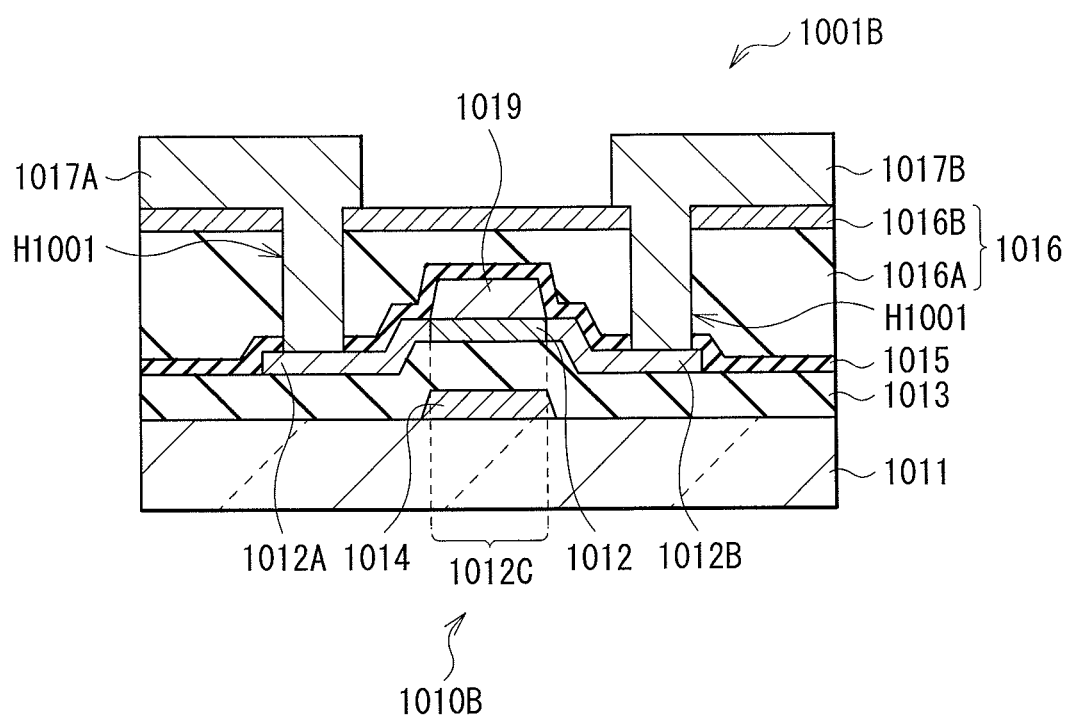
FIG. 32 is a cross-sectional view illustrating a configuration of a display unit according to Modification 6.

FIG. 32 illustrates a cross-sectional configuration of a display unit (display unit 1001B) according to Modification 6 of the above-described fourth embodiment. The display unit 1001B includes a transistor (transistor 1010B) of a bottom-gate type (inversed-staggered structure). Except for this point, the display unit 1001B has a configuration similar to that of the display unit 1001 of the above-described fourth embodiment and has functions and effects similar to those of the display unit 1001 of the above-described embodiment.

The transistor 1010B includes the gate electrode 1014, the gate insulating film 1013, and the oxide semiconductor film 1012 in order from the substrate 1011. A channel protection film 1019 is provided on the channel region 1012C of the oxide semiconductor film 1012. The high resistance film 1015 covers the channel protection film 1019 and the oxide semiconductor film 1012. In other words, the gate electrode 1014, the gate insulating film 1013, the oxide semiconductor film 1012, and the high resistance film 1015 are provided in this order. Further, the transistor 1010B includes the inter-layer insulating film 1016 on the high resistance film 1015. The source-drain electrodes 1017A and 1017B are electrically connected to the source-drain regions 1012A and 1012B of the oxide semiconductor film 1012 through the connection holes H1001 in the inter-layer insulating film 1016. As described above, also in the transistor 1010B of a bottom-gate type, it is possible to provide the source-drain regions 1012A and 1012B in the oxide semiconductor film 1012, and thereby, to suppress occurrence of parasitic capacity between the gate electrode 1014 and the source-drain electrodes 1017A and 1017B, as in the above-described transistor 1010. Also, it is possible to stabilize electric characteristics of the transistor 1010B by the high resistance film 1015.

Figure 33A:
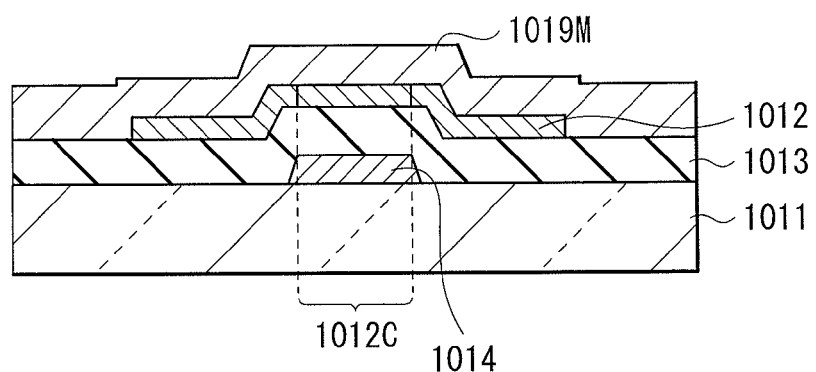
FIGS. 33A and 33B are cross-sectional views illustrating a method of manufacturing a transistor shown in FIG. 32 in process order.
Figure 33B:
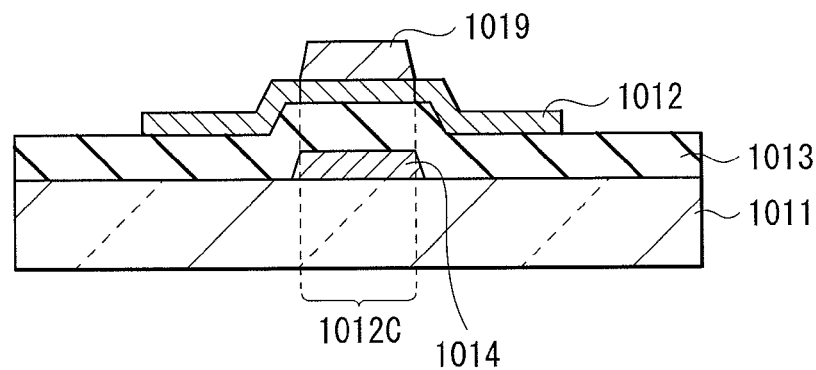
Figure 34A:
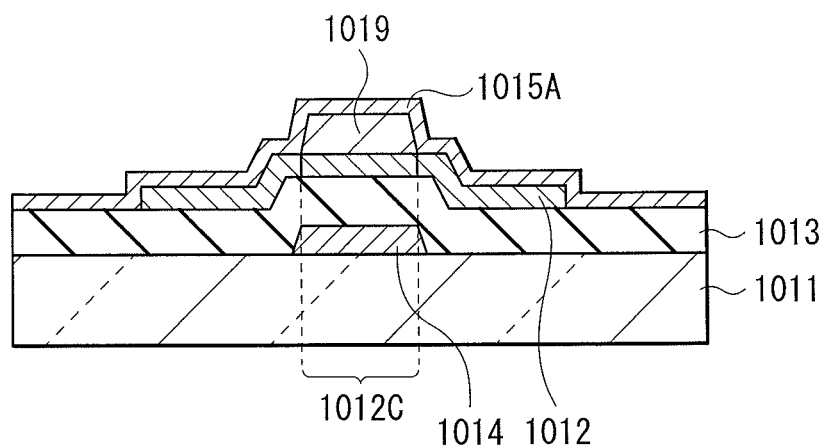
FIGS. 34A and 34B are cross-sectional views illustrating steps following a step shown in FIG. 33B.
Figure 34B:
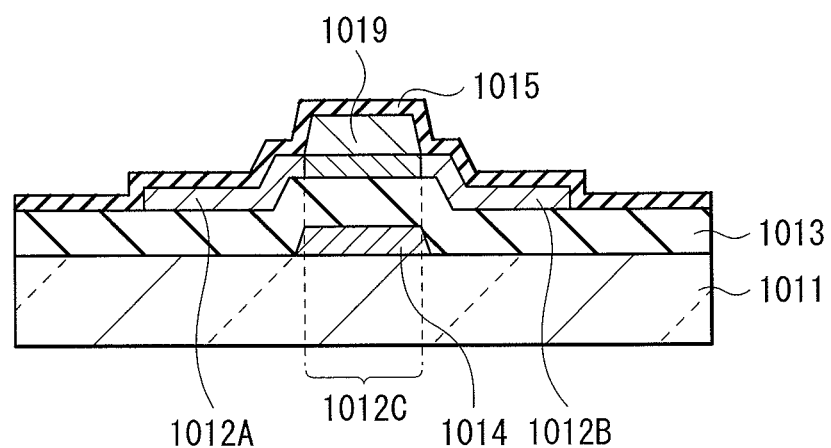

The transistor 1010B may be manufactured as follows, for example. First, the gate electrode 1014, the gate insulating film 1013, and the oxide semiconductor film 1012 are formed on the substrate 1011 in this order. Thereafter, a protection material film 1019M configured of a material of the channel protection film 1019 is formed on the oxide semiconductor film 1012 (FIG. 33A). The protection material film 1019M may be formed of a material such as SiN, SiO, and A10. Subsequently, as shown in FIG. 33B, the protection material film 1019M is patterned by back exposure with use of the gate electrode 1014 as a mask, and thereby, the channel protection film 1019 is formed. Subsequently, the metal film 1015A is formed on the channel protection film 1019 and on the oxide semiconductor film 1012 (FIG. 34A), and then, the laminate is annealed in a manner similar to that of the above-described embodiment. Thus, the metal film 1015A becomes the high resistance film 1015 and the source-drain regions 1012A and 1012B are formed in the oxide semiconductor film 1012 (FIG. 34B). Subsequently, the inter-layer insulating film 1016 and the source-drain electrodes 1017A and 1017B are formed on the high resistance film 1015 in a manner similar to that of the above-described embodiment, and the transistor 1010B is completed thereby.

[Modification 7]

Figure 35:
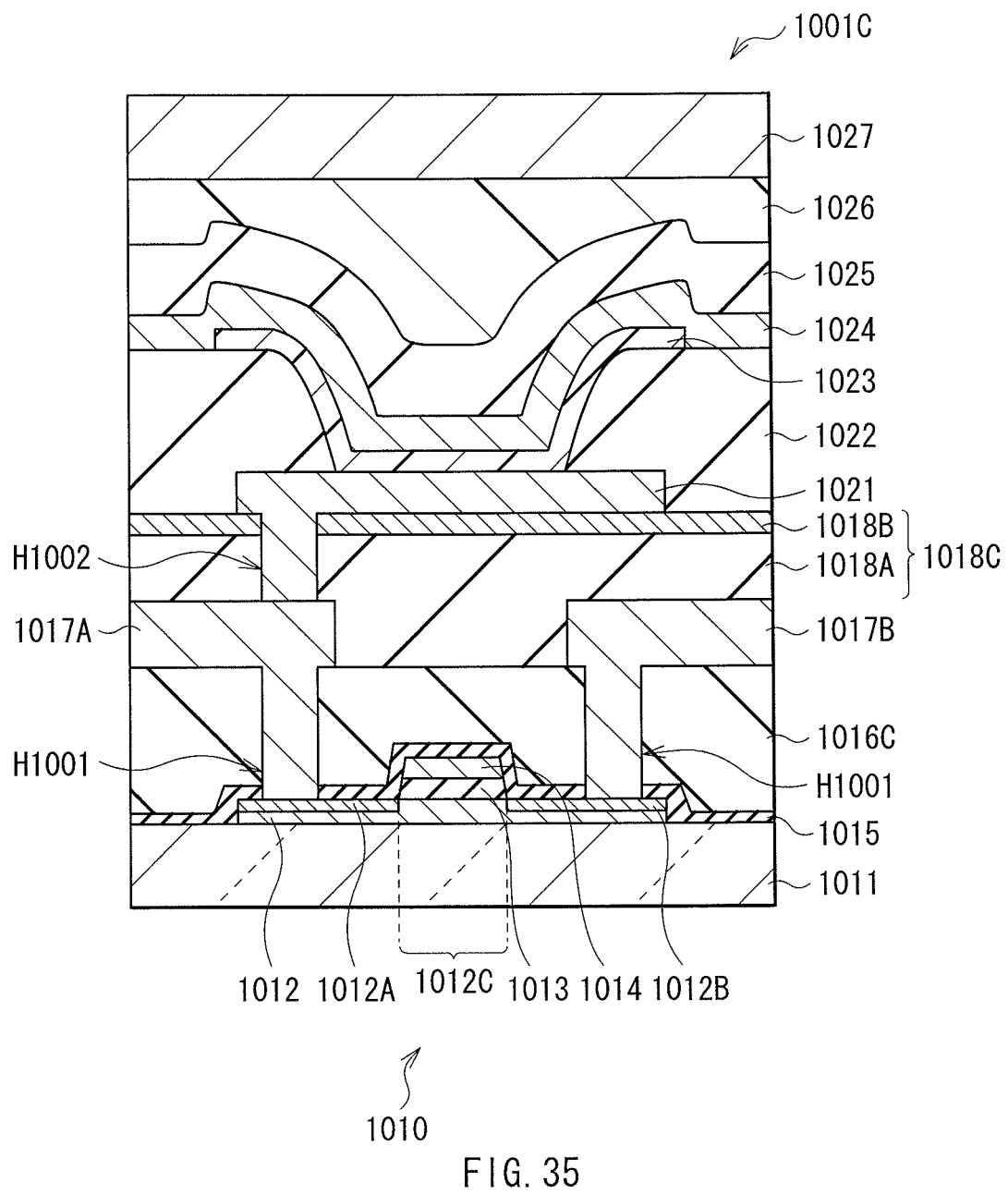
FIG. 35 is a cross-sectional view illustrating a configuration of a display unit according to Modification 7.

FIG. 35 illustrates a cross-sectional configuration of a display unit (display unit 1001C) according to Modification 7 of the above-described fourth embodiment. The display unit 1001C includes a surface modification layer (surface modification layer 1018B) in a planarization film (planarization film 1018C). Except for this point, the display unit 1001C has a configuration similar to that of the display unit 1001 of the above-described fourth embodiment and has functions and effects similar to those of the display unit 1001 of the above-described fourth embodiment.

The planarization film 1018C (insulating film) includes a resin layer 1018A and the surface modification layer 1018B. The surface (surface on the first electrode 1021 side) of the resin layer 1018A is covered with the surface modification layer 1018B. The resin layer 1018A may be formed of a resin material similar to that described above for the resin layer 1016A. The surface modification layer 1018B may be formed of a modifier similar to that described above for the surface modification layer 1016B. The inter-layer insulating film 1016C may be configured only of the resin layer 1016A (FIG. 35), or may be configured of an inter-layer insulating film 1016 including the surface modification layer 1016B (FIG. 24). It is preferable to provide the surface modification layer in the inter-layer insulating film since the inter-layer insulating film exists in a position closer to the oxide semiconductor film 1012 compared to the planarization film.

Figure 36:
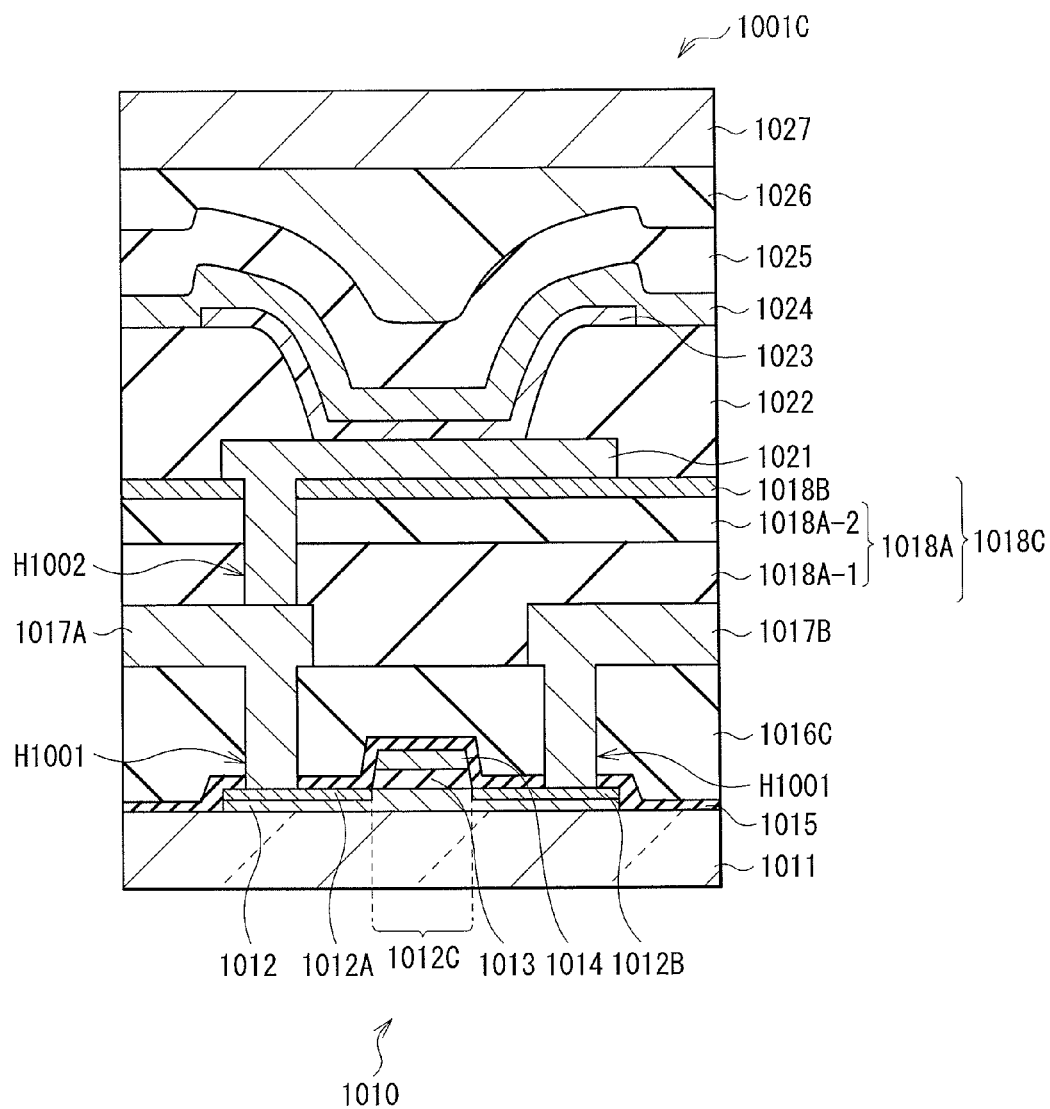
FIG. 36 is a cross-sectional view illustrating another example of the display unit shown in FIG. 35.

As shown in FIG. 36, the resin layer 1018A may have a laminate structure that includes a resin layer 1018A-1 and a resin layer 1018A-2. The resin layer 1018A includes the resin layer 1018A-1 and the resin layer 1018A-2 in order from the substrate 1011. A resin material configuring the resin layer 1018A-1 has polarity that is different from a resin material configuring the resin layer 1018A-2. The resin material configuring the resin layer 1018A-2 may have the polarity that is higher than the polarity of the resin material configuring the resin layer 1018A-2.

[Fifth Embodiment]

Figure 37:
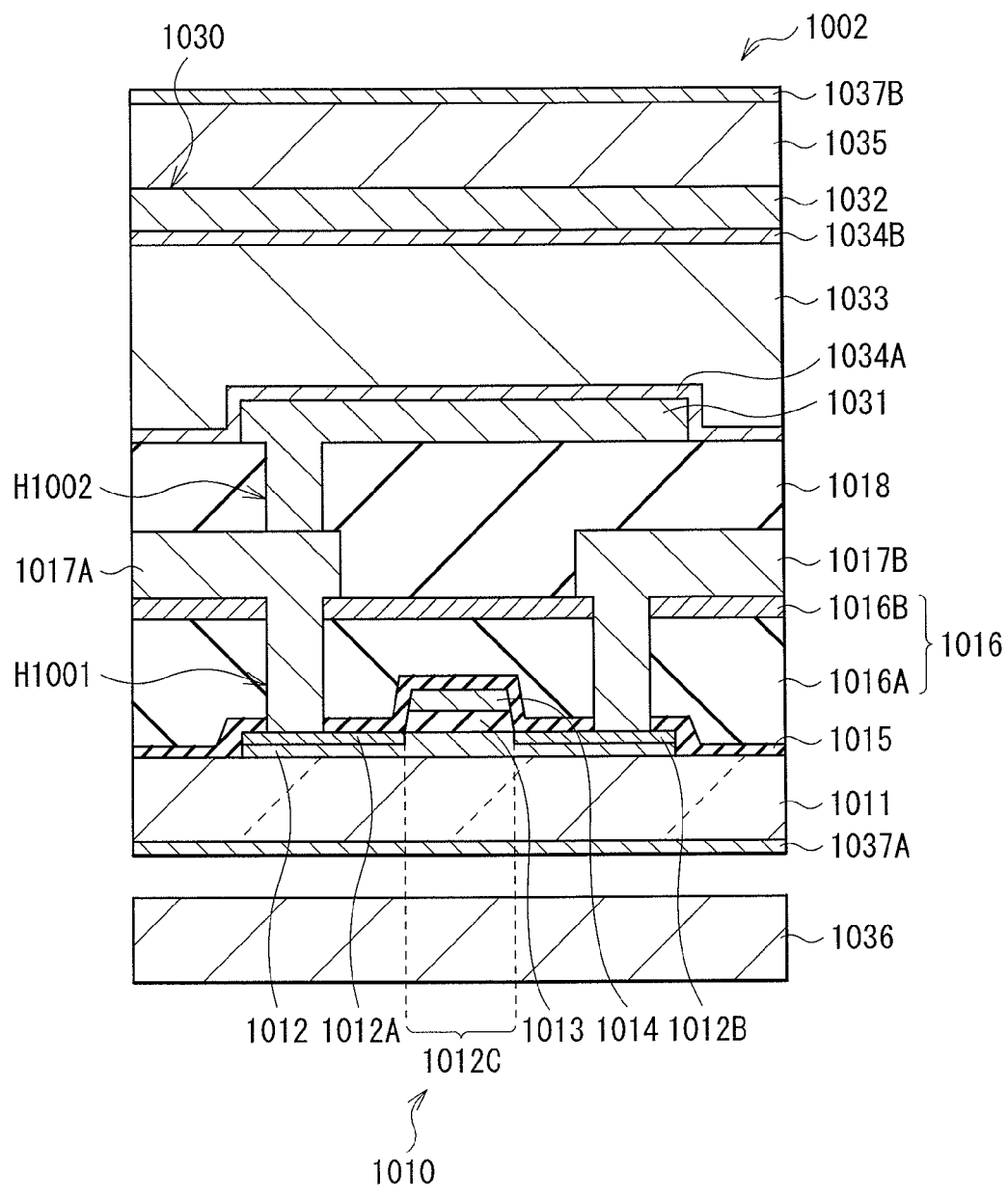
FIG. 37 is a cross-sectional view illustrating a configuration of a display unit according to a fifth embodiment of the present application.

FIG. 37 illustrates a cross-sectional configuration of a display unit (display unit 1002) according to a fifth embodiment of the present application. The display unit 1002 includes a liquid crystal display device 1030 instead of the organic EL device 1020 in the above-described fourth embodiment (display unit 1001). Except for this point, the display unit 1002 has a configuration similar to that of the display unit 1001 of the above-described embodiment and has functions and effects similar to those of the display unit 1001 of the above-described fourth embodiment.

The display unit 1002 includes the transistor 1010 similar to that of the display unit 1001. The liquid crystal display device 1030 is provided above the transistor 1010 with the planarization film 1018 in between.

The liquid crystal display device 1030 may include a liquid crystal layer 1033 sealed between a pixel electrode 1031 and a counter electrode 1032. Alignment films 1034A and 1034B are provided on the respective surface on the liquid crystal layer 1033 side of the pixel electrode 1031 and the counter electrode 1032. The pixel electrode 1031 is provided for each pixel and may be electrically connected to the source-drain electrodes 1017A and 1017B of the transistor 1010, for example. The counter electrode 1032 is provided, on a counter substrate 1035, as an electrode shared by a plurality of pixels and may be retained, for example, at a common potential. The liquid crystal layer 1033 is configured of liquid crystal that is driven in a mode such as a vertical alignment (VA) mode, a twisted nematic (TN) mode, and an in-plane switching (IPS) mode.

Moreover, a backlight 1036 is provided below the substrate 1011. Polarizing plates 1037A and 1037B are attached on the backlight 1036 side of the substrate 1011 and on the counter substrate 1035, respectively.

The backlight 1036 is a light source that applies light toward the liquid crystal layer 1033 and may include, for example, a plurality of light emitting diodes (LEDs), cold cathode fluorescent lamps (CCFLs), or the like. A backlight drive section which is not illustrated controls the backlight 1036 to be turned on or off The polarizing plates (polarizers or analyzers) 1037A and 1037B may be in a crossed-Nicols state, for example. This may allow, for example, illumination light from the backlight 1036 to be shielded when a voltage is not applied (off state) or to be transmitted when a voltage is applied (on state), for example.

In the display unit 1002, as in the display unit 1001 of the above-described embodiment, it is possible to suppress moisture intrusion into the oxide semiconductor film 1012 by the inter-layer insulating film 1016 including the surface modification layer 1016B. Accordingly, the TFT characteristics of the transistor 1010 are improved also in the present embodiment.

[Sixth Embodiment]

Figure 38:
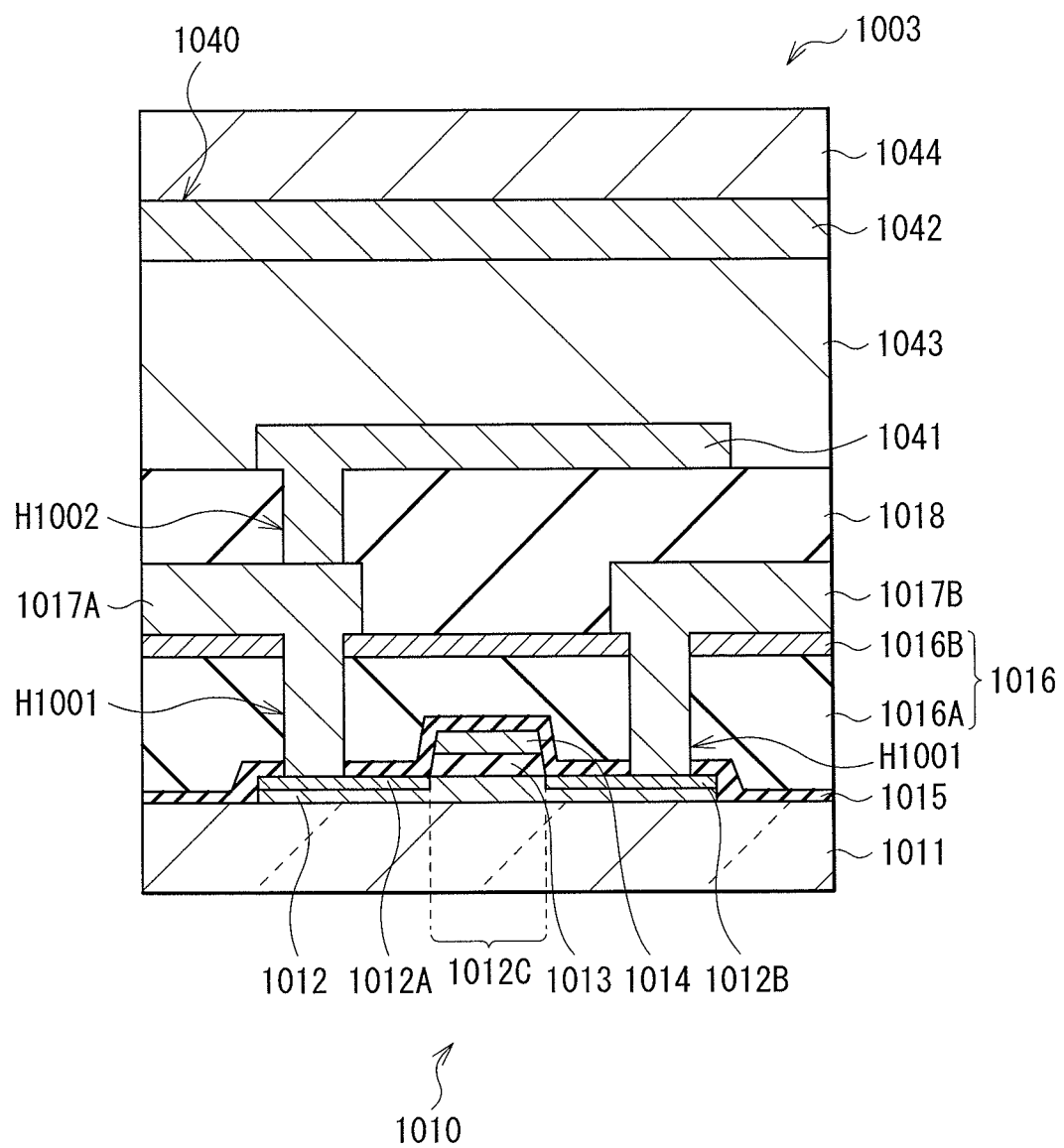
FIG. 38 is a cross-sectional view illustrating a configuration of a display unit according to a sixth embodiment of the present application.

FIG. 38 illustrates a cross-sectional configuration of a display unit (display unit 1003) according to a sixth embodiment of the present application. The display unit 1003 is a so-called electronic paper and has an electrophoretic display device 1040 instead of the organic EL device 1020 in the display unit 1001. Except for this point, the display unit 1003 has a configuration similar to that of the display unit 1001 of the above-described fourth embodiment and has functions and effects similar to those of the display unit 1001 of the above-described fourth embodiment.

The display unit 1003 has the transistor 1010 similar to that in the display unit 1001. The electrophoretic display device 1040 is provided above the transistor 1010 with the planarization film 1018 in between.

The electrophoretic display device 1040 may include, for example, a display layer 1043 that is configured of an electrophoretic material and is sealed between a pixel electrode 1041 and a common electrode 1042. The pixel electrode 1041 is provided for each pixel and may be electrically connected to the source-drain electrodes 1017A and 1017B of the transistor 1010, for example. The common electrode 1042 is provided, on a counter substrate 1044, as an electrode shared by a plurality of pixels.

In the display unit 1003, as in the display unit 1001 of the above-described fourth embodiment, it is possible to suppress moisture intrusion into the oxide semiconductor film 1012 by the inter-layer insulating film 1016 that includes the surface modification layer 1016B. Accordingly, the TFT characteristics of the transistor 1010 are improved also in the present embodiment.

APPLICATION EXAMPLES

Hereinafter, description will be given of examples in which the above-described display units (display units 1001, 1001A, 1001B, 1001C, 1002, and 1003) are applied to electronic apparatuses. Examples of the electronic apparatus include, televisions, digital cameras, notebook personal computers, personal digital assistants such as mobile phones, and video camcorders. In other words, the above-described display units are applicable to an electronic apparatus in any field that displays an externally-inputted or internally-generated image signal as an image or a moving picture.

[Module]

Figure 39:
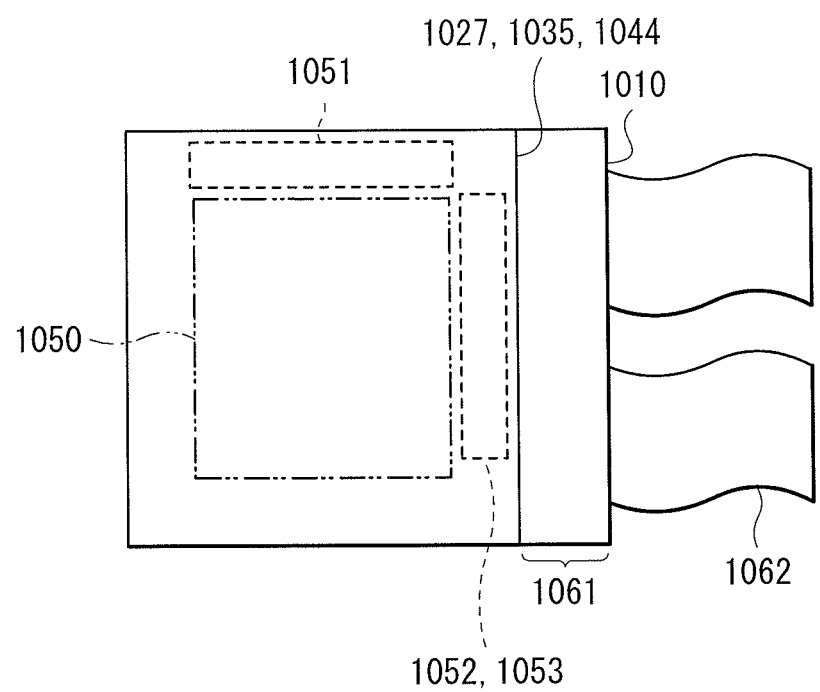

For example, the above-described display units may be assembled, as a module shown in FIG. 39, in various electronic apparatuses such as later-described Application Examples 1 to 7. The module may include, for example, a region 1061 that is exposed from the sealing substrate 1027 or from the counter substrate 1035 or 1044 on a side of the substrate 1011. Wirings of the horizontal selector 1051, the write scanner 1052, and the electric power source scanner 1053 are extended to form external connection terminals (not illustrated) on the exposed region 1061. A flexible printed circuit (FPC) 1062 for input and output of signals may be provided in the external connection terminals.

Application Example 1

FIGS. 17A and 17B each illustrate an appearance of an electronic book to which any of the display units according to the above-described embodiments and the like is applied. The electronic book may include, for example, a display section 210 and a non-display section 220. The display section 210 is configured of one of the display units according to the above-described embodiments and the like.

Application Example 2

FIG. 18 illustrates an appearance of a smartphone to which any of the display units according to the above-described embodiments and the like is applied. The smartphone may include, for example, a display section 230 and a non-display section 240. The display section 230 is configured of one of the display units according to the above-described embodiments and the like.

Application Example 3

FIG. 19 illustrates an appearance of a television to which any of the display units according to the above-described embodiments and the like is applied. The television may include, for example, an image display screen section 300 that includes a front panel 310 and a filter glass 320. The image display screen section 300 is configured of one of the display units according to the above-described embodiments and the like.

Application Example 4

FIGS. 20A and 20B each illustrate an appearance of a digital camera to which any of the display units according to the above-described embodiments and the like is applied. The digital camera may include, for example, a light emitting section 410 for flash, a display section 420, a menu switch 430, and a shutter button 440. The display section 420 is configured of one of the display units according to the above-described embodiments and the like.

Application Example 5

FIG. 21 illustrates an appearance of a notebook personal computer to which any of the display units according to the above-described embodiments and the like is applied. The notebook personal computer may include, for example, a main body 510, a keyboard 520 for operation of inputting characters etc., and a display section 530 that displays an image. The display section 530 is configured of one of the display units according to the above-described embodiments and the like.

Application Example 6

FIG. 22 illustrates an appearance of a video camcorder to which any of the display units according to the above-described embodiments and the like is applied. The video camcorder may include, for example, a main body section 610, a lens 620 for shooting a subject provided on a front side face of the main body section 610, a start-stop switch 630 used upon shooting, and a display section 640. The display section 640 is configured of one of the display units according to the above-described embodiments and the like.

Application Example 7

FIGS. 23A to 23G each illustrate an appearance of a mobile phone to which any of the display units according to the above-described embodiments and the like is applied. The mobile phone may include, for example, a top housing 710 and a bottom housing 720 connected with a connection section (hinge section) 730, and may include a display 740, a sub-display 750, a picture light 760, and a camera 770. The display 740 and the sub-display 750 of the above-described components are each configured of one of the display units according to the above-described embodiments and the like.

EXAMPLES

Hereinafter, description will be given of specific examples of the preferred embodiments of the present application.

Examples 3-1 and 3-2

A transistor (transistor 1100T) in which an inter-layer insulating film (inter-layer insulating film 1160) configured only of a resin material without adding a modifier was fabricated and thermal decomposition temperature and pure water contact angle of the inter-layer insulating film and reliability of the transistor were measured. Polyimide (Example 3-1) and an acrylic-based resin (Example 3-2) were used as the inter-layer insulating film.

The reliability of the transistor was determined by performing+BT (bias-temperature) test under the conditions of Vg=10V and Vd=10V. The inter-layer insulating film was formed above the oxide semiconductor film by spin coating, and thenm pre-bake and post-bake were performed theron under predetermined conditions. The resultant was placed in a constant temperature layer of 90% RH at 60° for 100 hours and ΔVth thereof after 10000 seconds was measured. It was determined that the transistor had high reliability ("good") when the value of ΔVth was 1.0 V or smaller and that the transistor had low reliability ("poor") when the value was larger than 1.0 V (see later-described Table 2).

Examples 4-1 to 4-3

A transistor (transistor 1010) that includes a surface modification layer (surface modification layer 1016B) in an inter-layer insulating film (inter-layer insulating film 1016) was fabricated and thermal decomposition temperature and pure water contact angle of the inter-layer insulating film and reliability of the transistor were measured in a manner similar to that in Examples 3-1 and 3-2. Example 4-1 used polyimide as the resin material and used a fluorine-containing oligomer A as the modifier, Example 4-2 used polyimide as the resin material and used a fluorine-containing oligomer B as the modifier, and Example 4-3 used an acrylic-based resin as the resin material and used a silicone-based oligomer as the modifier, to form the inter-layer insulating film. RS-72-K (available from DIC Corporation) was used as the fluorine-containing oligomer A, F555 (available from DIC Corporation) was used as the fluorine-containing oligomer B, and EB350 (available from Daicel Corporation) was used as the silicone-based oligomer.

Results of the above-described Examples 3-1 and 3-2 and Examples 4-1 to 4-3 are shown in Table 2. The inter-layer insulating film of 2 nm thick was used in each of Examples 3-1 and 3-2 and Examples 4-1 to 4-3.

TABLE 2

| Example | Resin material | Modifier | Film thickness (μm) | Thermal decomposition temperature (° C.) | Contact angle (°) | Reliability |
|---|---|---|---|---|---|---|
| 3-1 | polyimide | — | 2 | 384 | 70.4 | poor |
| 3-2 | acrylic-based resin | — | | 309 | 68.6 | poor |
| 4-1 | polyimide | fluorine-containing oligomer A | | 378 | 102.1 | good |
| 4-2 | polyimide | fluorine-containing oligomer B | | 380 | 110 | good |
| 4-3 | acrylic-based resin | silicone-based oligomer | | 308 | 94 | good |

As can be seen from Table 2, it was found that each of Examples 4-1 to 4-3 that additionally includes a modifier had a contact angle of 90° or larger and exhibited high hydrophobicity. Further, high reliability was obtained in each of the transistors (Examples 4-1 to 4-3) that included the above-described inter-layer insulating film. Even when the modifier was added, the thermal decomposition temperature did not decrease (Examples 4-1 to 4-3) and the stability of the inter-layer insulating film was not influenced.

Hereinbefore, the present application has been described with reference to the preferred embodiments and the modifications. However, the present application is not limited thereto and may be variously modified. For example, a case where the resin layer 1016A-1 (or the resin layer 1018A-1) with low polarity and the resin layer 1016A-2 (or the resin layer 1018A-2) with higher polarity are provided in order from the high resistance film 1015 has been described in the above-described Modifications 5 and 7. However, the resin layer with higher polarity may be provided closer to the high resistance film 1015.

Moreover, a case where the source-drain regions 1012A and 1012B are provided in part of a portion adjacent to the channel region 1012C from the surface (top face) thereof along the thickness direction was described in the above-described embodiment and the like. However, the source-drain regions 1012A and 1012B may be provided in all of the oxide semiconductor film 1012 from the surface (top face) along the thickness direction.

Moreover, the structure provided with the high resistance film 1015 was described as an example in the above-described embodiments and the like. However, the high resistance film 1015 may be removed after forming the source-drain regions 1012A and 1012B. However, it is preferable to leave the high resistance film 1015 so as to stably retain the electric characteristics of the transistor 1010.

In addition thereto, the material and the thickness of each layer, the film formation methods, and the film formation conditions that have been described in the above-described embodiments and the like are not limitative, and other materials, other thicknesses, other film formation methods, and other film formation conditions may be employed.

Moreover, the configurations of the organic EL device 1020, of the liquid crystal display device 1030, of the electrophoretic display device 1040, and of the transistor 1010 have been specifically described in the above embodiments and the like. However, it is not necessary to provide all of the layers and other layers may be further provided. For example, FIGS. 37 and 38 each illustrate the inter-layer insulating film 1016, the transistor 1010, and the planarization film 1018 shown in FIG. 24. However, instead of these components, the inter-layer insulating film 1016 shown in FIG. 31 (Modification 5), the transistor 1010B shown in FIG. 32 (Modification 6), or the planarization film 1018C shown in FIG. 35 (Modification 7) or FIG. 36 may be provided.

Moreover, the present application is applicable to a display unit that uses a display device such as an inorganic electroluminescence device other than the organic EL device 1020, the liquid crystal display device 1030, and the electrophoretic display device 1040.

Moreover, for example, the configuration of the display unit has been described with specific examples in the above embodiments and the like. However, it is not necessary to provide all of the components and other components may be further provided.

It is possible to achieve at least the following configurations from the above-described example embodiments and the modifications of the disclosure.

(1) A semiconductor device including:
 a transistor including an oxide semiconductor film; and
 an insulating film covering the oxide semiconductor film and including a resin material, the insulating film being covered with a surface modification layer that has hydrophobicity that is higher than hydrophobicity of the resin material.

(2) The semiconductor device according to (1), wherein the surface modification layer has flatness that is higher than flatness of the resin material.

(3) The semiconductor device according to (1) or (2), wherein the surface modification layer includes one of a silicone-based oligomer and a fluorine-containing oligomer that each function as a modifier.

(4) The semiconductor device according to any one of (1) to (3), wherein the insulating film has a contact angle of 90 degrees or larger.

(5) The semiconductor device according to any one of (1) to (4), wherein part or all of a modifier included in the surface modification layer is coupled with the resin material.

(6) The semiconductor device according to any one of (1) to (5), wherein the resin material includes one or more of polyimide, acrylic-based resins, and polysiloxane.

(7) The semiconductor device according to any one of (1) to (6), wherein the insulating film includes a modifier of about 0.1 mass percent to about 10 mass percent both inclusive with respect to the resin material.

(8) The semiconductor device according to (7), wherein concentration of the modifier included in an inner part of the insulating film is lower than concentration of the modifier included in the surface modification layer.

(9) The semiconductor device according to any one of (1) to (8), wherein a source-drain electrode of the transistor is electrically connected to the oxide semiconductor film through a connection hole in the insulating film.

(10) The semiconductor device according to any one of (1) to (9), wherein
 the oxide semiconductor film includes a channel region and a source-drain region that is adjacent to the channel region and has resistivity lower than resistivity of the channel region, and
 the transistor includes a gate electrode facing the channel region.

(11) The semiconductor device according to (10), further including a high resistance film being in contact with the source-drain region.

(12) The semiconductor device according to any one of (1) to (8), wherein a source-drain electrode of the transistor is covered with the insulating film.

(13) The semiconductor device according to any one of (1) to (12), wherein the insulating film has a laminate structure including a first resin layer and a second resin layer, the first resin layer having polarity that is different from polarity of the second resin layer.

(14) The semiconductor device according to (11), wherein the oxide semiconductor film, the gate electrode, and the high resistance film are included in this order.

(15) The semiconductor device according to (11), wherein the gate electrode, the oxide semiconductor film, and the high resistance film are included in this order.

(16) A display unit including;
 a display device;
 a transistor driving the display device and including an oxide semiconductor film; and
 an insulating film covering the oxide semiconductor film and including a resin material, the insulating film being covered with a surface modification layer with hydrophobicity that is higher than hydrophobicity of the resin material.

(17) The display unit according to (16), wherein the display device is an organic EL device.

(18) An electronic apparatus with a display unit, the display unit including;
 a display device;
 a transistor driving the display device and including an oxide semiconductor film; and
 an insulating film covering the oxide semiconductor film and including a resin material, the insulating film being covered with a surface modification layer with hydrophobicity that is higher than hydrophobicity of the resin material.

(19) A method of manufacturing a semiconductor device, the method including:
 forming a transistor that includes an oxide semiconductor film;
 covering the oxide semiconductor film with an insulating film that includes a resin material; and
 providing a surface modification layer in a surface of the insulating film, the surface modification layer having hydrophobicity that is higher than hydrophobicity of the resin material.

(20) The method according to (19), wherein the surface modification layer is formed by adding a modifier to the resin material, and then drying the resultant at a temperature of 100 degrees or lower.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A semiconductor device comprising:
 a transistor including an oxide semiconductor film;
 a high resistance film formed on the transistor;
 a first insulating film formed on the high resistance film and covering the oxide semiconductor film, and the first insulating film including a first resin material;
 a second insulating film including a second resin material, the second insulating film being laminated on the first insulating film; and
 a third insulating film including a third resin material, the third insulating film being laminated on the second insulating film,
 wherein a polarity of the second resin material is greater than a polarity of the third resin material, and the polarity of the third resin material is greater than a polarity of the first resin material.

2. The semiconductor device according to claim 1, wherein a source-drain electrode of the transistor is electrically connected to the oxide semiconductor film through a connection hole in the first insulating film and the second insulating film.

3. The semiconductor device according to claim 1, wherein the oxide semiconductor film includes a channel region and a source-drain region that is adjacent to the channel region and has resistivity lower than resistivity of the channel region, and
 the transistor includes a gate electrode facing the channel region.

4. The semiconductor device according to claim 1, wherein the first resin material is one or more selected from a group consisting of polysiloxane, polyolefin-based resins, polyethylene-based resins, and polystyrene-based resins, and the second resin material is one or more selected from a group consisting of polyimide, acrylic-based resins, novolac-based resins, phenol-based resins, polyester-based resins, epoxy-based resins, vinyl-chloride-based resins, and polybenzimidazole-based resins.

5. The semiconductor device according to claim 3, wherein the high resistance film is in contact with the source-drain region.

6. The semiconductor device according to claim 1, wherein
a source-drain electrode of the transistor is electrically connected to the oxide semiconductor film through the connection hole in the first insulating film, and
the second insulating film covers the source-drain electrode.

7. The semiconductor device according to claim 5, wherein the gate electrode, the oxide semiconductor film, and the high resistance film are included in this recited order.

8. An electronic apparatus with a display unit, the display unit comprising:
a display device;
a transistor driving the display device and including an oxide semiconductor film;
a high resistance film formed on the transistor;
a first insulating film formed on the high resistance film and covering the oxide semiconductor film, and the first insulating film including a first resin material;
a second insulating film including a second resin material, the second insulating film being laminated on the first insulating film; and
a third insulating film including a third resin material, the third insulating film being laminated on the second insulating film,
wherein a polarity of the second resin material is greater than a polarity of the third resin material, and the polarity of the third resin material is greater than a polarity of the first resin material.

9. A semiconductor device comprising:
a transistor including an oxide semiconductor film;
a high resistance film formed on the transistor;
an insulating film covering the oxide semiconductor film and including
a first resin layer including a first resin material, and
a second resin layer including a second resin material, the second resin layer being formed on the first resin layer; and
a surface modification layer covering the insulating film,
wherein a hydrophobicity of the second resin material is greater than a hydrophobicity of the surface modification layer, and the hydrophobicity of the surface modification layer is greater than a hydrophobicity of the first resin material.

10. The semiconductor device according to claim 9, wherein the surface modification layer has flatness that is higher than flatness of the resin material.

11. The semiconductor device according to claim 9, wherein the surface modification layer includes one of a silicone-based oligomer and a fluorine-containing oligomer that each function as a modifier.

12. The semiconductor device according to claim 9, wherein the insulating film has a contact angle of 90 degrees or larger.

13. The semiconductor device according to claim 9, wherein part or all of a modifier included in the surface modification layer is coupled with the second resin material.

14. The semiconductor device according to claim 9, wherein at least one of the first and second resin materials include one or more of polyimide, acrilyc-based resins, and polysiloxane.

15. The semiconductor device according to claim 9, wherein the insulating film includes a modifier of about 0.1 mass percent to about 10 mass percent both inclusive with respect to at least one of the first and second resin materials.

16. The semiconductor device according to claim 15, wherein concentration of the modifier included in an inner part of the insulating film is lower than concentration of the modifier included in the surface modification layer.

17. The semiconductor device according to claim 9, wherein a source-drain electrode of the transistor is electrically connected to the oxide semiconductor film through a connection hole in the insulating film.

18. The semiconductor device according to claim 9, wherein
the oxide semiconductor film includes a channel region and a source-drain region that is adjacent to the channel region and has resistivity lower than resistivity of the channel region, and
the transistor includes a gate electrode facing the channel region.

* * * * *